US011893188B2

(12) United States Patent
Duxbury et al.

(10) Patent No.: US 11,893,188 B2
(45) Date of Patent: *Feb. 6, 2024

(54) OPTICAL TOUCH SENSOR DEVICES AND SYSTEMS

(71) Applicant: 1004335 ONTARIO INC., Ottawa (CA)

(72) Inventors: Guy Michael Amyon Farquharson Duxbury, Ottawa (CA); Robert Donald McCulloch, Ottawa (CA); Albert M. David, Manotick (CA); Gueorgui Pavlov, Ottawa (CA)

(73) Assignee: 1004335 ONTARIO INC., Ottawa (CA)

( * ) Notice: Subject to any disclaimer, the term of this patent is extended or adjusted under 35 U.S.C. 154(b) by 262 days.

This patent is subject to a terminal disclaimer.

(21) Appl. No.: 17/056,500

(22) PCT Filed: May 16, 2019

(86) PCT No.: PCT/CA2019/050666
§ 371 (c)(1),
(2) Date: Nov. 18, 2020

(87) PCT Pub. No.: WO2019/218074
PCT Pub. Date: Nov. 21, 2019

(65) Prior Publication Data
US 2021/0311585 A1 Oct. 7, 2021

Related U.S. Application Data

(60) Provisional application No. 62/734,932, filed on Sep. 21, 2018, provisional application No. 62/673,539, filed on May 18, 2018.

(51) Int. Cl.
G06F 3/042 (2006.01)
G06F 3/041 (2006.01)
H03K 17/96 (2006.01)

(52) U.S. Cl.
CPC .......... *G06F 3/0421* (2013.01); *G06F 3/0428* (2013.01); *G06F 3/04182* (2019.05);
(Continued)

(58) Field of Classification Search
CPC ...... G06F 3/041–047; G06F 2203/041–04114; G06F 3/042–0428;
(Continued)

(56) References Cited

U.S. PATENT DOCUMENTS 2,099,764 A 11/1937 Touceda
2,379,496 A 7/1945 Saunier, Jr.
(Continued)

FOREIGN PATENT DOCUMENTS

CN 106253859 A 12/2016
CN 109787566 A 5/2019
(Continued)

OTHER PUBLICATIONS

International Search Report and Written Opinion for PCT/CA2019/050666, dated Aug. 12, 2019 (17 pages).
(Continued)

*Primary Examiner* — Sanjiv D. Patel
(74) *Attorney, Agent, or Firm* — Bookoff McAndrews, PLLC

(57) ABSTRACT

A touch sensor system includes a sensing area having a periphery and a plurality of light sources and a plurality of analog optical detectors arranged about the periphery of the sensing area. The system further includes addressing circuitry that selectively drives each of the plurality of light sources with a modulated signal and selectively activates the
(Continued)

plurality of analog optical detectors, and a controller that receives a collective detector output from the plurality of analog optical detectors. The outputs from the analog optical detectors may be a time multiplexed to provide the collective detector output. Each optical detector may include a photodiode; a first transistor coupled to the photodiode in a current amplifier configuration that generates an amplified current output as a function of a photodiode current; and enable circuitry to enable and disable the optical detector as a function of an enable input signal.

21 Claims, 37 Drawing Sheets

(52) U.S. Cl.
CPC .............. *G06F 2203/04106* (2013.01); *H03K 17/9629* (2013.01)

(58) Field of Classification Search
CPC ...... G02F 3/0428; H04N 5/378; H04N 5/361; H04N 5/3745; H04N 5/335; H03F 3/45475; H03F 3/08; H03F 2200/126; H03K 17/78; G06V 40/1318; H02M 3/00
See application file for complete search history.

(56) References Cited

U.S. PATENT DOCUMENTS

| | | | |
|---|---|---|---|
| 2,900,521 A | 8/1959 | Eames |
| 3,016,421 A | 1/1962 | Harmon |
| 3,047,723 A | 7/1962 | Knapp |
| 3,180,995 A | 4/1965 | Briggs et al. |
| 3,624,401 A | 11/1971 | Stoller |
| 3,723,738 A | 3/1973 | Brenner et al. |
| 3,727,069 A | 4/1973 | Crittendon, Jr. et al. |
| 3,742,222 A | 6/1973 | Endl |
| 3,764,813 A | 10/1973 | Clement et al. |
| 3,970,846 A | 7/1976 | Schofield et al. |
| 4,040,738 A | 8/1977 | Wagner |
| 4,113,353 A | 9/1978 | Matsushita |
| 4,243,879 A | 1/1981 | Carroll et al. |
| 4,384,201 A | 5/1983 | Carroll et al. |
| 4,622,564 A | 11/1986 | Kaku et al. |
| 4,645,920 A | 2/1987 | Carroll et al. |
| 4,672,364 A | 6/1987 | Lucas |
| 4,684,801 A | 8/1987 | Carroll et al. |
| 4,703,316 A | 10/1987 | Sherbeck |
| 4,713,534 A | 12/1987 | Masters et al. |
| 4,761,637 A | 8/1988 | Lucas et al. |
| 4,799,044 A | 1/1989 | Masters et al. |
| 4,847,606 A | 7/1989 | Beiswenger |
| 4,855,590 A | 8/1989 | Bures et al. |
| 4,943,806 A | 7/1990 | Masters et al. |
| 5,266,792 A | 11/1993 | Crowne et al. |
| 5,635,724 A | 6/1997 | Higgins |
| 6,118,752 A | 9/2000 | Miyagawa et al. |
| 6,201,270 B1 | 3/2001 | Chen |
| 6,608,619 B2 | 8/2003 | Omura et al. |
| 2002/0145776 A1 | 10/2002 | Chow et al. |
| 2003/0210734 A1 | 11/2003 | Kaku |
| 2007/0035706 A1 | 2/2007 | Margulis |
| 2008/0042051 A1 | 2/2008 | Sidor et al. |
| 2010/0315383 A1 | 12/2010 | Utukuri et al. |
| 2011/0074733 A1 | 3/2011 | Makinen et al. |
| 2011/0198484 A1 | 8/2011 | Kurokawa |
| 2011/0227874 A1* | 9/2011 | Fahraeus ............... G06F 3/0325 178/18.09 |
| 2011/0254466 A1 | 10/2011 | Jackson et al. |
| 2012/0182265 A1 | 7/2012 | Smith et al. |
| 2012/0193518 A1* | 8/2012 | Shimizu .................... H03F 3/08 250/214 A |
| 2012/0212458 A1* | 8/2012 | Drumm .................. G06F 3/042 345/175 |
| 2013/0120315 A1 | 5/2013 | Utukuri et al. |
| 2013/0240707 A1 | 9/2013 | Utukuri et al. |
| 2013/0259483 A1 | 10/2013 | McLaren et al. |
| 2014/0019085 A1 | 1/2014 | Utukuri et al. |
| 2014/0168169 A1* | 6/2014 | Drumm ................. G06F 3/0421 345/175 |
| 2014/0226084 A1 | 8/2014 | Utukuri et al. |
| 2015/0155951 A1* | 6/2015 | Noda ................... H03G 3/3084 398/202 |
| 2017/0179160 A1 | 6/2017 | Takahashi |
| 2018/0106692 A1* | 4/2018 | Ciocarlie .......... H01L 27/14643 |
| 2018/0113566 A1 | 4/2018 | Shigemori |
| 2021/0311585 A1 | 10/2021 | Duxbury et al. |
| 2021/0311586 A1 | 10/2021 | Duxbury et al. |
| 2022/0229512 A1 | 7/2022 | Duxbury et al. |

FOREIGN PATENT DOCUMENTS

| | | | |
|---|---|---|---|
| EP | 0364884 A2 | 4/1990 | |
| JP | S59-79343 A | 5/1984 | |
| JP | 3129077 B2 * | 1/2001 | ............... H03F 1/52 |

OTHER PUBLICATIONS

Search and Examination Report in GB Application 2213550.3 dated Sep. 30, 2022 (5 pages).

* cited by examiner

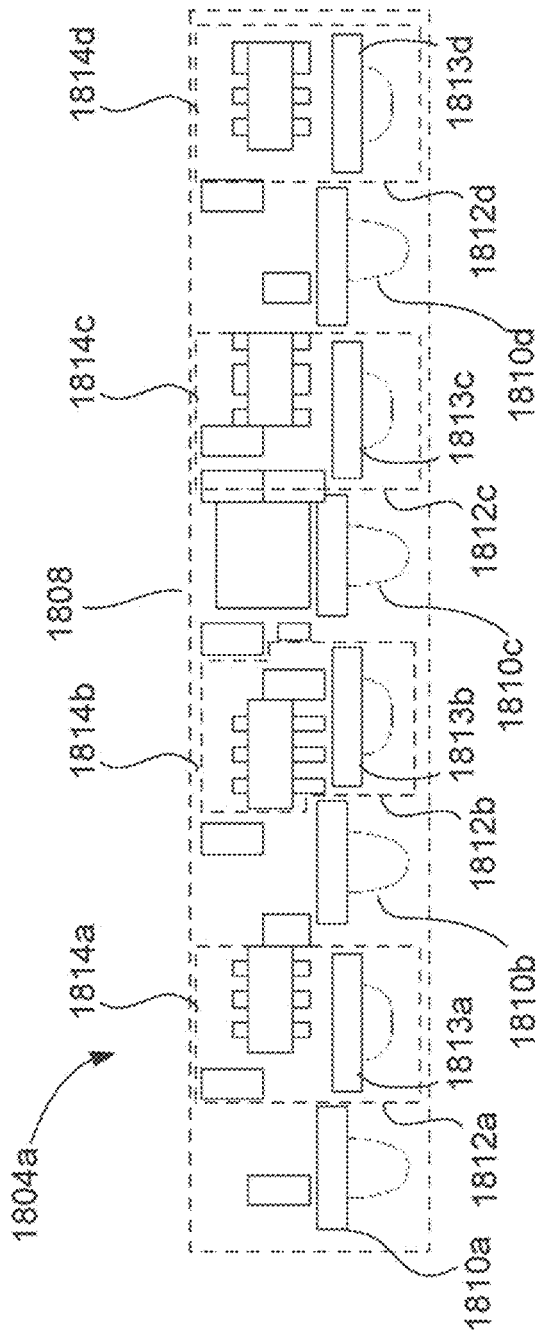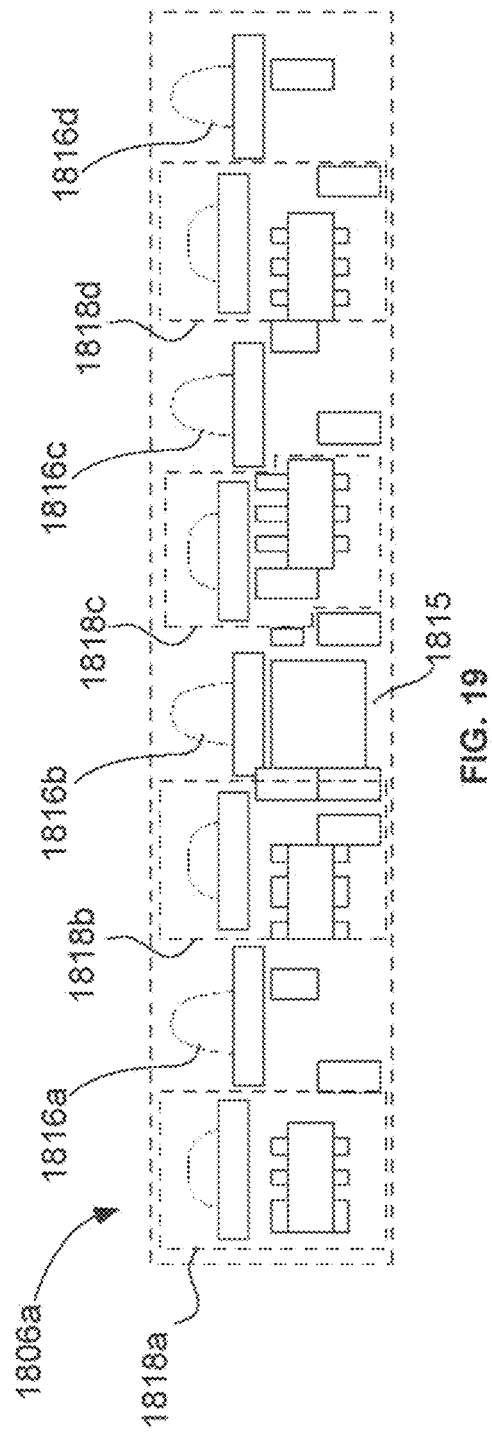

OPTICAL TOUCH SENSOR DEVICES AND SYSTEMS

RELATED APPLICATIONS

This application is the U.S. national phase entry under 35 U.S.C. § 371 of International Application No. PCT/CA2019/050666, filed on May 16, 2019, which claims priority to U.S. Provisional Patent Application No. 62/673,539 filed May 18, 2018, and to U.S. Provisional Patent Application No. 62/734,932 filed Sep. 21, 2018.

FIELD OF THE DISCLOSURE

The present disclosure relates to touch sensor devices and controllers. More particularly, the present disclosure relates to Optical IR touch sensors comprising arrays of light sources and optical detectors.

BACKGROUND

A number of different touch sensor technologies exist. These technologies include resistive, capacitive, surface acoustic wave, optical beam interference, and optical image-based touch sensor technologies. The present disclosure relates to, but is not limited to, optical beam interference-based touch sensors, which may be referred to as "optical touch sensors" herein. The term "Infrared (IR) touch sensor" as used herein refers to interference-based optical touch sensors operating in the IR range.

Infrared (IR) or other interference-based optical touch sensors typically have some advantages over other touch sensor technologies. Compared to capacitive based touch sensors, optical or IR touch sensors may have the following advantages: they may detect touches from a wide range of objects, not just ungloved fingers; they may not suffer from Radio Frequency (RF) interference; they may not be sensitive to thin conductive contaminants on the screen such as water; they may emit almost no radio frequency electromagnetic radiation; and they may not require electrically conductive layers over the screen which can degrade the screen's clarity and contrast.

IR touch sensors may typically comprise a sensing area with a periphery (e.g. screen) with IR light sources and detectors arranged about the periphery of the sensing area. IR touch sensors may operate by detecting multiple light paths travelling parallel and close to the surface of the sensing area and noting when previously clear paths are blocked by an opaque object. A single finger's location may typically be determined as where at least two light paths that are blocked or interfered with intersect. The term "light path" is to be understood as the path of light that travels between a light source (e.g. LED) and an optical receiver (and not necessarily the path of all light emitted from the light source).

IR touch sensors may be beneficial in environments where RF noise levels may be high, visible light reflections make the screen contrast low, the touch sensor is to be operated over a wide temperature range, users may want to be able to wear gloves, contaminants are present on the screen, and/or a long reliable life is required. Kiosks, cars and aviation are prime examples of such an environment.

IR touch sensors may consist of two orthogonal aligned arrays of beams, one array determining the "X" location of a finger, and the other array determining the "Y" location of the finger. An advantage of the orthogonal beams design is each light source only needs to shine to a single optical detector on the opposite side, so its light can be highly directional with the corresponding improved optical efficiency. Other IR touch sensors may have wide angle light from each light source fall on multiple detectors. However, wide angle optical beams may result in lower efficiency and greater noise per detector. Conventional wide-angle methods may thus require high power light sources, or expensive and unreliable mechanical steering mechanisms.

Combinations of different numbers of LED arrays and optical sensors have been described, for example, in U.S. Pat. Nos. 3,016,421 and 3,764,813, the entire contents of which are incorporated by reference.

Conventional IR touch screens may be susceptible to noise from bright environmental light sources such as ambient light sources and/or the sun. Some common sources of light interference include sunlight, bright incandescent lighting, and LED lighting. Sunlight levels incident on a touch sensor may be modulated (for example if the touch sensor is located in a moving vehicle or aircraft). Conventional touch sensor controllers may also cause interference. If an optical detector saturates (e.g. in sunlight), then the output of the detector may become fixed, thereby suppressing any additional optical signal variations from the touch sensor LEDs. If the receiver is looking for a modulated signal, this may typically result in false touches being generated. If the receiver has a DC threshold detector then the light interference adds to the level of the received signal, and real touches may be suppressed.

One method to reduce such noise is to modulate the IR light source and have a receiving circuit that filters out the vast majority of signals other than the desired modulated signal. However, an effective receiving circuit that allows the accurate location of a finger to be determined under the majority of optical noise environments that is affordable and can be fitted within the narrow bezel around a screen has historically not been achieved. The concept of modulating LEDs around a touch sensor has been described, for example, in U.S. Pat. Nos. 4,855,590 and 5,635,724, the entire contents of which are incorporated by reference. However conventional modulation designs use optical detectors that may saturate under normal levels of optical interference (resulting in signal loss); are too slow to handle the modulation rates that are needed to be distinct from many optical noise sources; are too expensive; and/or are too bulky. Thus, there is a need for improved IR touch sensors.

Additionally, conventional beam interference IR touch sensors may determine a digital on/off (or clear/blocked) state for each beam to determine finger position. Conventional sensors may not be able to resolve partially blocked beams.

Furthermore, LCD displays are being developed with narrower and narrower bezels. Touchscreen bezels width have not kept pace and currently require significantly wider bezels. It may be desired for touch sensor circuitry to be able to fit in width of 0.3 inches or less around the periphery of the touchscreen.

SUMMARY

According to an aspect, there is provided an analog optical detector comprising: a photodiode; a first transistor coupled to the photodiode in a current amplifier configuration that generates an amplified current output as a function of a photodiode current; and enable circuitry to enable and disable the optical detector as a function of an enable input signal.

In some embodiments, the first transistor is a bipolar transistor having a base and a collector, and the base of the first bipolar transistor is connected to the photodiode, and a collector current of the transistor substantially mirrors and amplifies the photodiode current to generate the amplified current output.

In some embodiments, the enable/disable circuitry is a second transistor.

In some embodiments, the second transistor is a bipolar transistor and the base of the second transistor is connected to the collector of the first transistor, and a resistor is connected between the base of the second transistor and an input that receives the enable input signal.

In some embodiments, the collector of the second transistor is connected to a voltage source, and the photodiode is connected between the base of the first bipolar transistor and the voltage source in a reverse biased configuration.

According to an aspect, there is provided a touch sensor system comprising: a sensing area having a periphery; a plurality of light sources and a plurality of analog optical detectors arranged about the periphery of the sensing area, each of the plurality of light sources being aligned with a respective one of the plurality of analog optical detectors; addressing circuitry that selectively drives each of the plurality of light sources with the modulated signal and selectively activates the plurality of analog optical detectors; and a controller that receives a collective detector output from the plurality of analog optical detectors.

In some embodiments, each analog detector comprises: a first transistor coupled to the photodiode in a current amplifier configuration to generate an amplified current output as a function of a photodiode output; and enable circuitry to enable and disable the analog optical detector as a function of an enable input signal.

In some embodiments, the system further comprises: a modulated signal generator that generates a modulated signal for driving the plurality of light sources, wherein the controller comprises a correlating filter that receives the collective detector output from the plurality of analog optical detectors and generates a filtered analog output from the collective detector output.

In some embodiments, the correlating filter receives the modulated signal and generates the filtered analog output as a function of the collective detector output and the modulated signal.

In some embodiments, the correlating filter comprises a front-end that filters and amplifies the collective detector output to generate a pre-conditioned detector output.

In some embodiments, the front-end comprises a filter-amplifier and phase adjust circuitry.

In some embodiments, the correlating filter comprises clipping circuitry that limits the filter-amplifier output when the filter-amplifier output reaches a threshold.

In some embodiments, the correlating filter further comprises sampling and correlation circuitry that performs modulation edge-based sampling and correlation of the pre-conditioned detector output.

In some embodiments, the sampling and correlation circuitry comprises: first analog sample circuitry that samples the pre-conditioned detector output signal at signal peaks as a function of the modulation signal to generate a correlated maximum signal; second analog sample circuitry that samples the pre-conditioned and phase-adjusted detector output signal at signal valleys as a function of the modulation signal to generate a correlated minimum signal; and an analog subtractor that subtracts the correlated minimum signal from the correlated maximum signal to generate an analog correlated difference signal.

In some embodiments, the sampling and correlation circuitry further comprises: a positive edge pulse generator that generates a series of pulses corresponding to positive edges of the modulated signal; a negative edge pulse generator that generates a series of pulses corresponding to negative edges of the modulated signal, wherein the first analog sample circuitry samples the pre-conditioned detector output signal a function of the pulses from the positive edge pulse generator to generate the correlated maximum signal; and the second analog sample circuitry samples the pre-conditioned detector output signal a function of the pulses from the negative edge pulse generator to generate the correlated minimum signal.

In some embodiments, the pattern correlating filter further comprises an analog low pass filter-amplifier that low pass filters and amplifies the analog correlated difference signal.

In some embodiments, the addressing circuitry comprises de-multiplexing circuitry.

In some embodiments, the de-multiplexing circuitry comprises: a first at least one shift register comprising a first plurality of register outputs, each of the first plurality of register outputs operatively connected to a respective one of the light sources; and a second at least one shift register comprising a second plurality of register outputs, each of the second plurality of shift-register outputs connected to a respective one of the plurality of analog optical detectors.

In some embodiments, the addressing circuitry is operable to selectively drive each of the light sources for a respective time period, and for each light source, activate a corresponding one of the analog optical detectors during the time period.

In some embodiments, the addressing circuitry is operable in first and second modes, wherein: when operating in the first mode, the corresponding one of the analog optical detectors activated for each light source is positioned opposite to the light source; and when operating in the second mode, the corresponding one of the analog optical detectors activated for each light source is offset from the detector positioned opposite to the light source.

In some embodiments, the modulation pattern is balanced over the time period.

According to an aspect, there is provided a touch sensor comprising: a sensing area having a periphery; a plurality of light sources and a plurality of analog optical detectors arranged about the periphery of the sensing area, each of the plurality of light sources being aligned with a respective one of the plurality of analog optical detectors; addressing circuitry that selectively drives each of the plurality of light sources and selectively activates the plurality of analog optical detectors; and an analog databus, wherein each of the plurality of analog optical detectors have a respective output, the outputs of the plurality of analog optical detectors being collectively connected to the analog databus.

In some embodiments, the addressing circuitry selectively and sequentially activates the analog optical detectors such that output signals from the analog optical detectors are time multiplexed on the analog databus, thereby creating a time multiplexed collective detector output.

In some embodiments, the addressing circuitry is operable to selectively drive each of the light sources for a respective time period, and for each light source, activate a corresponding one of the analog optical detectors during the time period.

In some embodiments, the touch sensor further comprises an impedance balancing circuit that creates a differential output signal from the time multiplexed collective detector output.

In some embodiments, the touch sensor further comprises de-multiplexing circuitry operatively coupled to the plurality of light sources and the plurality of analog optical detectors for selectively activating each of the plurality of light sources and, for each said light source, the respective analog optical detector.

In some embodiments, the de-multiplexing circuitry comprises: a first at least one shift register comprising a first plurality of register outputs, each of the first plurality of register outputs operatively connected to a respective one of the light sources; and a second at least one shift register comprising a second plurality of register outputs, each of the second plurality of shift-register outputs connected to a respective one of the plurality of analog optical detectors.

According to an aspect, there is provided a controller for a touch sensor comprising a plurality of light sources, a plurality of analog optical detectors, and addressing circuitry operatively coupled to the plurality of light sources and the plurality of analog optical detectors for selectively activating each of the plurality of light sources and analog optical detectors, the controller comprising: a processor; a memory operatively connected to the processor; a modulated signal generator that generates a modulated signal for driving the plurality of light sources of the touch sensor; and a correlating filter that receives a collective detector output from the plurality of analog optical detectors and generates a filtered analog output from the collective detector output.

In some embodiments, the correlating filter receives the modulated signal and generates the filtered analog output as a function of the collective detector output and the modulated signal.

In some embodiments, the correlating filter comprises a front-end that filters and amplifies the collective detector output to generate a pre-conditioned detector output.

In some embodiments, the differential receiver front-end comprises a fitter-amplifier and phase adjust circuitry.

In some embodiments, the correlating filter further comprises sampling and correlation circuitry that performs modulation edge-based sampling and correlation of the pre-conditioned detector output.

Other aspects and features of the present disclosure will become apparent, to those ordinarily skilled in the art, upon review of the following description of the specific embodiments of the disclosure.

BRIEF DESCRIPTION OF THE DRAWINGS

The present disclosure will be better understood having regard to the drawings in which:

FIG. 18 is an enlarged view of the example layout of one circuitry section of the touch sensor circuitry of FIG. 18;

FIG. 19 is an enlarged view of the example layout of another circuitry section of the touch sensor circuitry of FIG. 18;

DETAILED DESCRIPTION

Figure 1A:
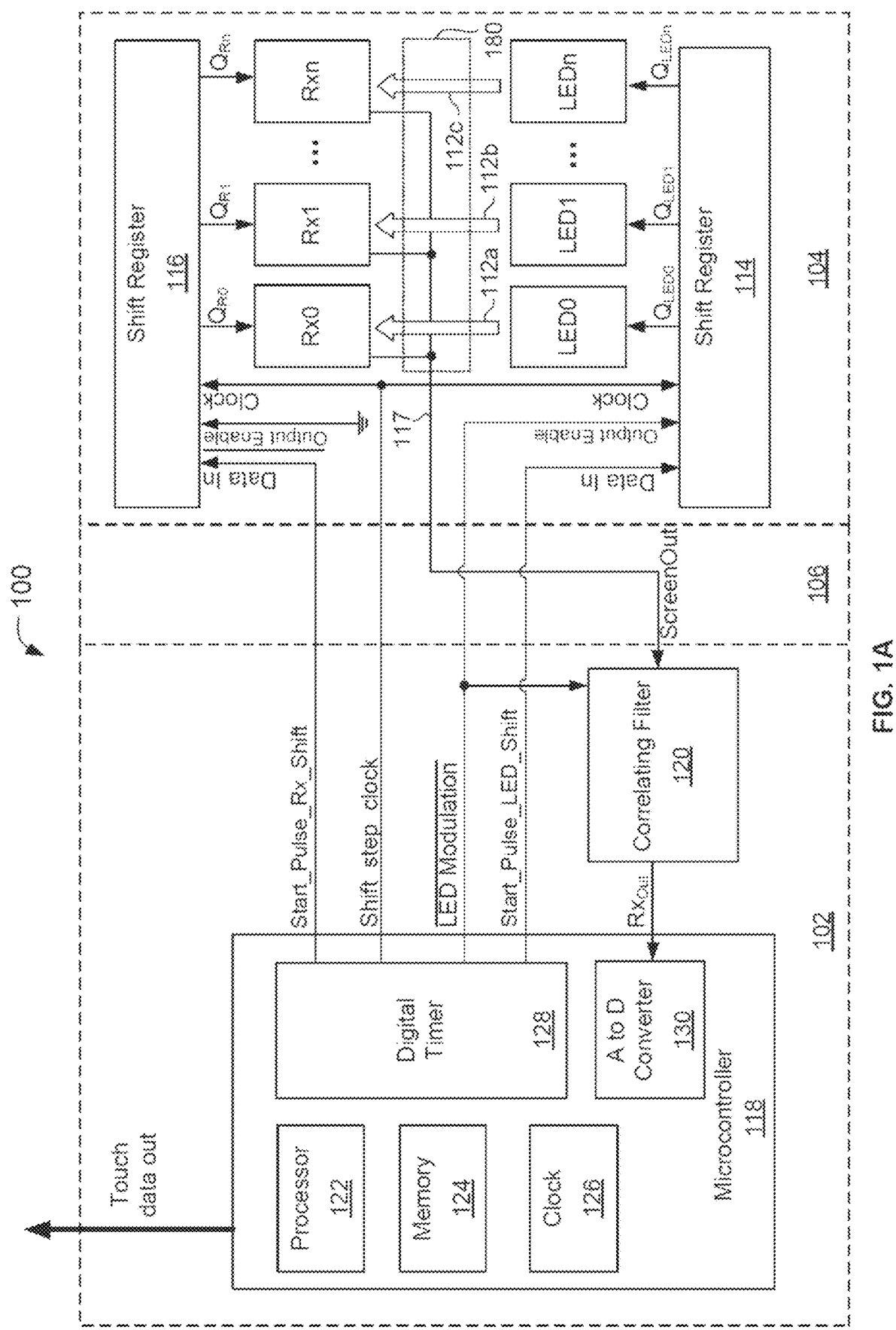
FIG. 1A is a block diagram of an example IR touch sensor system according to some embodiments.

The present disclosure describes touch sensors, touch sensor devices, systems and methods. A typical infrared touch sensor comprises a plurality of light sources (typical light sources are IR Light Emitting Diodes (LEDs), which may be referred to as "IREDs") and a corresponding plurality of optical detectors, where the light sources and detectors are arranged around all sides of an electronic display or other type of screen. Each light source is typically arranged opposite to and aligned with a respective one of the detectors such that light from the light source travels generally parallel to the surface of the display and into the corresponding detector. For example, light sources may be arranged along two perpendicular sides of a rectangular display, and a corresponding number of detectors may be arranged on the other two sides and aligned with the light sources. Thus, when a person or object touches the display, they break the path of light between one or more light sources and detectors, and the position of the touch may be calculated based on the change in received light at the corresponding optical detectors.

According to an aspect of the disclosure, a touch sensor system may comprise an array of optical detectors that, when selected, output analog signals corresponding the amount of optical IR power being received. The analog signals may be output onto a shared conductor.

According to an aspect of the disclosure, a touch sensor system may comprise light sources and optical detectors. The system may include a controller that modulates light sources of a touch sensor with a modulation pattern. The controller may include a substantially linear (i.e. analog) filter that receives the collective detector output and provides a filtered analog output. An example linear (analog) filter includes a pattern correlating filter, which receives the analog modulation pattern and filters the collective detector output based on the pattern. An analog output may provide more information for interpolating finger position(s) than simple on/off beam detection.

In some embodiments, the analog detection method used allows angled light paths to be scanned for detecting partial beam blockages. The angle may be varied to allow or improve resolving multiple touch locations (possible simultaneous touch). The analog filtered output may allow the use of relatively small beam angle optical components (for greater efficiency and better SNR) while still allowing the use of angled paths for scanning, without mechanically re-aligning the light sources or detectors, as will be explained in more detail below. This may allow for angled path scanning, which may be particularly beneficial for dual-touch scenarios (e.g. where two fingers emerge from overlapping in either the X or Y direction).

IR light from the light sources may, for example, have an approximately 960 nm wavelength. However, embodiments are not limited to LEDs as a light source or to the IR optical range. IR light has the advantage of not being visible. LEDs as a light source may also be advantageous because light is emitted from the substrate in a wide angle allowing a lens to focus it back into a beam that has some width. The beam width may be helpful as it means the light is slowly blocked as a finger or other object moves into its path, thereby varying the output signal being used to interpolate between the multiple light paths. Aspects and principles of the disclosure may also be used in touch sensors that operate based on light beam path interference, but operate outside of the IR light range.

In some embodiments, an array of light sources and optical detectors are time multiplexed. In some embodiments, the LEDs are modulated to enable pattern correlation to reduce noise.

The sun radiates high levels of optical energy including significant levels of infrared. Ideally, a detector should not come close to being saturated when exposed to the worst-case levels of sunlight associated with its use environment. When not moving the level is relatively constant over a period of 100 ms or less and having DC blocking in the detector path can be effective in separating the desired signal from the solar signal. However, in transportation applications, moving past objects and strobing from propellers and fans can modulate the sun at rates of many kHz. Modern lighting, especially modern fluorescent, low voltage and LED lighting typically use very low cost and electrically imperfect switching power supplies resulting in modulated light levels, including IR light, at rates up to 100 kHz or even more. However, conventional IR controllers as used on many devices such as televisions operate at frequencies around 38 kHz. Use of modulation at around this frequency should be avoided in a touchscreen design that uses infrared light.

Tolerance of interfering light sources (including infrared) is an advantage of infrared touchscreens over optical touchscreens. Optical touchscreens and to a lesser extent infrared touchscreens may fail to operate properly when interfering light sources are very bright (like the sun) or modulated (like sun shining in to a moving car or modern fluorescent lighting or LED lighting). The infrared receiver disclosed herein 'knows' the pattern that the transmitting light source is sending. This allows the receiver to use correlating electronics to reject substantially more unwanted light while still remaining fully sensitive to the intended light. The pattern may be a simple single frequency modulation or, for example, a random digital pattern.

Some embodiments described herein may provide greater immunity to noise from sunlight or other bright environmental light sources, including strobing environmental light. In some embodiments, the LED light is modulated or strobed in a manner that differentiates it from external interfering light sources. Location of an obstruction (e.g. a touch) may be determined by detecting an absence (or degraded intensity, brightness, etc.) of received light having the specific strobing frequency and specific on off pattern.

The LEDs may be modulated (turned on and off) at a frequency much higher than the rate at which LED/detector pairs are sequentially activated. Previous touch screens have modulated the touch sensor light at frequencies below 40 kHz, but there are many environments where the interfering light is also modulated too fast for effective noise rejection at this touch sensor modulation range. Some examples of such noise scenarios include rapid sun shadowing and reflections from propellers and fans, and a wide range of artificial light sources from incandescent bulbs to switching power supplied LED lighting. The LED modulation rate may be selected to be significantly higher frequency than ambient light variations. The modulation rate may, for example, be significantly above 100 kHz for this purpose. In some embodiments, the received light signals are converted into an electrical analog signal (raw optical receiver signal) which is correlated against the originating modulating source so background light effects can be filtered out.

Conventional low cost optical detectors using phototransistors may not be sufficiently fast to track the selected LED modulation rates. Selecting a semiconductor junction with enough area to have sufficient optical detection sensitivity has conventionally resulted the transistor junction to have too a large base to collector capacitance, which is amplified by the gain of the transistor, thereby absorbing rapid changes to the high impedance optically generated junction current.

Conventional fast optical detectors using avalanche photodiodes and current amplifiers may be too complex and expensive to fit within a touchscreen's bezel in a practical manner.

Conventional optical detectors that make fixed threshold high/low digitization of each optical detector lose information about how much of a beam is blocked preventing effective interpolation between beams.

According to an aspect, there is provided an optical detector that may be sufficiently fast and low cost for touch sensor applications using the LED modulation described herein. The optical detector described herein may not saturate even when exposed to bright environmental light noise such as the sun. In addition, pattern correlation may be used in conjunction with the LED modulation and fast optical detector described herein to separate the desired signals from the touchscreens LEDs from light noise sources. In preferred embodiment, the optical detectors include discrete photodiodes with local current amplification. In some embodiments, the optical detectors are phototransistors.

The embodiments described herein may allow the received modulated light to be correlated against the original transmitted modulations so as to reject a wide range of external light interference. The example circuitry shown and described herein may operate at baseband with no intermediate radio frequency filtering stage by using a modulation edge-based sampling technique. This correlation method may be used to handle complex modulation data patterns such. Modulating with a data pattern and using a correlating detector can further improve external light noise rejection.

In some embodiments, the light sources and detectors are selectively and sequentially activated such that only one light source and a corresponding detector is active over a given time period. The analog outputs of the output may be time-multiplexed on a single-wire of an analog databus. A differential version of the time-multiplexed output may be carried on a second wire of the databus. Thus, embodiments may allow a narrow interconnect between the sensor and the controller compared to designs using one interconnect wire per detector.

It may be desirable for the desired modulated signal (separated from interference) to keep its amplitude information, which may assist for more accurately interpolating the position of a finger between two adjacent light paths. To avoid saturation under even strong levels of optical noise, it may be desirable to keep the voltage gain of the pre-filtering stages low.

Correlating the received signal against the originating modulation is desirable as it may provide tighter filtering of interference. Applying such filtering to multiple receivers is no simple task. It is desirable that all receivers cannot saturate and linear correlation against the modulated signal is used before any decision of whether a finger is present is made.

Touch sensor circuitry may typically be located within a bezel that extends around the periphery of the sensing area (e.g. screen). Some embodiments described herein may enable a very compact (e.g. possibly less than 0.30 inch wide) touch sensor bezel.

In some embodiments, each LED has a lens that focusses the majority of its light into a beam with a 3 dB width of around 10 degrees. The optical gain of this focusing improves the sensor signal to noise ratio for a given LED transmit power. If the focus is much tighter than around 10 degrees, manufacturing alignment of the LEDs and optical sensors becomes difficult and some important options for resolving axis aligned fingers are eliminated. The physical size of the LED lens can be used to increase the effective beam width so the percentage of light blocked varies more linearly with finger movement into the light path's associated width, which in turn may allow interpolation to locate the touching finger to a finer resolution than the spacing between light paths. For best interpolation the lens width would be equal to the full width of the path spacing. However this could increase the bezel width accordingly.

In some embodiments, each photo-diode may have a lens with a similar focus as the LEDs; however current available devices have a 60 degree focus. The focus may improve the level of light coming from the corresponding LED relative to other light sources. However, the touch sensor may be designed to work with a very wide range of lenses or even no lens at all in some embodiments.

FIG. 1A is a block diagram of an example IR touch sensor system 100 according to an aspect of the disclosure. The touch sensor system 100 is divided into the following general functional components (indicated by dashed line boxes): a controller 102; a touch sensor 104 and an interconnect 106 coupling the controller 102 to the touch sensor 104. The touch sensor system 100 may be entirely housed in a touchscreen device (such as a tablet). Alternatively, the controller 102 and the touch sensor 104 may be housed in separate devices (e.g. control module and separate touchscreen), with the controller 102 several inches from the touch sensor 104. The interconnect 106 may comprise one or more wires, cables, flex connectors and/or any other suitable connection.

The touch sensor 104 in this example is in the form of a touchscreen that includes an electronic display 180 (e.g. display of a tablet or other electronic device) as its sensing area. Touch sensor embodiments described below may be implemented as a touchscreen including an electronic display. However, other touch sensor types may also be used (e.g. static image sensing area) and embodiments are not limited to electronic displays.

IR sensing circuitry of the touch sensor 104 shown and discussed below will typically be arranged around the periphery of the display 180. For example, the IR sensing circuitry may be contained in a bezel or other housing that extends around the periphery of the display.

The IR sensing circuitry of the touch sensor 104 includes a plurality of LEDs (LED0, LED1, . . . LEDn) that emit IR light and a plurality of IR detectors (Rx0, Rx1, . . . Rxn) for detecting IR light. The variable "n" is used to indicate that the exact number of LEDs and detectors in this embodiment is not specified and may vary. Each of the LEDs (LED0 to LEDn) is aligned with a respective one of the IR detectors Rx0 to Rxn such that light emitted by the LEDs (LED0 to LEDn) travels to the corresponding detector (Rx0 to Rxn) as indicated by arrows 112a to 112c. The LEDs may, for example, be spaced approximately 4 mm apart with a beam width of around 1.5 mm. Alternatively, the beam width may be a full 4 mm. Similarly, the receiving photodiode may receive around 1.5 to 4 mm beam width. Embodiments are not limited to these particular examples.

The LEDs are the light sources of the touch sensor system 100, but embodiments are not limited to LEDs and other light sources may be used. The term "light sources" is not limited to sources of visible light, and light sources may output non-visible light (e.g. IR light).

Figure 1B:
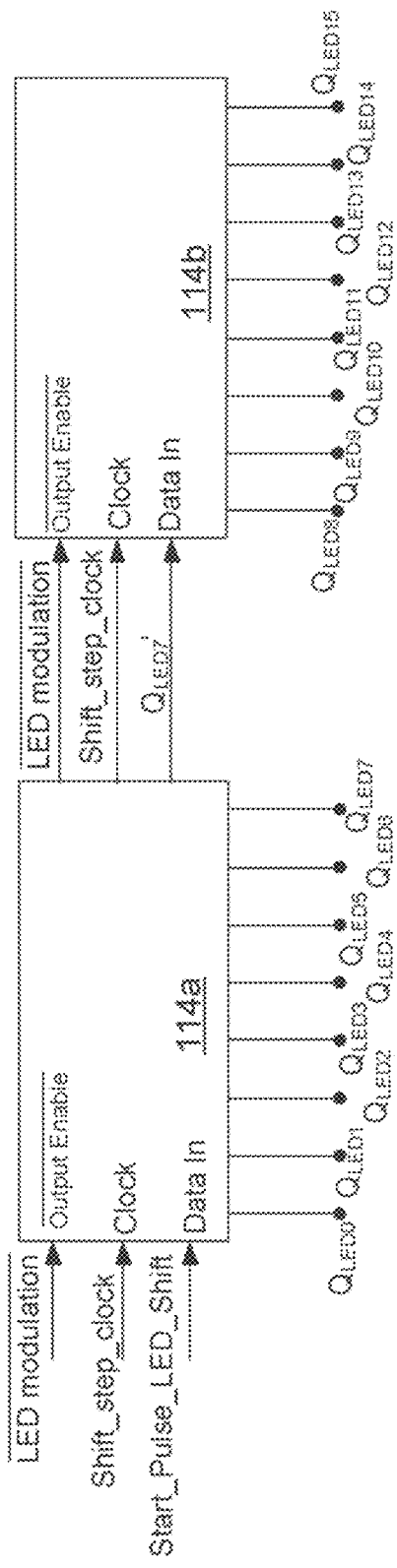
FIG. 1B is a block diagram of example first and second shift registers connected in series for activating LEDs in the touch sensor system of FIG. 1A.
Figure 1C:
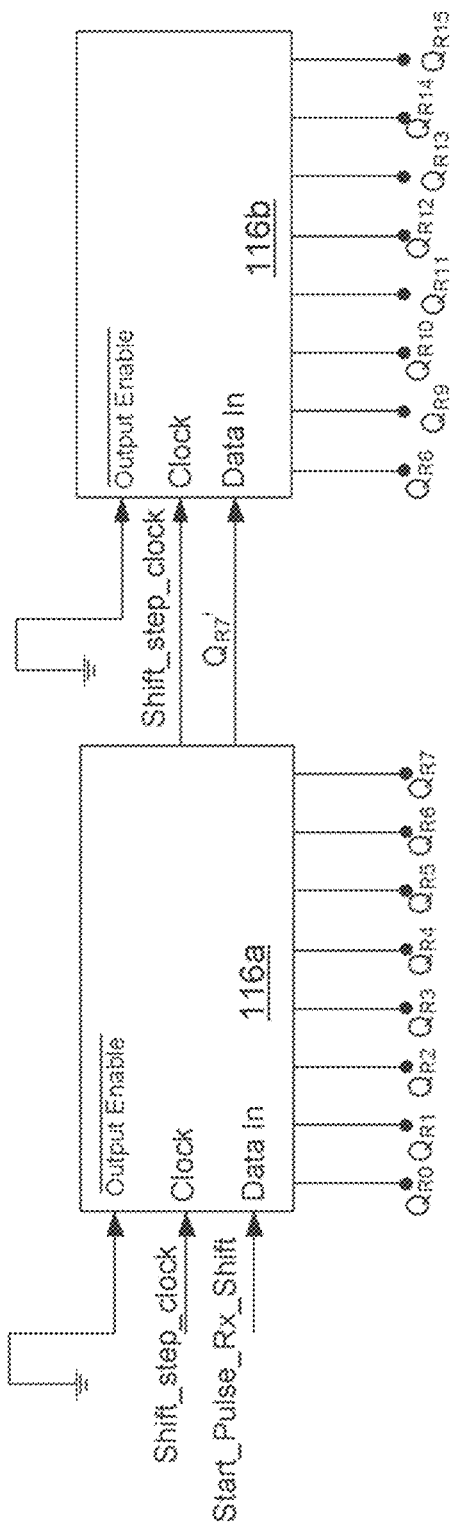
FIG. 1C is a block diagram of example first and second shift registers connected in series for activating optical detectors in the touch sensor system of FIG. 1A.
Figure 1D:
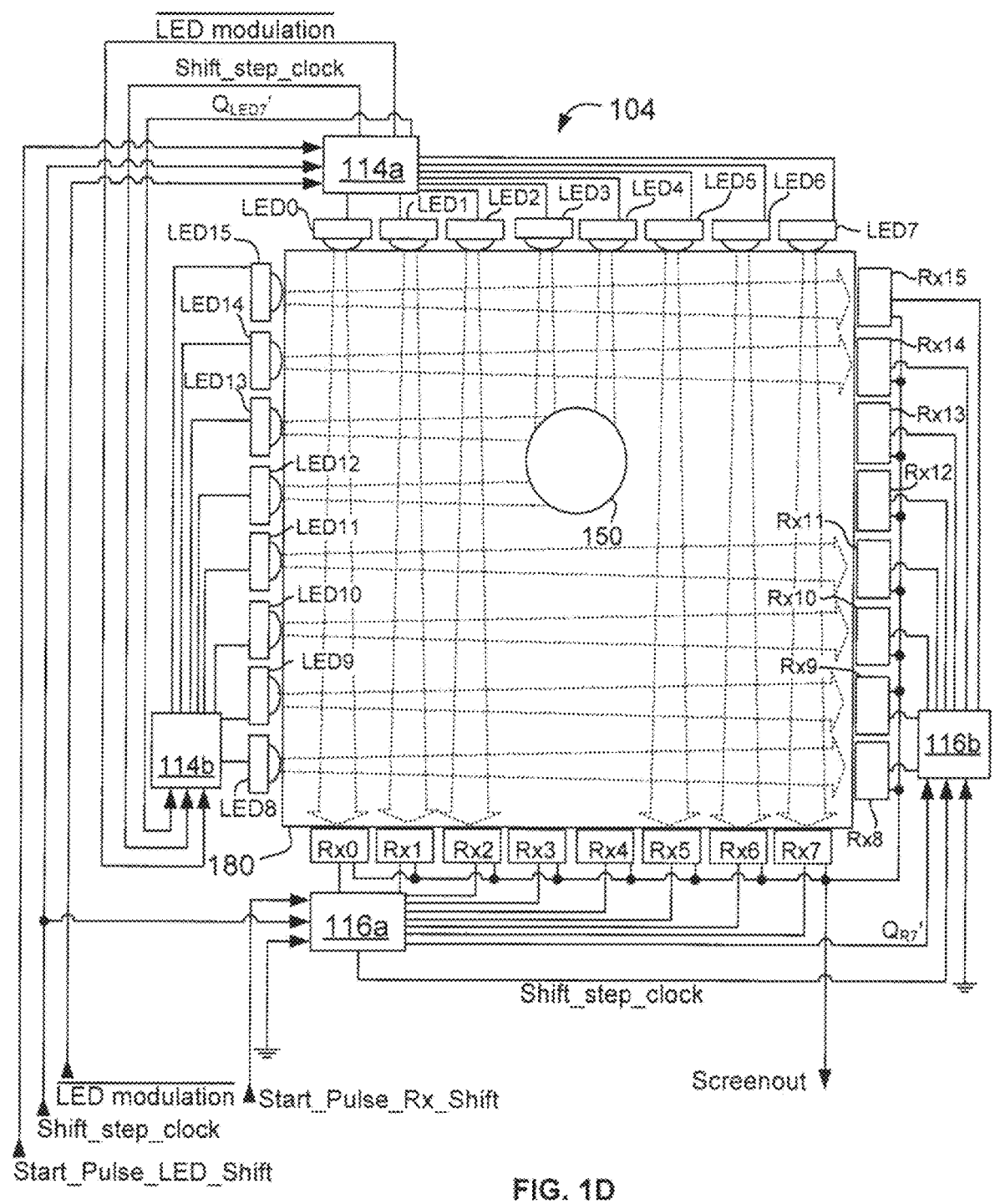
FIG. 1D is a schematic diagram of an example touch sensor of the system of FIG. 1A.

If the display 180 is rectangular, the LEDs (LED0 to LEDn) may be arranged in a linear array around two perpendicular sides of the display 180, and the detectors (Rx0 to Rxn) may be arranged in a linear array along the remaining, opposing two sides (as shown in FIG. 1D). For example, if the display has four side edges defined as left, right, top and bottom, LEDs may be arranged along the top and left edges, while detectors are arranged and aligned with the LEDs along the bottom and right edges (or vice versa). Other arrangements may be used as well and embodiments are not limited to a particular positioning or arrangement of light sources and detectors. In other examples, LEDs and IR detectors may be interleaved (as in the example shown in FIGS. 5A to 50).

The IR sensing circuitry of the touch sensor 104 further comprises a first shift register block 114 and a second shift register block 116. As will be explained below, the shift-register blocks 114 and 116 are used herein as one possible embodiment of addressing circuitry for selectively and sequentially activating the LEDs (LED0 to LEDn) and the IR detectors (Rx0 to Rxn). However, other addressing methods may be used in other embodiments. Each of the plurality of LEDs (LED0 to LEDn) is connected to a respective one of the outputs ($Q_{LED0}$ to $Q_{LEDN}$) of the first shift register block 114. Each of the plurality of optical detectors (Rx0 to Rxn) is similarly connected to a respective one of the outputs ($Q_{R0}$ to $Q_{Rn}$) of the second shift register block 116.

The first and second shift-register blocks 114 and 116 each further include a respective clock input (shown as "Clock"), a data input (shown as "Data In") and an inverse Output Enable input (shown as "Output Enable" with a bar above). The "Clock" inputs receive a common clock input (from the controller 102) for the first and second shift register blocks 114 and 116. The "Data In" inputs receive data bit inputs that are sequentially shifted through the first and second shift register blocks 114 and 116 at a rate set by the clock input. In FIG. 1A, data bits are shifted to the right. The "Output Enable" inputs of the shift register blocks 114 and 118, when driven, enable the respective set out outputs ($Q_{LED0}$ to $Q_{LEDn}$) and ($Q_{R0}$ to $Q_{Rn}$). For example, if the shift register block is an 8-bit shift register block (i.e. 8 storage positions and outputs) currently storing "00100000", driving the "Output Enable" input of the second shift register block 116 will cause the eight outputs $Q_{R1}$ to $Q_{R8}$ to output 0 0 1 0 0 0 0 0 respectively. Then, after the clock triggers a shift and assuming the Data In is low, the eight outputs $Q_{R1}$ to $Q_{R8}$ will output 0 0 0 1 0 0 0 0 respectively, and so on. Typically, the number of LEDs and detectors will be greater than eight, but the example above is given simply for illustrative purposes.

The first and second shift-register blocks 114 and 116 are used to sequentially activate the LED/detector pairs. When a high data bit ("1") is input synchronously to both the first and second shift register block 114 and 116, both the first and second shift register block 114 and 116 will behave identically. The data bit starts in a first shift register position corresponding to outputs $Q_{R0}$ and $Q_{LED0}$. While the data bit is in the first position, activating the corresponding "Output Enable" input on the first shift register block 114 triggers the first output $Q_{LED0}$, thereby driving LED0. Similarly, while the data bit is in the first position of the second shift register block 116, activating the corresponding "Output Enable" input triggers the first output $Q_{R0}$, thereby driving detector Rx0 at the same time as LED0 is driven.

When triggered by the clock input, the first and second shift-register blocks 114 and 116 shift the data bit to the next register position, thereby driving LED1 and Rx1 and so on. In this example, only one of the LED/detector pairs is selected at a given point in time. This is accomplished by keeping the "Data In" signal low (i.e. "0") during the time that the data bit (i.e. "1") travels through the first and second shift-register blocks 114 and 118.

The outputs of detectors (Rx0 to Rxn) are collectively connected to a single common analog databus 117 to generate a time-multiplexed output "ScreenOut" signal.

The controller 102 in this embodiment includes a microcontroller 118 and a correlating filter 120 coupled to the microcontroller. The microcontroller 118 provides various control signals to the touch sensor 104, as will be described in more detail below. The correlating filter 120 receives and filters the collective detector output "ScreenOut" signal from the touch sensor detectors Rx0 to Rxn using a Zero Intermediate Frequency (Zero IF) correlation method as will be explained in more detail below. The correlation is based on the modulation pattern of the signal used to modulate the LEDs. The filtered output $Rx_{Out}$ is then passed to the microcontroller 118 for additional processing to generate touch data, which is output by the microcontroller 118 (e.g. for use by an apparatus or system including the touch sensor system 100). The microcontroller 118 outputs the processed touch data, which typically indicates the presence (or lack thereof) of a touch event on the display 180 of the touch sensor 104. Touch events typically refer to an object such as a finger touching the display 180. Basically, the approximate position of a finger or object touching the touch sensor 104 is approximated by monitoring changes in the light received at one or more detectors Rx0 to Rxn.

The microcontroller 118 comprises a processor 122; a memory 124 operatively coupled to the processor 122; an internal clock 126; a digital timer module 128; and an analog to digital converter (ADC) 130. In this example, the clock 126 generates a clock signal used by the processor 122 and the digital timer module 128. It is to be understood that the digital timer module 128 may be implemented by the processor 122 in some embodiments. Furthermore, the memory 124, the digital timer module 128 and the clock 128 are not necessarily external to the processor 122. A person skilled in the art will understand that the actual hardware and software implementation of the microcontroller 118 may vary while still providing the same or equivalent functionality described herein. Embodiments are not limited to a specific hardware or software implementation.

The digital timer module 128 provides the following output signals: "LED modulation chip rate"; "Shift_Step_Clock"; "Startulse_LED_Shift"; and "Start_Pulse_RX_Shift".

The embodiment below describes some example relationships between the timer module generated signals. It should be noted that the design can be made to function with a wide range of LED modulation chip rates, a wide range of modulation chips per shift step clock period, and the "start_pulses" can have a period longer than the number of LEDs around the bezel times the shift step clock period.

The "Start_Pulse_LED_Shift" signal periodically provides a data bit that is shifted through the shift register block 116 to sequentially activate the detectors Rx0 to Rxn. The "Start_Pulse_RX_Shift" signal periodically provides a data bit that is shifted through the first shift register block 114 to sequentially activate the LEDs (LED0 to LEDn). The "Shift_Step_Clock" signal is input to both shift register blocks 114 and 116 and, as a function of the frequency of the signal, controls shifting of the data bits through the shift register blocks 114 and 116 (shifting is to the right in FIG. 1). The LED modulation signal is used to modulate the output of the LED (LED0 to LEDn) currently selected by the first shift register block 114. The LED is modulated at a rate higher than the rate of the "Shift_Step_Clock" signal (e.g. 24 LED chips per "Shift_Step_Clock" signal period). This modulation of the active LED is used for the correlation performed at the correlating filter 120 as discussed below. The LED modulation signal is also sent to the correlating filter 120 for that correlation process.

In some embodiments, the first shift register block 114 may comprise a single shift register or multiple shift registers connected in series (i.e. daisy-chained). Similarly, the second shift register block 116 may comprise a single shift register or multiple shift registers connected in series (i.e. daisy-chained).

FIG. 1B shows an example set of first and second shift registers 114a and 114b for driving LEDs which are connected to form first shift register block 114 in FIG. 1, where n=15 (i.e. 16 shift register outputs $Q_{LED0}$ to $Q_{LED15}$). As shown, the LED modulation and "Shift_Step_Clock" signals are input into the Inverse Output Enable and Clock inputs respectively of the first shift register 114a. The LED modulation and "Shift_Step_Clock" signals are also passed through to the same inputs of the second shift register 114b. Alternatively, rather than passing through the first and second shift registers 114a and 114b, the LED modulation and "Shift_Step_Clock" signals may be connected to each of the first and second shift register 114e and 114b in parallel.

The first shift register 114a has eight register positions corresponding to eight outputs $Q_{LED0}$ to $Q_{LED7}$, and second shift register 114b has another eight register positions corresponding to eight outputs $Q_{LED6}$ to $Q_{LED15}$. The data bit currently stored in the final register position of the first shift register 114a is output (labeled as output $Q_{LED7}'$) to the Data In input of the second shift register 114b. The output $Q_{LED7}'$ corresponds generally to the output $Q_{LED7}$, but is not dependent on the Output enable input of the shift register 114a.

The "Start_Pulse_LED_Shift" signal is input to the Data In input port of the first shift register 114a. A high-level data bit received from the "Start_Pulse_LED_Shift" signal will sequentially shift down the register positions corresponding to the eight outputs $Q_{LED0}$ to $Q_{LED7}$, at a rate set by the "Shift_Step_Clock" signal. When the data bit reaches the final register position corresponding to output $Q_{LED7}$ of the first shift register 114a, the high-level data bit is input to the second shift register 114b. Thus, starting on the next clock cycle, the high-level data bit will begin sequentially shifting through the eight register positions corresponding to the outputs $Q_{LED8}$ to $Q_{LED15}$ of the second shift register 114b.

The Outputs $Q_{LED0}$ will be actively driven high only when both the Inverse Output Enable is low and the data in the shift register associated with $Q_{LED0}$ is high. Outputs $Q_{LED1}$ to $Q_{LED15}$ are actively driven high similarly as the high data pulse is clocked through the shift registers.

More than two shift registers may be daisy chained together in other embodiments.

FIG. 1C shows an example set of first and second shift registers 116a and 116b for activating optical detectors, which are arranged to form the second shift register block 116 in FIG. 1, where n=15 (i.e. 16 shift register outputs $Q_{R0}$ to $Q_{R16}$). As shown, the "Shift_Step_Clock" signal is input into the Clock input of the first shift register 116a. The "Shift_Step_Clock" signal is also passed through to the same input of the second shift register 116b.

The first shift register 116a has eight register positions corresponding to eight outputs $Q_{R0}$ to $Q_{R7}$, and second shift register 116b has another eight register positions corresponding to eight outputs $Q_{R8}$ to $Q_{R1}$. The data bit stored in the final register is output (labeled as output $Q_{R7}'$) to the Data In input of the second shift register 116b. Thus, the first and second shift registers 116a and 116b are daisy chained similar to the first and second shift registers 114a and 114b, but with the Inverse Output Enable inputs kept low. Thus, a high data bit input to the first shift register 116a will travel through the first shift register 116a and then through the second shift register 116b.

More than two shift registers may be daisy chained together in other embodiments.

In this example, at least one same shift register (or group of shift registers) is used to drive a plurality of LEDs using a common pre-synchronized enable signal may allow a large number of LEDs to be addressed using a single selection signal (e.g. "Start_Pulse_LED_Shift" signal in FIGS. 1A to 1C) and modulated by a single signal (e.g. LED modulation signal in FIGS. 1A to 1C) from the controller. The optical detectors are similarly enabled using a single selection signal (e.g. "Start_Pulse_Rx_Shift" signal in FIGS. 1A to 1C) from the controller that is synchronized with the LEDs. The same clock signal (e.g. "Shift_Step_Clock" in FIGS. 1A to 1C) from the controller is input to the shift registers. Thus, a variable number of LEDs and optical detectors may be selectively enabled using the same four signals. Similarly, a single output analog databus (labeled "ScreenOut") is used to carry the time-multiplexed output of all of the optical detectors. This may allow for a relatively compact interconnect 106 between the touch sensor 104 and the controller 102 having a size and number of wires that is independent of sensor area size.

One skilled in the art will appreciate that there are multiple alternative embodiment variations that deliver a similar LED drive and receiver activation capability using different combinations of high or low "Start_Pulses", using "AND" or "OR" gates or Output Enable circuits or Inverse Output Enable circuits on the outputs of the shift registers, and/or changing the LEDs and receivers from active high to active low devices.

FIG. 1D is a schematic diagram of one possible embodiment of the touch sensor 104 from FIG. 1A, using the first and second shift registers 114a and 114b in FIG. 18 and the first and second shift registers 116a and 116b in FIG. 1C.

In FIG. 1D, the touch sensor 104 comprises an electronic display 180, the shift registers 114a and 114b, the shift registers 116a and 116b, 16 LEDs (LED0 to LED15) and 16 optical detectors (Rx0 to Rx15). A first set of eight LEDs (LED0 to LED7) are arranged along a top edge of the display 180, with a corresponding first set of eight optical detectors (Rx0 to Rx7) arranged along the bottom of the display 180, such that each detector (Rx0 to Rx7) is aligned with a respective one of the LEDs (LED0 to LED7). The outputs $Q_{LED0}$ to $Q_{LED7}$ of the first shift register 114a are each connected to a respective one of the first set of LEDs (LED0 to LED7). The outputs $Q_{R0}$ to $Q_{R7}$ of the first shift register 116a are each connected to a respective one of the first set of optical detectors (Rx0 to Rx7). Thus, vertical light paths are created between the first set of LEDs (LED0 to LED7) and the first set of optical detectors (Rx0 to Rx7) as illustrated by downward facing arrows in FIG. 1D.

The second set of eight LEDs (LED8 to LED15) are arranged along the left edge of the display 180 and connected to corresponding outputs $Q_{LED8}$ to $Q_{LED15}$ of the second shift register 114b. The second set of eight detectors (Rx8 to Rx15) are arranged along the right edge of the display 180 and connected to the corresponding outputs of $Q_{R8}$ to $Q_{R15}$ of the second shift register 116b. The second set of eight LEDs (LED8 to LED15) and the second set of eight detectors (Rx8 to Rx15) are aligned to form horizontal (left to right in this example) light paths as indicated by right facing arrows in FIG. 1D.

Figure 10:
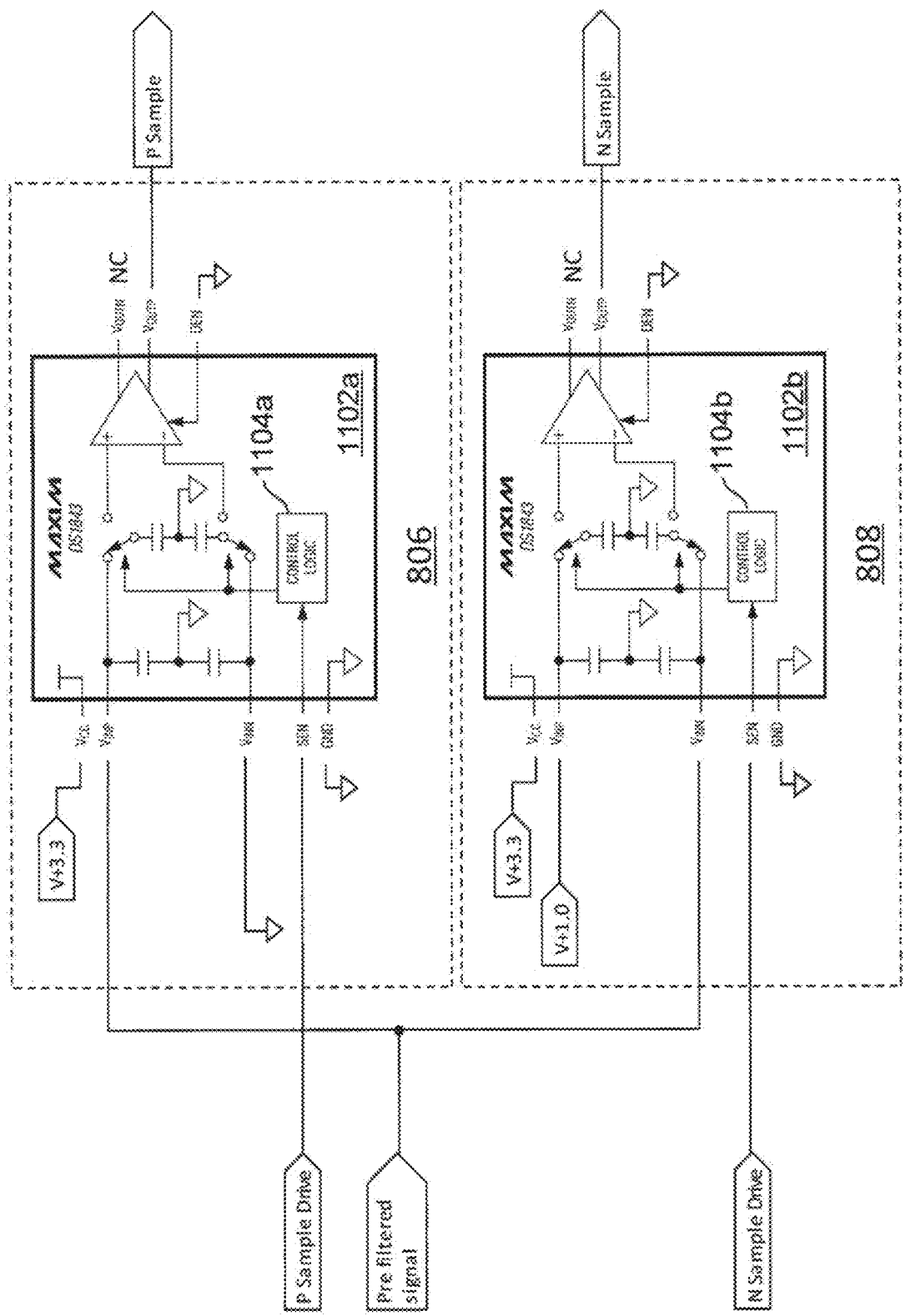
FIG. 10 is a schematic diagram of a first analog-sample-and-hold block and a second analog-sample-and-hold block of the correlating fitter of FIG. 8 according to an embodiment.

FIG. 10 also shows a circle 150 representative of an object (e.g. finger) touching the display 180. This touch event blocks light from LED3, LED4, LED12 and LED13. Thus, the X and Y position of the touch event may be approximated by detecting the change in light received at Rx3, Rx4, Rx12 and Rx13.

Figure 2:
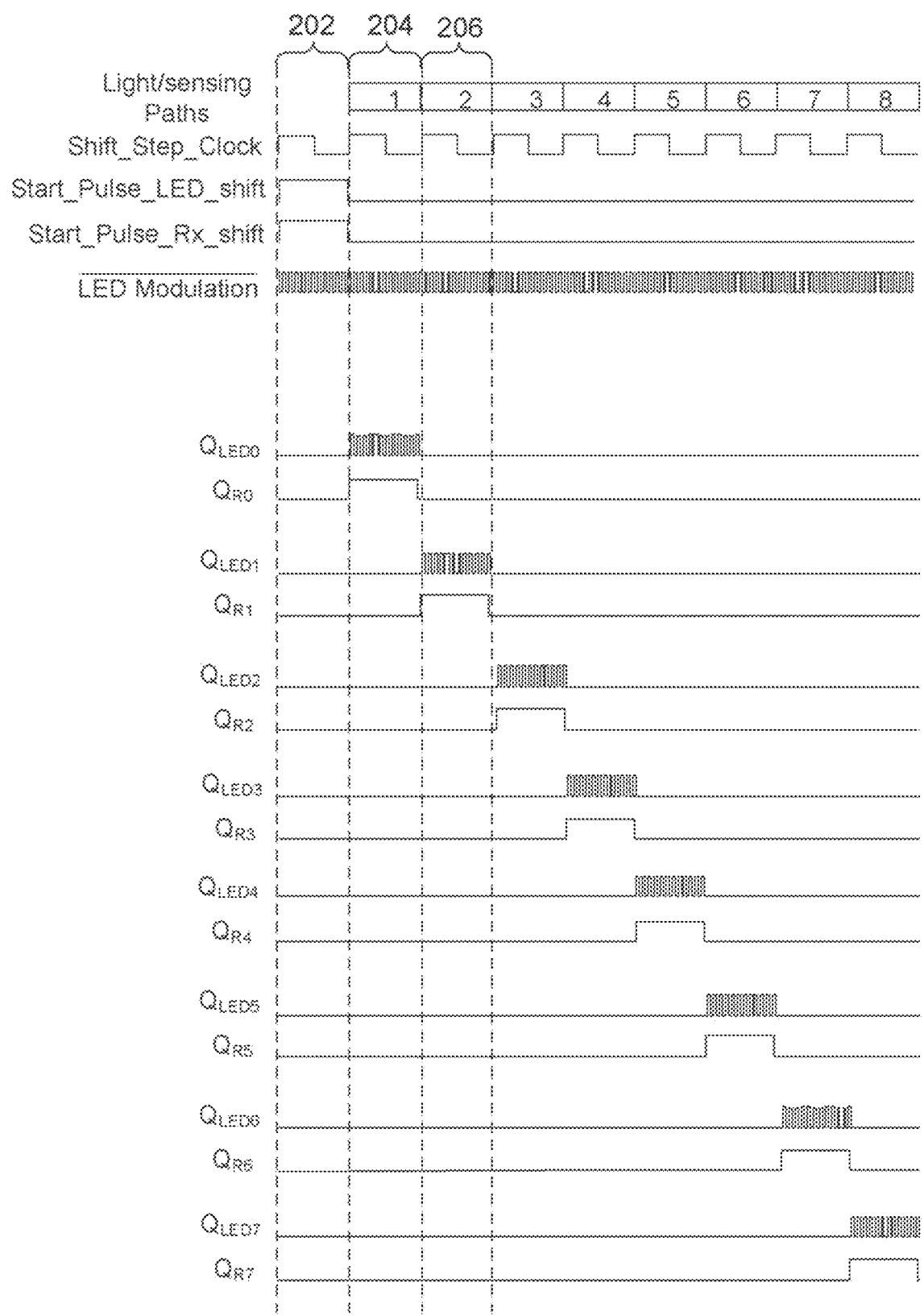
FIG. 2 is a signal diagram showing example input and output signals within the system of FIG. 1A.

FIG. 2 illustrates the states of output signals "Start_Pulse_LED_Shift"; "Shift_Step_Clock"; "LED modulation"; and "Start_Pulse_RX_Shift" over an 8-step cycle. The resulting states of the outputs $Q_{LED0}$ to $Q_{LED7}$ of the first shift register 114a and the outputs $Q_{R0}$ to $Q_{R7}$ of the first shift register 116a from FIG. 1D are shown. A similar output pattern will subsequently follow through the second shift register 114b and the second shift register 116b.

As shown, the "Start_Pulse_LED_Shift" and "Start_Pulse_RX_Shift" signals are high for the first clock cycle 202 (i.e. step or shift period) set by the "Shift_Step_Clock" signal, in order to start a data bit "1" moving through each of the shift registers 114a and 116a. In the next clock cycle, the "Start_Pulse_LED_Shift" and "Start_Pulse_RX_Shift" signals are driven low and stay low for the remainder of the sequence shown. Thus, through the sequence shown, a single "1" bit travels through each of the shift registers 114a and 116a.

In the next clock cycle 204 shown, the "1" bit is shifted to the first outputs $Q_{LED0}$ and $Q_{R0}$ of the registers 114a and 116a. The output $Q_{R0}$ that drives the first detector (Rx0 in FIG. 1A) stays high for the entire clock cycle, because the Inverse Output Enable input of the shift register block 116 is grounded (see FIG. 1A). However, the LED modulation signal input to the first shift register block 114 modulates the output $Q_{LED0}$ that drives the first LED (LED0 in FIG. 1A). Thus, the output of the first LED (LED0) is modulated at the frequency of the LED modulation signal.

In the next clock cycle 206 shown, the "1" bit is shifted to the second outputs $Q_{LED1}$ and $Q_{R1}$ of the registers 114a and 116a. The output $Q_{R1}$ that drives the second detector (Rx1 in FIG. 1) stays high for the entire clock cycle. The output $Q_{LED1}$ drives the modulated output of the second LED (LED1 in FIG. 1) at the frequency of the LED modulation signal.

The process continues, and for each subsequent clock cycle (i.e. step period), the active detector/LED pair shifts by one due to the shifting outputs of the shift registers 114a and 116a. This process eventually results in each LED/detector pair being active for a period, which may collectively be referred to as a single "scan" of the touch sensor. The scan process may then be repeated periodically to scan for the presence of one or more fingers or other objects partially or fully blocking transmission between one or more detector/LED pairs.

As described above, each LED is modulated to provide several chips over the active period of the corresponding optical detector. For example, each LED may be chipped 24 times, 32 times, 64 times or more. The frequency of the LED modulation may, for example, be in the range of 100 kHz or more. The main limits on how fast the LED modulation may be is the optical detector speed and the correlator minimum sampling period. Conventional optical detectors typically used in touch sensor devices may not be fast enough to reliably operate at such frequencies. Existing detectors that may be fast enough may be large and/or expensive such that they are not ideal for use in consumer portable devices in which small form factors (including small bezel spaces) and reasonable price points are important factors.

According to an aspect of the disclosure, there is provided a photo diode-type optical detector. The optical detector may be suitable for use in the touch sensor system 100 shown in FIG. 1, for example.

The LEDs may each have lens that focusses the majority of its light into a beam. For example, the beam may be focused to a 3 dB width of around 10 degrees.

Figure 3:
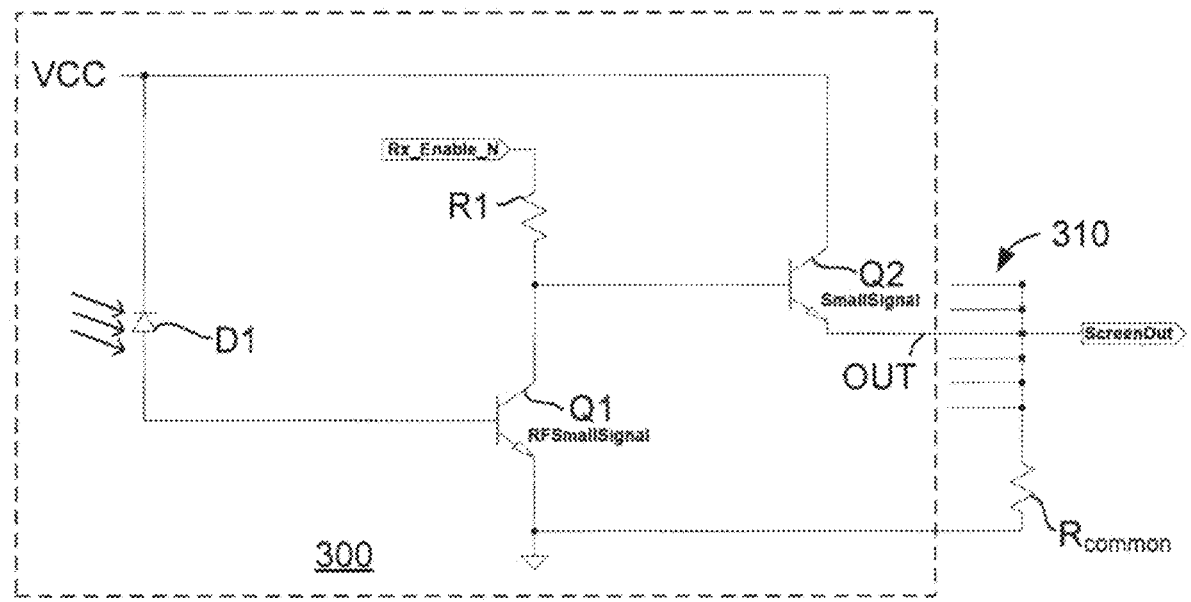
FIG. 3 is a schematic diagram of an example optical detector according to some embodiments.

FIG. 3 is a schematic diagram of a photodiode-type analog optical detector 300 according to some embodiments. Each of the optical detectors Rx0 to Rxn shown in FIG. 1 may have the form of the optical detector 300 shown in FIG. 3. In FIG. 3 the "RX_Enable_N" signal is the signal drive used to enable or activate the optical detector 300 (being the "N"th receiver in this example). For example, the "RX_Enable_N" signal would be the corresponding shift register output for the touch sensor system 100 in FIG. 1.

The analog optical detector 300 includes a photo-diode D1 and first and second transistors Q1 and Q2. The first and second transistors Q1 and Q2 are NPN transistors in this example and may be in the form of a 6-pin dual transistor package. However, embodiments are not limited to a particular type of transistor or the particular arrangement of the optical detector 300. The photo-diode D1 is connected between the base of Q1 and voltage VCC (4V in this example).

The first transistor Q1 is coupled to the photodiode D1 in a current amplifier configuration that generates an amplified current output as a function of a photodiode current. The second transistor Q2 is also a bipolar transistor and functions as enable circuitry to enable and disable the optical detector 300, as explained below. However, embodiments are not limited to bipolar transistors as the enable circuitry.

The base of Q2 is connected to the collector of the first transistor in parallel with a first resistor R1, which may control sensitivity. The resistor R1 is also connected to receive the "Rx_Enable_N" signal input, which is in turn connected to the corresponding output of the shift register (e.g. one of Rx0 to Rxn in FIG. 1A). The base of Q1 is grounded. The collector of Q2 is connected to voltage VCC and the emitter is connected to the output "OUT" of the optical detector 300. The collector of the second transistor Q2 may, in some embodiments, be powered at least 0.3V above the high voltage of the emitter connected to common output bus.

The voltage across the photodiode may be 3.5 volts. The photodiode D1 may be a 4.0 mm spaced IR photodiode with a lens. The "Rx_Enable_N" signal input may periodically be driven high with a 3.3 volt pulse to enable the optical detector 300. The VBE (base-to-emitter voltage) 01 may be 0.5 volts. The resistors R1 and Rcommon may be a 0402 type resistor. Q1 and Q2 may be in the form of a 6-pin dual transistor package. These specifications are provided by way of example, and embodiments are not limited to these particular specifications.

The outputs of other optical detectors (not shown in FIG. 3) may be connected in parallel via output connections 310 to a common output analog databus labeled "ScreenOut" (see, for example, the common output connection of the detectors Rx0 to Rxn shown in FIG. 1, which produce the collective output signal). A resistor Rcommon is connected between output connections 310 and ground.

The first transistor Q1 acts as a current-to-current amplifier with its collector current being the photo-diode current multiplied by the transistor's Hfe current gain factor. The voltage across the photo-diode D1 may not vary significantly as the photo-diode's current varies. A minimal resistance may be in series with the emitter of the first transistor Q1. The collector of the first transistor Q1 is biased by resistor R1 that is driven by the "Rx_Enable_N" signal input.

The photodiode D1 is essentially constantly reverse biased and feeds its photo-induced current into the base of the first transistor Q1. The almost constant bias may result in very little of the small optically induced current changes being wasted in charging and discharging the photodiode D1 and/or transistor parasitic capacitances.

When the "Rx_Enable_N" signal input is high, the first transistor Q1 may amplify any current from the photodiode D1 resulting in a light dependent voltage across the resistor R1 which the second transistor Q2 buffers onto a common analog databus 117. When the "Rx_Enable_N" signal input is low, the collector of the first transistor Q1 may be low preventing it from acting as an amplifier. In this case, the photodiode current simply passes through the base emitter junction of the first transistor Q1. The base of the second transistor Q2 may also be low preventing any current flow through it.

Q2 enables and disables the current amplifier of Q1 as a function of an enable input signal (the "Rx_Enable_N" signal in FIG. 3). When the "Rx_Enable_N" signal input is low, no current flows into Q1's collector as Q2 base to collector and base to emitter junctions are both reverse biased. Q2's emitter therefore also injects no current onto the ScreenOut bus.

When the "Rx_Enable_N" signal input is high the voltage seen at Q2's base will be approximately equal to the "Rx_Enable_N" signal input voltage minus the drop across R1 due to the current flowing through Q1's collector which is proportional to the photo-diode current.

The emitter of Q2 drives the "ScreenOut" signal output at around 0.5V less than Q2's base voltage.

When the reverse biased photodiode D1 is exposed to IR light from the LEDs, current proportional to that light is released through the photodiode D1. This current is amplified by Q1 and if the collector of Q1 is biased high via the resistor R1, a voltage proportional to the current will be seen across R1. If R1 is not biased high the voltage on Q1's collector will stay low (e.g. less than 0.6V).

R1 is selected so that when the photodiode is exposed to the maximum level of IR light Q1 will still have sufficient voltage across it to act as an amplifier. Preferably, R1 is optimized to ensure significant voltage swings due to the light from the screen's LEDs while ensuring the voltage across R1 under the maximum possible levels of light is less than 3V.

Unlike conventional designs, in the example embodiment of FIG. 3, no additional series emitter resistance is added to control first stage gain. Photodiode and Q1 manufacturing gain variations are calibrated and compensated for later by software. Minimizing the effective base of Q1 to ground resistance may minimize the voltage variations across the Photo-Diode D1 which in turn minimizes diode D1 and transistor Q1 parasitic capacitance charge and discharge currents, which may enable or facilitate fast operation. A pulldown resistor Rcommon is shown in FIG. 3 connected between all output connections 310 and ground. Resistor Rcommon may be physically located within a bezel around the periphery of the touch sensor device, for example. Alternatively, R1 may be located in the controller or duplicated in both the bezel and the controller. R5 may be added to reduce a higher-level pulse drive down to levels where the Q2 remains biased when activated. Rcommon is shared between all detectors.

Figure 4A:
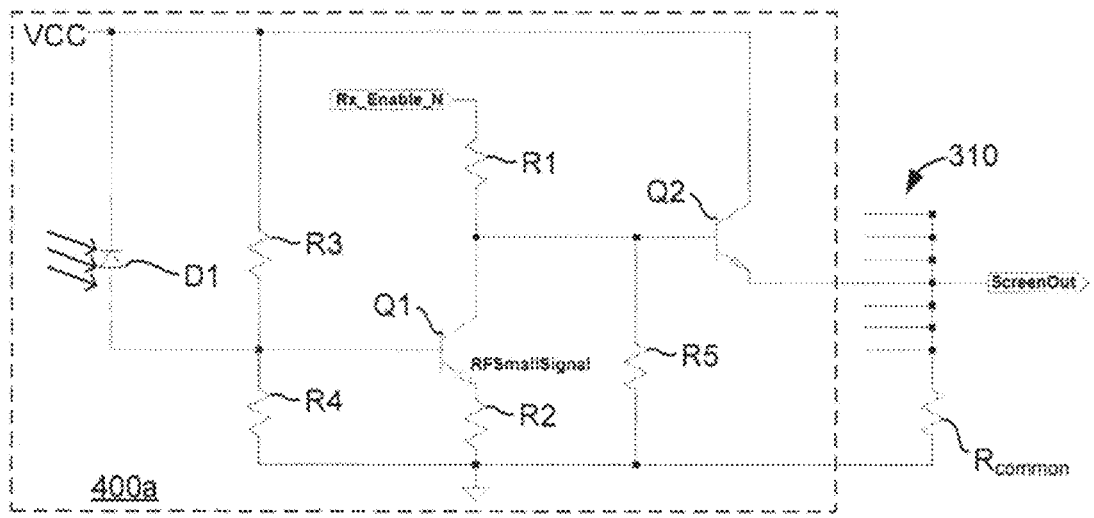
FIGS. 4A to 4D are schematic diagrams of further example optical detectors according to some embodiments.
Figure 4B:
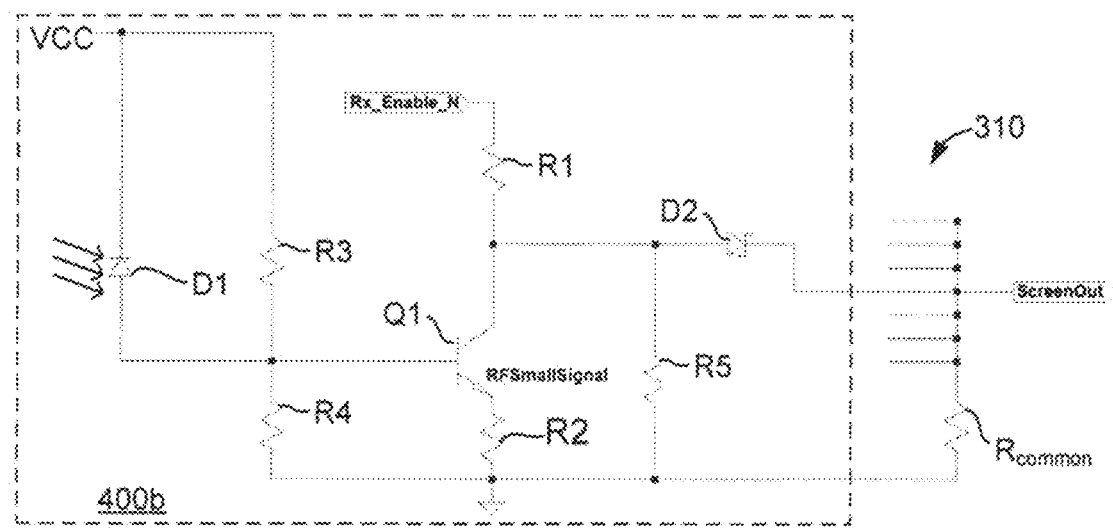
Figure 4C:
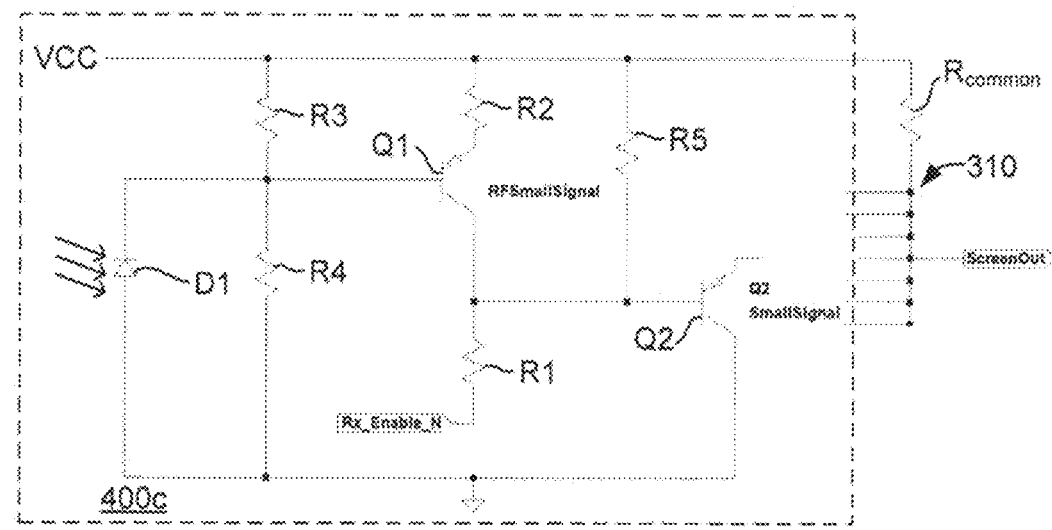
Figure 4D:
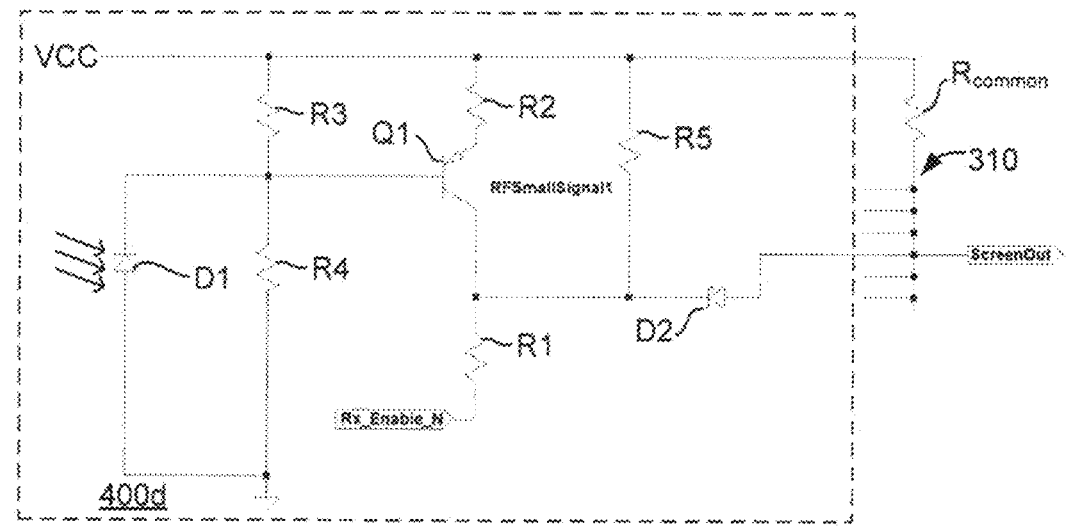

As mentioned above, embodiments are not limited to the particular analog optical detector 300 shown in FIG. 3. Schematics of alternate analog optical detectors 400a to 400d are shown in FIGS. 4A to 4D respectively. The optical detectors 400a and 400d may be suitable for use in touch sensor applications, such as the touch sensor system 100 shown in FIG. 1. The detectors 400a to 400d include resistors R1, R2, R3, R4, R5 and Rcommon, photodiode D1, and a first bipolar transistor Q1. In FIGS. 4A and 4B, Q1 is an NPN transistor and R2 is connected between the Q1 emitter and ground. In FIGS. 4C and 4D, Q1 is a PNP transistor and R2 is connected between the Q1 emitter and ground. R3 is a bias up resistor and R4 is a bias down resistor. Detectors 400a and 400c include a second bipolar NPN or PNP transistor Q2. Detectors 400b and 400d include a Schottky diode D2 rather than a second transistor to function as an enable control. Output connections 310 are also shown in FIGS. 4A to 4D.

The use of a bipolar transistors may be beneficial in the analog optical detector 300 because bipolar transistors have high gain, but also a relatively small capacitance between the collector and base. This small capacitance may be advantageous over other compact or low cost detectors for one or more of the following reasons. First, the high gain may allow for amplification of small detected levels above noise. Second, it may enable fast analog detecting at the high modulation frequencies discussed herein.

The alternative analog optical detectors 400a to 400d may operate similar to the optical detector 300 in FIG. 3. The analog optical detectors 400a to 400d may be particularly suitable if one or more of the following conditions are satisfied: resistor R2 is small enough so that, under maximum light exposure on the photo-diode, the voltage across R2 is less than 0.5V (or alternatively R2 is omitted); and resistors R3 and R4 impedances are similar or higher to the photo-diode when exposed to LED light (or alternatively R3 and R4 are omitted).

Using R2 to add a small amount of resistance in series with the emitter of Q1 as shown in FIGS. 4A to 4D where the value of R2 is less than 50 ohms may not significantly affect the operation of the optical detector.

A resistor with a value of around 500 ohms may optionally be placed in series with the photodiode D1 as a fault current limiting device only and may not significantly affect the operation of the optical detector.

Adding bias resistors R3 and/or R4 as shown in FIGS. 4A to 4D, where their parallel impedance is greater than 10 Meg ohms, for example, may not significantly affect the operation of the optical detector.

In some embodiments as shown in FIG. 4A and FIG. 4B, the "Rx_Enable_N" signal input is a positive high-level logic signal driven from a shift register. In other embodiments such as FIG. 4C to FIG. 4D the "Rx_Enable_N" signal input is a negative low-level logic signal.

If Q2 is a bipolar transistor as in FIG. 4A and FIG. 4C, the high level may be at least 0.8V less than VCC to ensure Q2 remains suitably biased.

In the embodiment of FIG. 3, the optical detector uses a compact low capacitance dual NPN transistor for Q1. However as shown in FIGS. 4C and 4D, the same or similar functionality may be achieved using a PNP transistor for Q1.

Rather than the specific transistors shown in FIGS. 3 to 4D, various combinations of NPN transistors, PNP transistors, Diodes, JFETS, NMOS and/or PMOS gates may be to perform similar functions as Q2. Embodiments are not limited to the specific components or arrangements shown in FIGS. 3 to 4D.

Figure 5A:
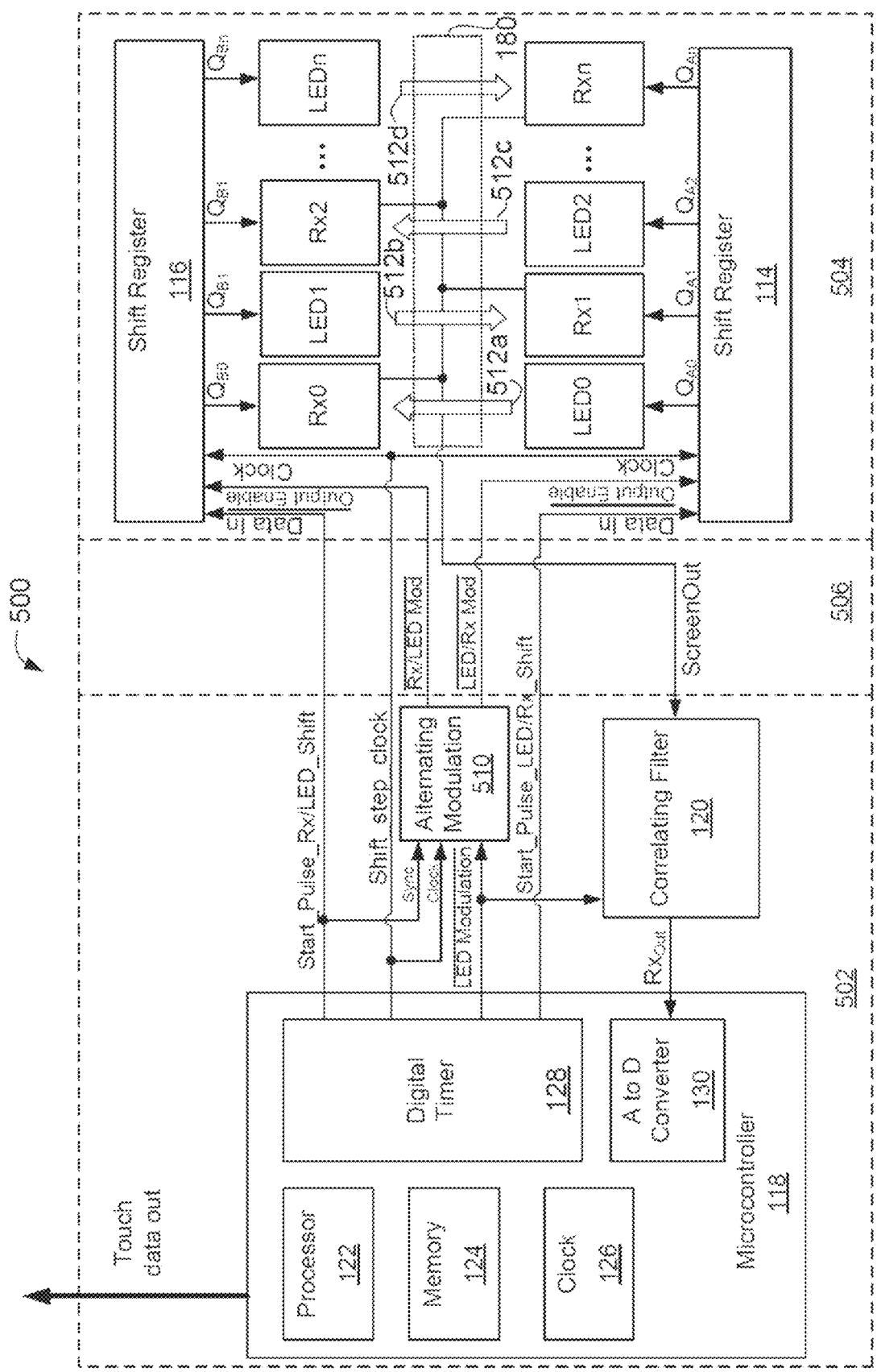
FIG. 5A is a block diagram of another example IR touch sensor system according to some embodiments.

FIG. 5A is a block diagram of an example IR touch sensor system 500 according to another aspect of the disclosure using an interleaved LED/optical detector arrangement. The system 500 is similar to the touch sensor system 100 shown in FIG. 1, with like reference characters indicating like elements. Again, the components of the system 500 are divided into the following general components: a touch sensor controller 502; touch sensor circuitry 504 and an interconnect 506 coupling the touch sensor controller to the touch sensor circuitry 504. The system 500 may be entirely housed in an IR touch sensor device (such as a tablet). Alternatively, the touch sensor controller 502 and the touch sensor circuitry 504 may be housed in separate devices (e.g. control module and separate touch sensor), with the controller 502 several inches from the touch sensor circuitry 504.

As shown, the detectors Rx0 to Rxn and the LEDs (LED0 to LEDn) are in an interleaved arrangement. More specifically, the first shift register block 114 has outputs $Q_{A0}$ to $Q_{An}$, that are connected in an alternating sequence to LEDs (LED0, LED2, LED4, . . . ) and detectors (Rx1, Rx3, Rx5, . . . ). In other words, the output $Q_{A0}$ for the first register position is connected to LED0, the output $Q_{A1}$ for the second register position is connected to Rx1, the output $Q_{A2}$ fort the third register position is connected to LED2, and so on. Second shift register block 116 has outputs $Q_{B0}$ to $Q_{Bn}$ that are connected to detectors Rx0, Rx2, Rx4 and Rx6 and LED1, LED3, LED5 and LED7 in an alternating fashion that is reversed compared to the first shift register block 114 (i.e. Rx0, LED1, Rx2, LED3, and so on). The detectors Rx0 to Rxn and the LEDs (LED0 to LEDn) are, thus, arranged to form light paths in alternating directions, as illustrated by arrows 512a to 512d.

Each of the shift register blocks 114 and 116 thus activate a respective set of LEDs and detectors. The LEDs (LED0 to LEDn) are again modulated at a frequency higher than the shift rate of the shift register blocks 114 and 116. To provide the proper alternating Inverse Output Enable input signals to the shift register blocks 114 and 116, the controller includes Alternating Modulation Generation module 510 in this embodiment. The Alternating Modulation Generation module 510 receives, as input, the "Start_Pulse_RX/LED_Shift" signal (as a "sync" input) and the "Shift_Step_Clock" signal (as a "clock" input). The Alternating Modulation Generation module 510 also receives the LED modulation signal as an input. The Alternating Modulation Generation module 510 generates output signals "Rx/LED Mod" and "LED/Rx Mod" as a function of those inputs. The "LED/Rx Mod" and "Rx/LED Mod" signals are input to the "Inverse Output Enable" Inputs of the shift register blocks 114 and 116 respectively, as shown. The "LED/Rx Mod" and "Rx/LED Mod" signals are "active low" driving the Inverse Output Enable inputs of the shift register blocks 114 and 116 which in this example are activated by a 0V input.

When the first shift register block 114 is driving an LED (i.e. LED0, LED2, . . . ), the "LED/Rx Mod" signal is the LED modulation signal over that step period. When the first shift register block 114 is driving a detector (i.e. Rx1, Rx3, . . . ), the "LED/Rx Mod" signal is held low though the step period. The "Rx/LED Mod" signal similarly shifts between LED modulation signal and being held low for each step, but in the opposite step clock period to the alternating of "LED/Rx Mod" signal.

FIG. 5I shows the example set of first and second shift registers 114a and 114b, which are connected to form the first shift register block 114 in FIG. 5A, where n=15 (i.e. 16 shift register outputs $Q_{A0}$ to $Q_{A15}$). Rather than the LED modulation signal of FIG. 1B, in FIG. 5B, the "LED/RX Mod" signal is input into the Inverse Output Enable input of the first shift register 114a. Otherwise, the structure and function of the first and second shift registers 114a and 114b is similar to the example shown in FIG. 1B. Again, the data bit in the final register position of the first shift register 114a is output (labeled $Q_{A7}$) input the Data In input of the second shift register 114b.

Figure 5B:
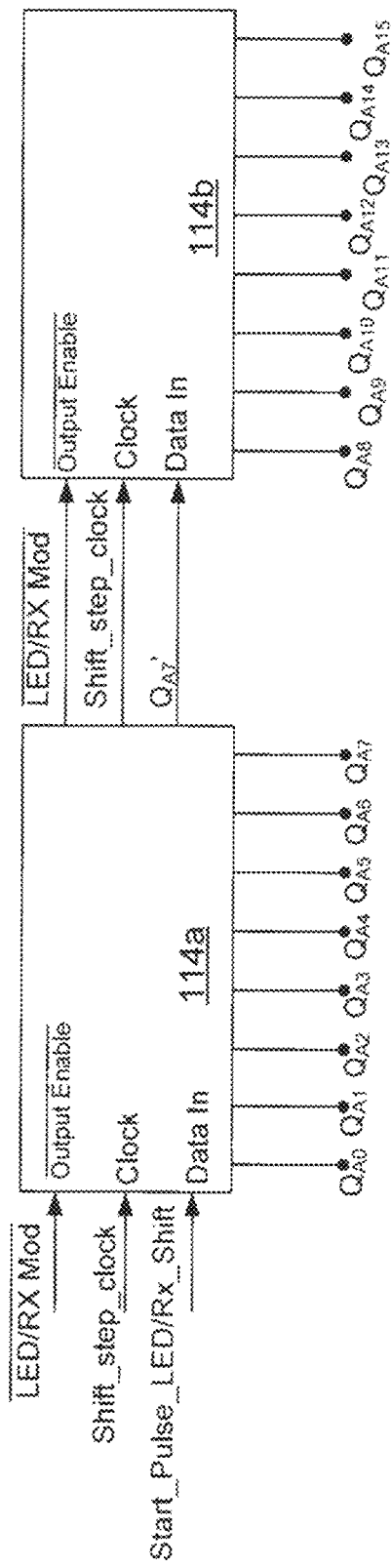
FIG. 5B is a block diagram of example first and second shift registers connected in series for activating LEDs in the touch sensor system of FIG. 5A.
Figure 5C:
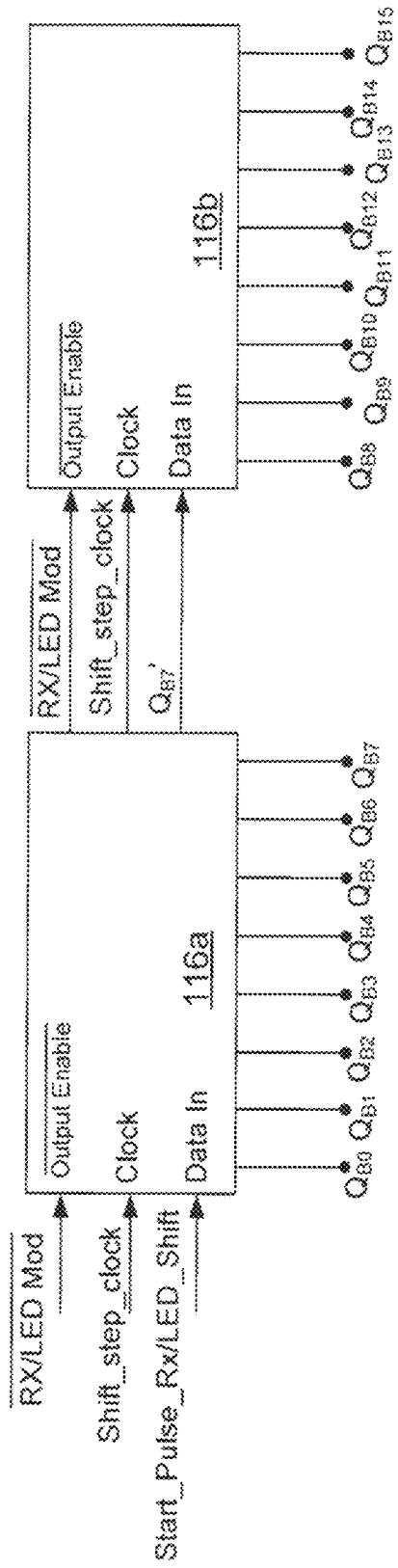
FIG. 5C is a block diagram of example first and second shift registers connected in series for activating optical detectors in the touch sensor system of FIG. 5A.

FIG. 5C shows an example set of first and second shift registers 116a and 116b, which are arranged to form the second shift register block 116 in FIG. 5A, where n=15 (i.e. 16 shift register outputs $Q_{B0}$ to $Q_{B15}$). Rather than being grounded, the Inverse Output Enable inputs of the first and second shift registers 116a and 116b receive the "Rx/LED Mod" signal as input. Otherwise, the structure and function of the first and second shift register blocks 116a and 116b is similar to the example shown in FIG. 1C. Again, the data bit in the final register position of the first shift register 116a is output (labeled $Q_{B7}$) input the Data in input of the second shift register 116b.

In the example of FIGS. 5A to 5C, at least one shift register is used to drive a first group of LEDs and detectors using a common pre-synchronized selection signal (e.g. "Start_Pulse_LED/Rx_Shift" signal in FIGS. 5A to 5C) and enable signal (e.g. "LED/Rx Mod" signal). Similarly, a second group of LEDs and detectors that is aligned with the first group and connected to another at least one shift register to be driven by a common pre-synchronized selection signal (e.g. "Start_Pulse_Rx/LED_Shift" signal in FIGS. 5A to 5C) and enable signal (e.g. "Rx/LED Mod"). The same clock signal (e.g. "Shift_Step_Clock" signal in FIGS. 5A to 5C) is input to each at least one shift register. Thus, a variable number of LEDs and optical detectors may be selectively enabled using the same five signals. Similarly, a single output analog databus (labeled "ScreenOut") is used to carry the time-multiplexed output of all of the optical detectors). This may allow for a relatively compact interconnect 506 between the touch sensor 504 and the controller 502 having a size and number of wires that is independent of sensor area size.

Figure 5D:
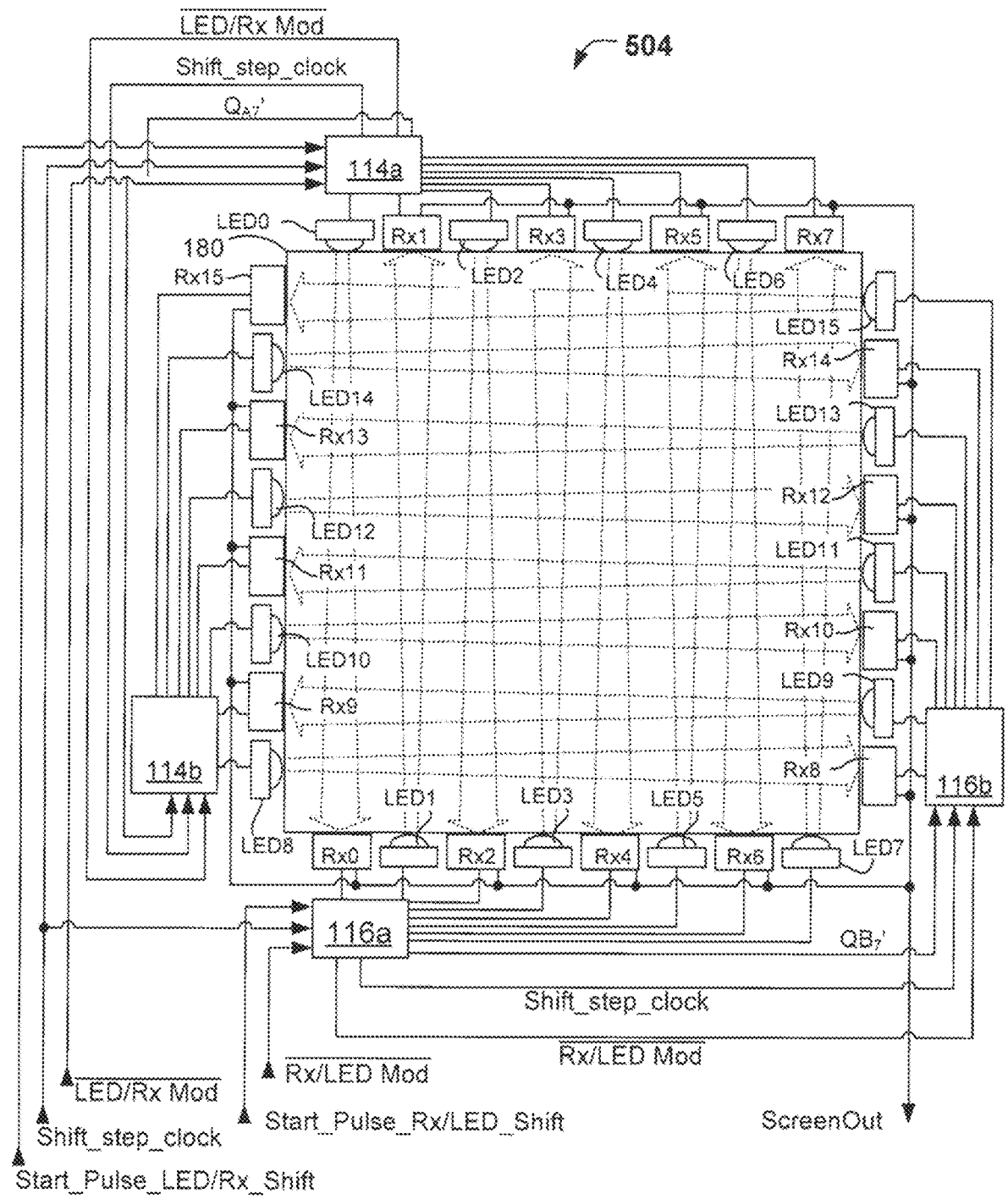
FIG. 5D is a schematic diagram of an example touch sensor of the system of FIG. 5A.

FIG. 5D is a schematic diagram of one possible embodiment of the interleaved-type touch sensor 504 from FIG. 5A, using the first and second shift registers 114a and 114b in FIG. 5B and the first and second shift registers 116a and 116b in FIG. 5C.

In FIG. 5D, the touch sensor 104 comprises the electronic display 180, the first and second shift registers 114a and 114b, the other first and second shift registers 116a and 116b, the 16 LEDs (LED0 to LED15) and the 16 optical detectors (Rx0 to Rx15).

A first set of eight LEDs (LED0 to LED7) are arranged, in an alternating manner, along top and bottom edges of the display 180. In other words, LED0, LED2, LED4 and LED6 are spaced apart along the top, while LED1, LED3, LED5 and LED7 are spaced apart along the bottom. A corresponding first set of eight optical detectors (Rx0 to Rx7) are arranged along the top and bottom edges in an interleaved fashion with the LEDs, each detector being aligned with a corresponding LED such that eight vertical light paths (shown with arrows) for light traveling from an LED to the corresponding detector are provided. Adjacent light paths alternate in vertical direction. The outputs $Q_{A0}$ to $Q_{A7}$ of the first shift register 114a are each connected to a respective one of the first set of LEDs (LED0 to LED7). The outputs $Q_{B0}$ to $Q_{B7}$, of the first shift register 116a are each connected to a respective one of the first set of optical detectors (Rx0 to Rx7). Thus, vertical light paths are created between the first set of LEDs (LED0 to LED7) and the first set of optical detectors (Rx0 to Rx7) as illustrated by downward facing arrows in FIG. 5D.

The second set of eight LEDs (LED8 to LED15) and detectors (Rx8 to Rx15) are similarly arranged and interleaved along the left and right edges of the display 180 and connected to corresponding outputs $Q_{A8}$ to $Q_{A15}$ and $Q_{B8}$ to $Q_{B15}$ of the second shift registers 114b and 116b to form alternating vertical light paths.

Figure 6:
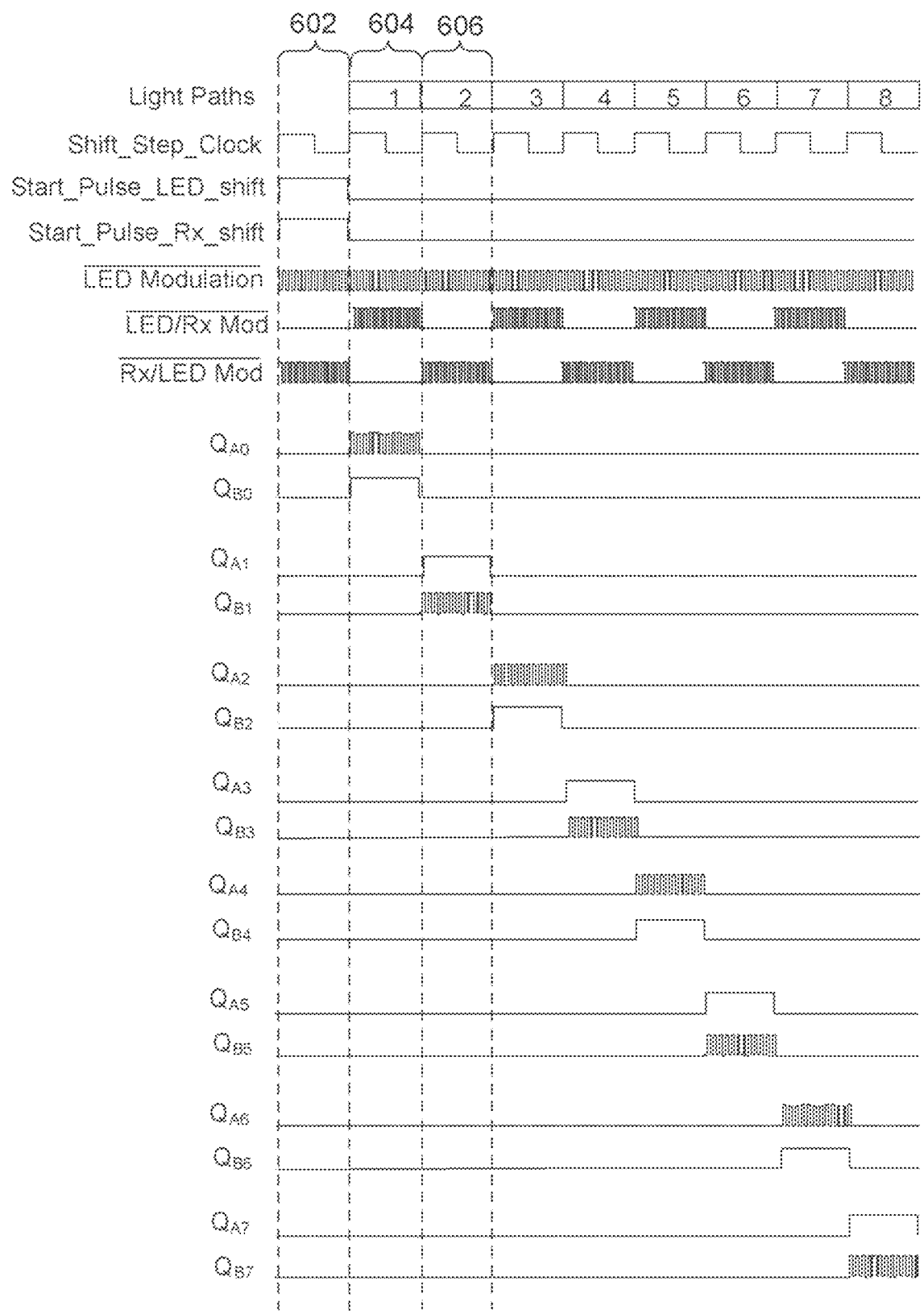
FIG. 6 is a signal diagram showing example input and output signals within the system of FIG. 5A.

FIG. 6 illustrates the states of output signals "Start_Pulse_LED/RX_Shift"; "Shift_Step_Clock"; "LED modulation"; "Start_Pulse_RX/LED_Shift"; "LED/Rx Mod"; and "Rx/LED Mod" over an 8-step cycle for the interleaved setup of FIGS. 5A and 5B. The resulting states of the outputs of the shift registers 114a and 116b (FIG. 5C) are shown.

As shown, the "Start_Pulse_LED/RX_Shift" and "Start_Pulse_RX/LED_Shift" signals are high for the first clock cycle 602 (i.e. step or shift period) set by the "Shift_Step_Clock" signal, in order to start a data bit "1" moving through each of the shift registers 114a and 116a. In the next clock cycle, the "Start_Pulse_LED/RX_Shift" and "Start_Pulse_RX/LED_Shift" signals are driven low and stay low for the remainder of the sequence shown. Thus, through the sequence shown, a single "1" bit travels through each of the shift registers 114a and 116a.

In the next clock cycle 604 shown, the "1" bit is shifted into the first register positions corresponding to outputs $Q_{A0}$ and $Q_{B0}$ so of the registers 114a and 116a. The output $Q_{B0}$ that drives the first detector (Rx0 in FIG. 5D) stays high for the entire clock cycle, because the Inverse Output Enable input of the first shift register 116a is activated by the "Rx/LED Mod" signal (which remains low during this cycle). However, the "LED/Rx Mod" signal input to the first shift register 114a modulates the output $Q_{A0}$ that drives the first LED (LED0 in FIG. 5D) during this cycle. Thus, the output of the first LED (LED0) is modulated at the frequency of the LED modulation signal.

In the next clock cycle 606 shown, the "1" bit is shifted to the second register positions corresponding to outputs $Q_{A1}$ and $Q_{B1}$ of the registers 114a and 116a. The output $Q_A$ that drives the second detector (Rx1 in FIG. 1) stays high for the entire clock cycle, because the Inverse Output Enable input of the first shift register 114a is activated by "LED/Rx Mod" (which remains low during this cycle). However, the "Rx/LED Mod" signal input to the first shift register 116a now modulates the output $Q_{B0}$ that drives the second LED (LED1 in FIG. 5D) during this cycle. Thus, the output of LED1 is modulated at the frequency of the LED modulation signal.

Each subsequent clock cycle (i.e. step period), the active detector/LED pair shifts by one due to the movement of the "1" bit through the registers 114a, 114b, 116a and 116b until each of the detector/LED pairs has been activated. This process may be referred to as a single "scan" of the touch sensor 504 (FIG. 5D). The scan process may then be repeated to continuously scan for the presence of one or more fingers or other devices touching the touch sensor 504.

Figure 7:
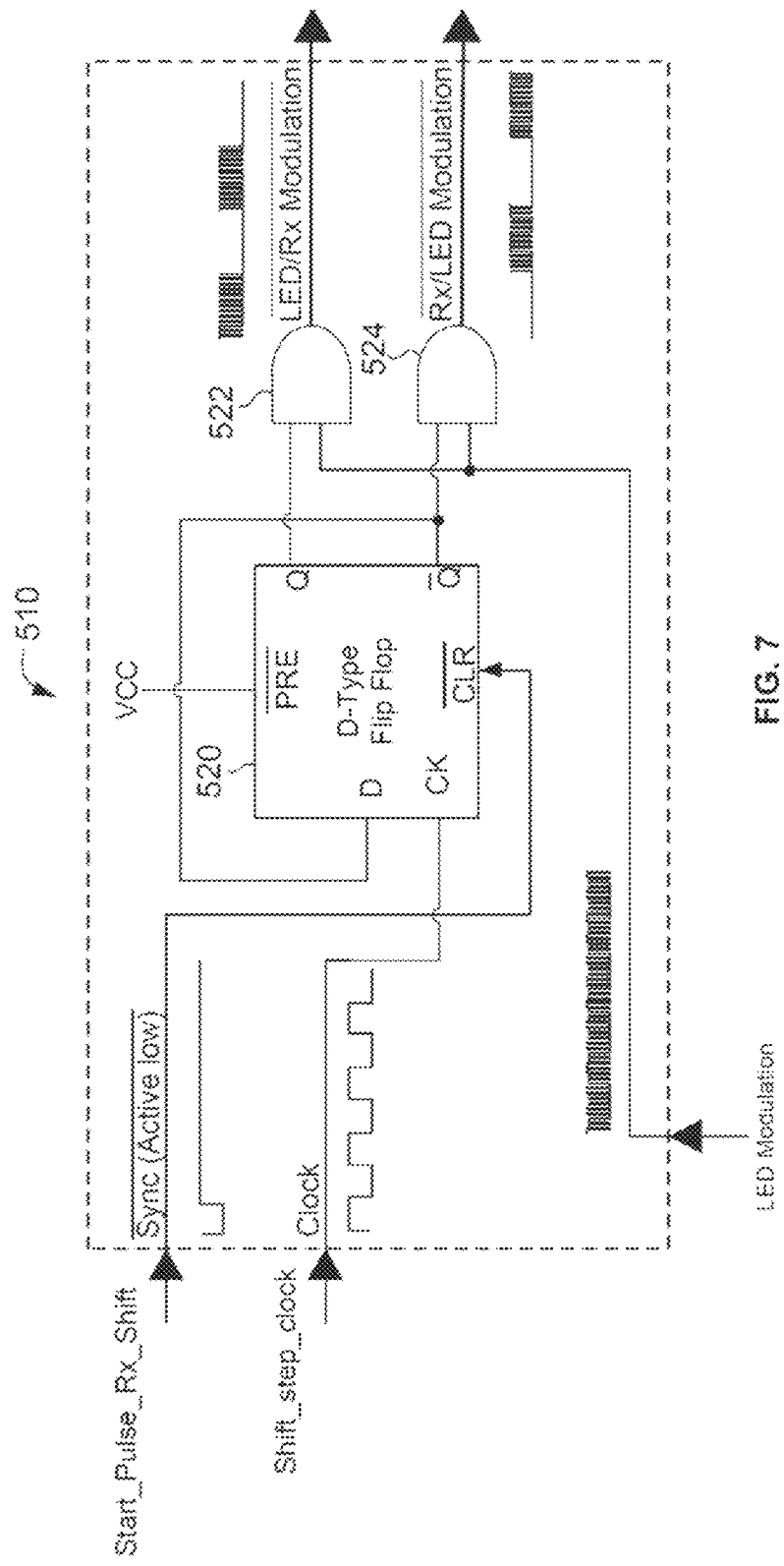
FIG. 7 is a schematic diagram of an example Alternating Modulation Generation module of the controller of FIG. 5A, according to an embodiment.

FIG. 7 is a schematic diagram of the alternating modulation generation module 510 of FIG. 5A, showing an example of how the "LED/Rx Mod" (modulation) and "RX/LED Mod" (modulation) signals in FIG. 6 may be generated. As shown in FIG. 7, the alternating modulation generation module 510 comprises a D-type flip flop 520 that receives, as input, the "Shift_Step_Clock" signal (as a "clock" input) and the "Start_Pulse_RX/LED_Shift" signal (as a "sync" Input). The Alternating Modulation Generation module 510 also receives the LED modulation signal as an input. The Q and inverse Q outputs of the flip flop 520 are connected to first inputs of first and second MUXs 522 and 524 respectively. The LED modulation signal is connected to the second inputs of both MUXs 522 and 524. The resulting output of the first MUX 522 is the "LED/Rx Mod" signal, and the resulting output of the second MUX 524 is the "RX/LED Mod" signal, as illustrated.

Alternatively, the alternating modulation signals could be generated by the micro-controller.

The correlation process performed in the correlating filter 120 of FIGS. 1A and 5A will now be described in more detail. The correlation may reduce noise.

Figure 8:
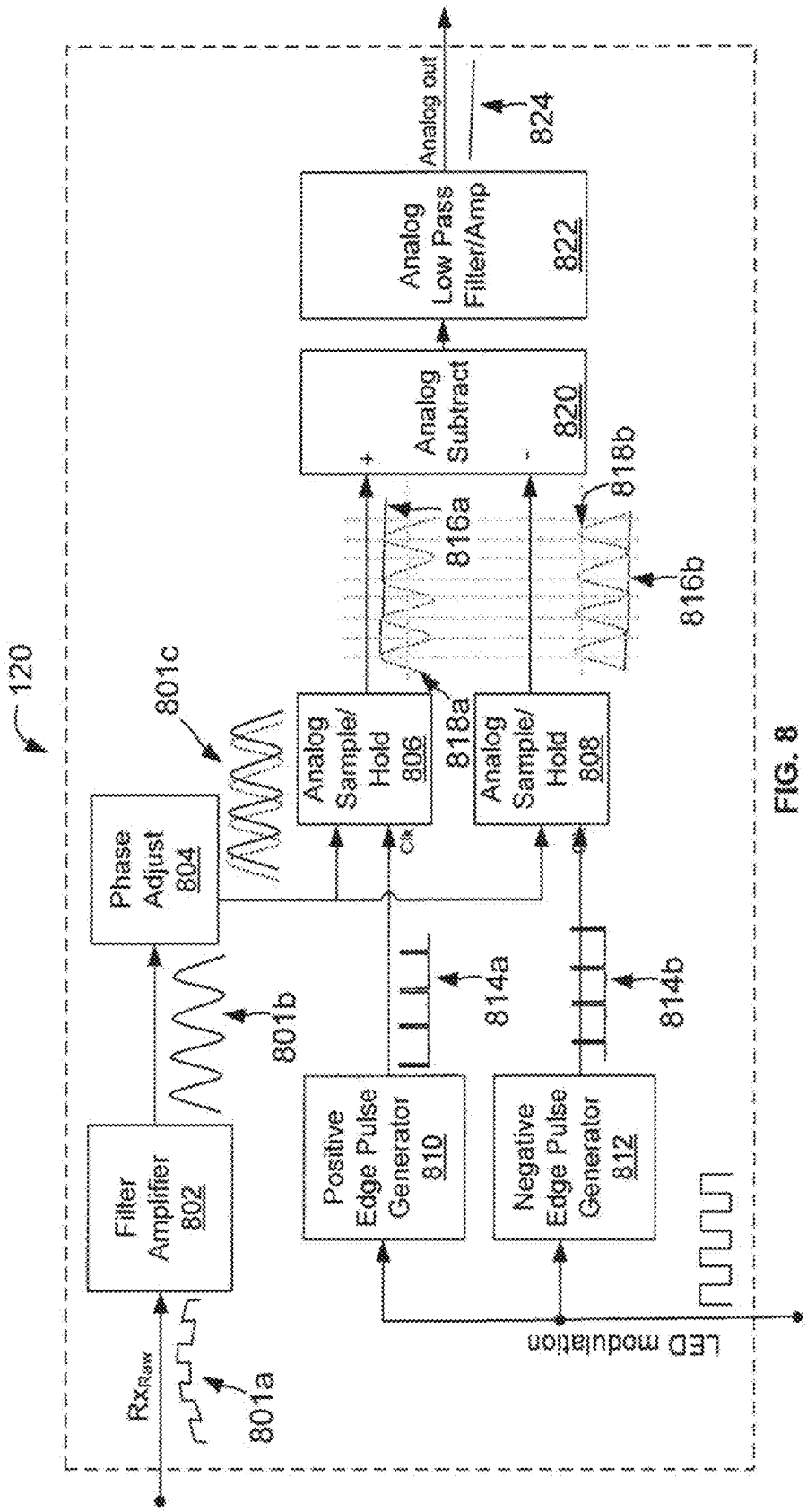
FIG. 8 is a functional block diagram of an example correlating filter of the controllers of FIGS. 1A and 5A, according to an embodiment.

FIG. 8 is a block diagram of the correlating filter 120. The correlating filter 120 may work with any digital modulation pattern that is balanced over the shift step clock period (e.g. a 110100101100 pattern, or a simple 101010 pattern, and so on) The term "balanced" in this context means that the number of 1's is equal to the number of 0's in the modulation pattern. It may be preferable to keep a latter portion of the pattern balanced over that portion as well. In one embodiment a simple alternating modulation pattern is used (i.e. 101010 and so on) with 24 chips per shift step clock period. As another example, the pattern may have 32 or 64 chips per step-clock period. It may be beneficial or simplify design if the chip rate is an exact division of the clock frequency of the microcontroller 118, although embodiments are not limited to any particular chip rate or modulation pattern. In FIG. 8, only 8 chips for the example received signal 801a is shown for clarity and illustrative purposes. Increasing the number of chips per shift step clock may improve noise rejection, but may include faster optics to work or may reduce the rate a complete sensor area can be scanned.

A first input receives the "ScreenOut" signal (i.e. raw collective detector output), which is the collective output of the optical detectors Rx0 to Rxn (FIGS. 1 and 5). The signal is a modulated (due to the modulation of the LED light incident on the detectors) and will typically include noise, such as ambient noise. A graphical representation of an example input "ScreenOut" signal portion 801a is shown for illustrative purposes. The "ScreenOut" signal input is first filtered and amplified by a filter-amplifier 802, which generates a pre-conditioned detector output signal, which is input into a fixed phase adjust block 804. The filter-amplifier 802 in this example is an analog band pass filter-amplifier. An example pre-conditioned detector output signal portion 801b is shown. An example phase adjusted signal portion 801c is shown. The phase adjustment may help ensure that the signal is sampled at or near the actual peaks/troughs. The relative phase of the filtered signal and the sampling pulses generated by the comparators may depend on the delays through the circuitry and the filter frequencies selected. The phase adjust circuit may be used to help ensure the sample timing is correct. Small tweaks in the phase may also be done to avoid sampling during digital glitches in the 3.3V power rail.

The phase-adjusted received signal from block 804 is then input into both of a first analog-sample-and-hold block 806 and a second analog-sample-and-hold block 808. The first and second sample-and-hold blocks 806 and 808 take samples at peaks and troughs of the signal respectively. The phase adjustment performed by block 804 may be improve or maximize the efficiency of the sample-and-hold blocks 808 and 808.

An alternative location for a phase adjustment circuit is in the LED modulation signal before it drives the Positive Edge Pulse Generator 810 and the Negative Edge Pulse Generator 812. The phase adjustment circuit would consist of one or more R-C stages and a comparator which squares up the resultant edge limited waveform back to a full amplitude square edges signal.

As mentioned above, the LED modulation signal is also input to the correlating filter 120. The LED modulation signal acts as a reference signal for timing sampling of the received signal (once filtered and phase-adjusted). More specifically, the LED modulation signal is input to both a positive edge pulse generator 810 and a negative edge pulse generator 812.

The positive edge pulse generator 810 generates a series of short but defined duration pulses (graphically represented by partial pulse train 814a) at the positive edges of the LED modulation signal. Those pulses are input as a clock signal for the first analog-sample-and-hold block 808 to provide peak sample timing. The negative edge pulse generator 812 generates a similar series of short pulses (graphically represented by partial pulse train 814b) at the negative edges of the LED modulation signal. Those pulses are input as a clock signal for the second analog-sample-and-hold block 808 to provide trough sample timing.

The first analog-sample-and-hold block 806 samples the received (pre-conditioned and phase-adjusted) signal from the optical detectors Rx0 to Rxn at the signal peaks, as timed by the pulses from the positive edge pulse generator 810. For each sample, the analog sample value is held until the subsequent sample is taken. The output from the first analog-sample-and-hold block 806 is, thus, a correlated maximum analog signal (graphically illustrated by example signal portion 816a and stippled line received signal reference portion 818a, which matches received signal portion 801c).

Similarly, the second analog-sample-and-hold block 808 samples the received (pre-conditioned and phase-adjusted) signal from the optical detectors Rx0 to Rxn at the signal troughs or valleys, as timed by the pulses from the negative edge pulse generator 812. Again, for each sample, the analog sample value is held until the subsequent sample is taken. The output from the second analog-sample-and-hold block 808 is, thus, a correlated minimum analog signal (graphically illustrated by example signal portion 816b and stippled line received signal reference portion 818b, which matches received signal portion 801c). The second analog-sample-and-hold block 808 may samples an inverted version of the received signal with a similar phase relative to the first analog-sample-and-hold block 806. The outputs of both sample and holds may be mixed and filtered as explained below.

In other embodiments, the first and second sample-and-hold blocks may both sample the non-inverted received signal and each output separately filtered using a resistor and a capacitor. The difference between the filtered signals may be extracted using a differential amplifier.

In the example of FIG. 8, the correlated maximum and correlated minimum signals output from the first and second analog-sample-and-hold blocks 806 and 808 are input to an analog subtractor 820 or combining circuit, which subtracts the correlated minimum from the correlated maximum. The resulting output from the analog subtractor 820 is then input to analog low pass filter-amplifier 822 where it is low pass filtered and amplified to provide a correlated and filtered analog output. The analog low pass filter-amplifier 822 averages this signal over the period while each individual LED/detector light path is being measured. A graphical representation of an example correlated/filtered output signal portion 824 is shown for illustrative purposes. In some embodiments, rather than an analog low pass filter-amplifier, the analog output may be converted to digital signals using one or more Analog to Digital converters and the difference may be digitally calculated.

Example circuitry for the components of FIG. 8 are shown in FIGS. 9 to 12. The example circuitry shown in FIGS. 9 to 12 and the example circuit element parameter values provided below (e.g. resistance, capacitance, etc.) are only by way of example and do not limit the disclosure to those examples.

Figure 9:
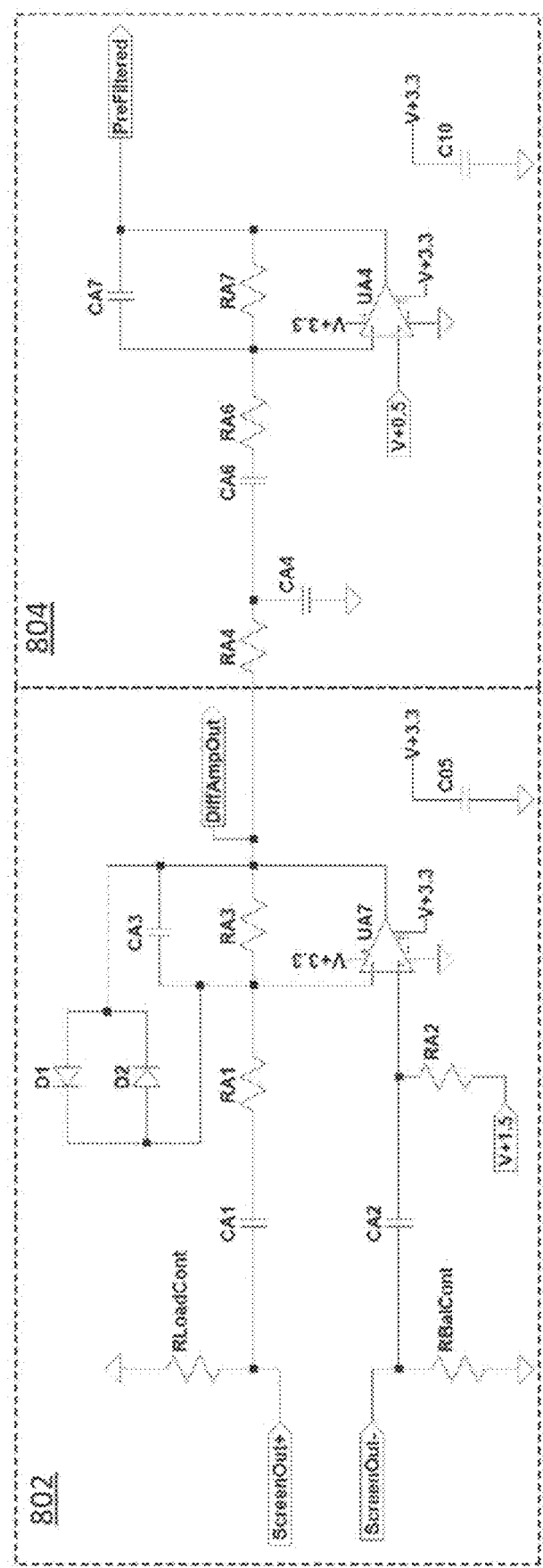
FIG. 9 is a schematic diagram of an example differential input analog band pass filter-amplifier of the correlating filter of FIG. 8 according to an embodiment.

FIG. 9 is a schematic diagram of the filter-amplifier 802 and the fixed phase adjust block 804 of the correlating filter 120 of FIG. 8. The filter-amplifier 802 and the fixed phase adjustment block 804 are used to optimize the signals alignment to the sampling pulses used in the correlating filter 120.

The example filter-amplifier 802 comprises: resistors RLoadCont, RBalCont, RA1, RA2 and RA3; capacitors CA1, CA2, CA3 and C05; diodes D1 and D2; and amplifier UA7 connected as shown. In this example: RLoadCont, RBalCont and RA1 are each 3.3 kOhm; RA2 is 3 kOhm; RAS is 47 kOhm; CA1 and CA2 are each 330 pF; CA3 is 15 pF; C05 is 0.1 μF; Diodes D1 and D2 are BAV99LT1G diodes; and the amplifier UA7 is a LTC6252 amplifier chip. In FIG. 9, "V+3.3" represents connections to a 3.3 V rail, and "V+1.5" represents a 1.5 V input. However, embodiments are not limited to this circuitry or component values.

The example fixed phase adjust block 804 comprises: resistors RA4, RA6 and RA7; capacitors CA4, CA6, CA7 and C10; and amplifier UA4. In this example, RA4 and RA6 are each 3.3 kOhm; RA7 is 47 kOhm; CA4 and CA6 are each 330 pF; CA7 is 15 pF; C10 is 0.1 pF; and the amplifier UA4 is a LTC6252 amplifier chip. However, embodiments are not limited to this circuitry or component values.

3) Collectively, this portion of the correlating filter 120 may be referred to as the front-end receiver. This front-end may reduce or eliminate low modulations significantly above and below the modulation frequency and amplifies the desired signal sufficiently so sampling noise that will be picked up in the sample and hold blocks 806 and 808 (FIG. 8) will not be too significant. The AC filtering may include eliminating steady levels from sunlight etc. The amplifier UA1A is an AC coupled differential receiver that is configured as a band pass amplifier, an RC phase adjustment, another band pass filter. It is to be understood that the particular component values, arrangement and voltage reference values may vary in different embodiments.

All received signals from the optical receivers (e.g. from Rx0 to Rxn in FIGS. 1A and 5A) are time multiplexed into the "ScreenOut+" signal input shown in FIG. 9. Voltage modulations in the ground and voltage rails (3.3V in this example) may arise due to the track resistances in the cable between the screen bezel and the controller. Such modulations may result a on optical detector output signal being modulated even if the light path to that detector is blocked. In this embodiment, the optional input signal "ScreenOut−" is a differential version of the "ScreenOut+" signal that is included to reduce or eliminate such cable induced modulations. More particularly, the "ScreenOut−" signal is output from an impedance balancing circuit to approximate the level of cable induced modulation back to the controller. Since the correlating filter 120 of the controller is differential, it may cancel out the cable induced modulation, thereby leaving the desired signal. In the specific design of FIG. 9, the "ScreenOut" signal may simply pick up the 3.3V voltage rail at an impedance matched to the receivers (e.g. Rx0 to Rxn). In other embodiments, the circuit may be modified to generate a true differential version of the "ScreenOut+" signal using a differential output Op-amp. This example design includes non-linear clipping (by diodes D1 and D2) in the filter-amplifier 802 to absorb rapid transients that are larger than the desired signal.

FIG. 10 is a schematic diagram of the first analog-sample-and-hold block 806 and the second analog-sample-and-hold block 808 of the correlating filter 120 of FIG. 8.

The first sample-and-hold block 806 in this embodiment comprises a first sample-and-hold circuit 1102a, which may be a Maxim™ DS1843 circuit with input pins $V_{CC}$, $V_{INP}$, $V_{INN}$, SEN and GND and output pins $V_{OUTN}$, $V_{OUTP}$ and DEN. The second first sample-and-hold block 808 in this embodiment comprises a second sample-and-hold circuit 1102b, which may also be a Maxim™ DS1843 circuit with the same input and output pins.

The non-inverting sample and hold circuit 1102a samples the received and filtered "Pre filtered signal" at a sample timing at maximums (peaks) of the modulated component of the signal. The inverting sample and hold circuit 1102b samples the same "Pre Filtered" signal at minimums (troughs) of the modulated component of the signal.

For both sample-and-hold circuits 1102a and 1102b, a voltage (e.g. 3.3 V) is input to $V_{CC}$, GND and DEN are connected to ground and $V_{OUTN}$ is not connected. In FIG. 10, the input "Pre filtered signal" is the phase-adjusted received signal output from block 804 in FIG. 8, which is connected to V w of the first sample-and-hold circuit 1102a and $V_{INN}$ of the second sample-and-hold circuit 1102b. The input "PSampleDrive" shown in FIG. 10 is the pulses output from positive edge pulse generator 810 in FIG. 8, which is connected to SEN of the first sample-and-hold circuit 1102a, which is in turn input to control logic 1104a to control the timing of sampling of the Pre Filtered Signal input. The input "NSampleDrive" shown in FIG. 10 is the pulses output from positive edge pulse generator 810 in FIG. 8, which is connected to the pin SEN of the second sample-and-hold circuit 1102b, which is in turn input to control logic 1104b to control the timing of sampling of the Pre Filtered Signal input.

The first analog-sample-and-hold block 806 samples at the correlated signal peaks of the pre-filtered signal when fed into its non-inverting input. The higher the sampled voltage the higher the first analog-sample-and-holds output will be over the whole of the sampling period. The second analog-sample-and-hold block 808 samples at the correlated signal troughs of the pre-filtered signal when fed into its inverting input. The lower the sampled voltage the higher the second analog-sample-and holds output will be over the whole sample period. The output from pin $V_{OUTP}$ of the first sample-and-hold circuit 1102a is the correlated signal peaks (shown as "P Sample" in FIG. 10). The output from pin $V_{OUTP}$ of the second sample-and-hold circuit 1102b is the correlated signal troughs (shown as "N Sample" in FIG. 10). The outputs of both sample and holds are combined together and low pass filtered by each driving through a resistor into a common mixing capacitor. The signal on the common mixing capacitor may be further amplified and low pass filtered before being ND sampled by the microcontroller.

Correlated modulations on the pre-filtered signal when low pass filtered will not cancel each other and result in a positive output.

If there is optical noise modulation that is not correlated, the sampling will be randomly phased and after averaging by the RC filter, the optical noise may be largely cancelled out. It is to be understood that the particular component values, arrangement and voltage reference values may vary in different embodiments. Alternatives include having both sample and holds non-inverting, and later inverting one of their outputs before summing together. Depending on which sample and hold has an inversion in its path and the relative phase of the sampling the correlated output can be either positive or negative signal. The microcontroller can be programmed to handle either polarity. Alternatively, the outputs of each sample and hold could be averaged and A/D sampled by the microcontroller separately and the difference calculated within the microcontroller.

Figure 11:
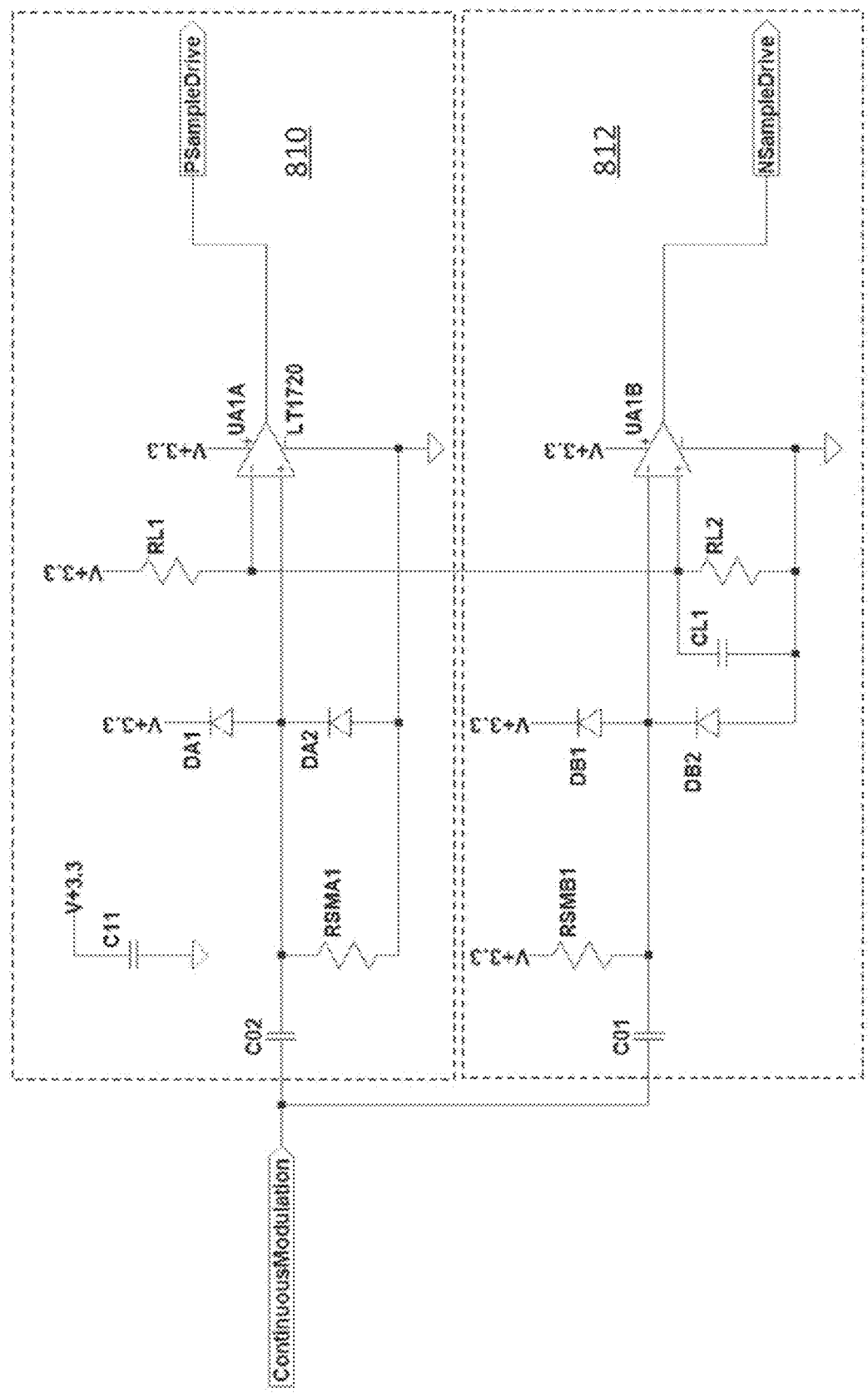
FIG. 11 is a schematic diagram of a positive edge pulse generator and a negative edge pulse generator of the correlating filter of FIG. 8 according to an embodiment.

FIG. 11 is a schematic diagram of the positive edge pulse generator 810 and the negative edge pulse generator 812 of the correlating filter 120 of FIG. 8. The "ContinuousModulation" signal input shown in FIG. 11 is the LED Modulation signal described above.

The positive edge pulse generator 810 of this embodiment comprises: capacitors C02 and C11; resistors RSMA1 and RL1, diodes DA1 and DA2 and amplifier UA1A connected as shown. In FIG. 11, "V+3.3" represents a positive 3.3 voltage rail connection. Capacitors C02 and C11 may be 22 pF and 0.1 µF respectively. Diodes DA1 and DA2 may be BAV99LT1G diodes. Resistor RSMA1 may be 10 kOhm and resistor RL1 may be 3.3 kOhm. The amplifier UA1A may be an LT1720 amplifier chip. However, embodiments are not limited to this circuitry or component values.

The negative edge pulse generator 812 of this embodiment comprises: capacitors C01 and CL1; resistors RSMB1 and RL2, diodes DB1 and D82 and amplifier UA1B connected as shown. In FIG. 11, "V+3.3" represents a positive 3.3 voltage rail connection. Capacitors C01 and CL1 may be 22 pF and 2.2 nF respectively. Diodes DB1 and DB2 may be BAV99LT1G diodes. Resistor RSMB1 may be 10 kOhm and resistor RL2 may be 3.3 kOhm. The amplifier UA1B may be an LT1720 amplifier chip. However, embodiments are not limited to this circuitry or component values.

The positive edge pulse generator 810 and the negative edge pulse generator 812 are used to control the sample and hold blocks 808 and 808 of FIG. 10. It is to be understood that the particular component values, arrangement and voltage reference values may vary in different embodiments.

Figure 12:
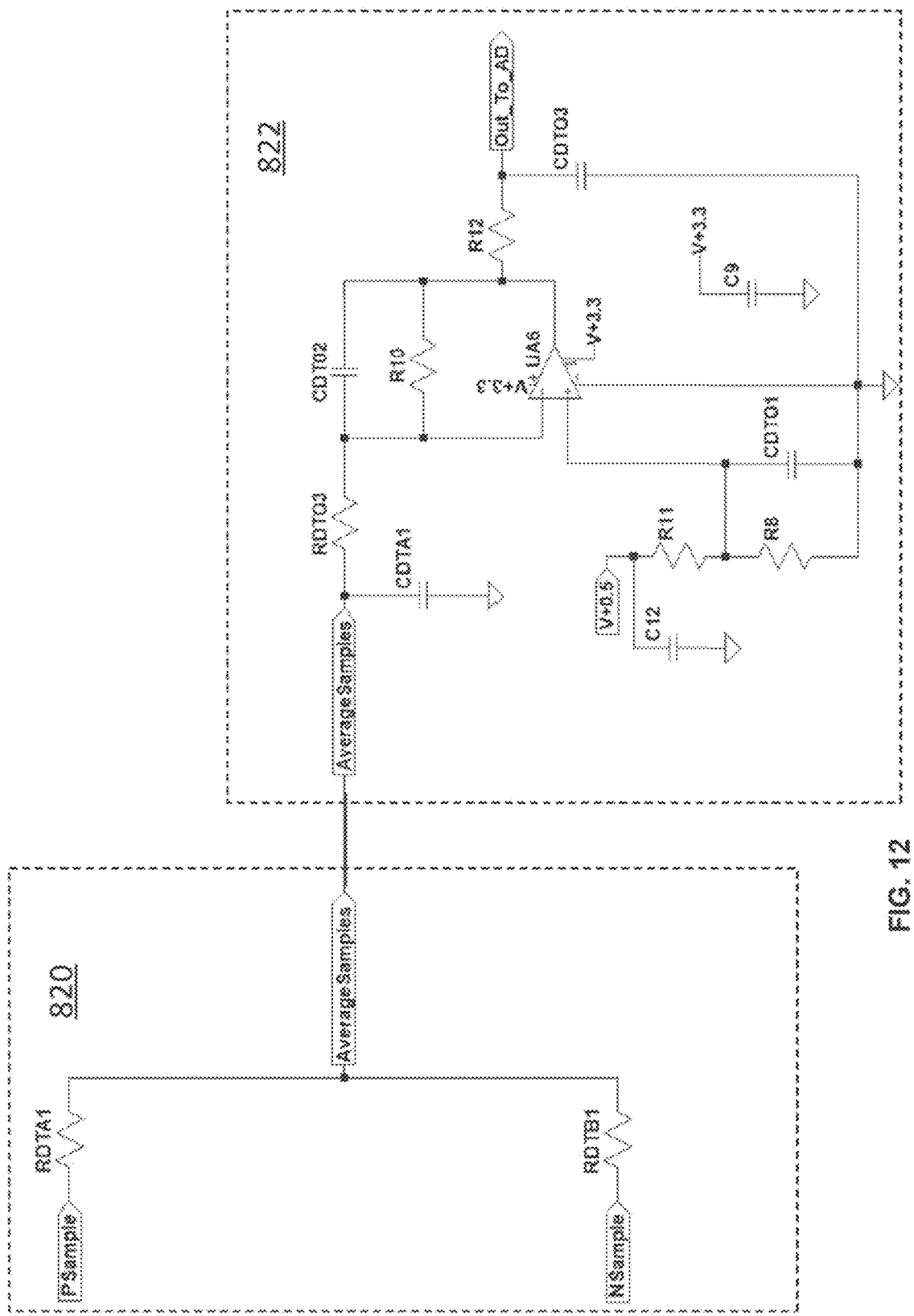
FIG. 12 is a schematic diagram of an analog subtractor circuit and the analog low pass filter-amplifier of the correlating fitter of FIG. 8 according to an embodiment.

FIG. 12 is a schematic diagram of the analog subtractor circuit 820 that averages the two sample and hold outputs, and the analog low pass filter-amplifier 822 of the correlating filter 120 of FIG. 8. The analog subtractor circuit 820 outputs the average of the current positive and negative outputs from the sample and hold blocks 808 and 808 of FIG. 10. The analog low pass filter-amplifier 822 is a DC coupled integrating low pass amplifier with a reference level and gain adjusted so the output swing is suited for the microcontroller 118 (FIGS. 1A and 5A) in this example. The resultant output is the average of the two sample and hold outputs effectively filtering out uncorrelated signal variations. It is to be understood that the particular component values, arrangement and voltage reference values may vary in different embodiments.

Embodiments are not limited to the particular correlating method described above. In some embodiments, the time-multiplexed detector output signal is correlated against the modulation signal by converting the detector output signal to a digital signal with very high (>=16 bit) resolution A/D sampling that is synchronous with each modulation chip and at a phase where any correlated content may have a maximum chip correlating amplitude. If the LED modulation chip is high then the sampled signal may not be modified. If the LED modulation chip is low then the sampled signal may be multiplied by −1. The results may be summed over the active light path period. This correlating method may, for example, be performed by a microcontroller.

In other embodiments, the time-multiplexed detector output signal may be correlated against the modulated signal by converting the time-multiplexed detector output signal to a digital signal by a threshold-based detector. The converted signal may then be multiplied with the original modulating signal by an Exclusive-Or (XOR) gate.

In still other embodiments, the time-multiplexed detector output may be correlated against a simple frequency type modulation by using a method similar to typical amplitude modulated heterodyne radio receivers. The time-multiplexed detector output may, for example, be multiplied, using a mixer, with a higher frequency sinewave that is phase locked to the modulation frequency, creating frequency content at a higher Intermediate Frequency (IF) at the sum of the two frequencies that is aligned with ceramic or crystal filters. The ceramic of crystal filters may be used to eliminate almost all other frequency content. The filtered IF may be mixed again with the same higher frequency sinewave to create a highly filtered version of the original detector output signal, which then can simply be rectified and low pass filtered to create the desired correlated output signal. Other correlation methods are also possible.

In some embodiments, the incoming light signal may be frequency filtered and amplified (e.g. using filter-amplifier 802) before being correlated against the modulating signal using any of the previous correlation methods.

Figure 13:
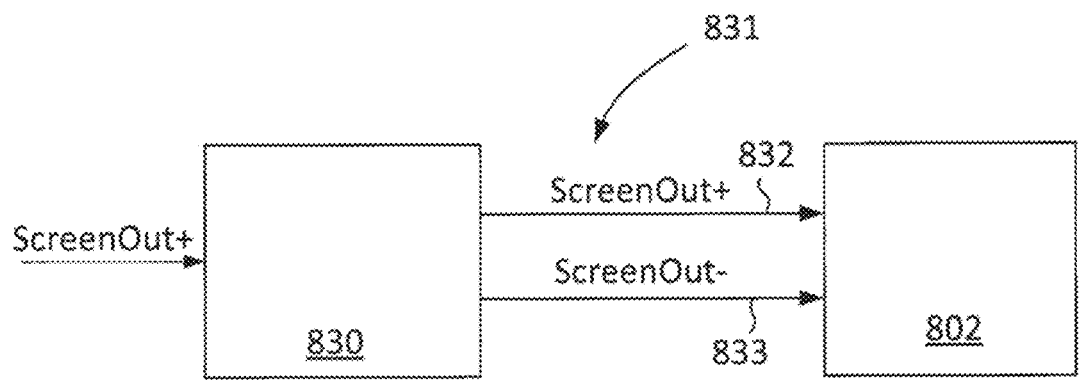
FIG. 13 is a block diagram of a pseudo-differential impedance balancing circuit and a filter-amplifier connected by an interconnect, according to some embodiments.

FIG. 13 is a block diagram showing the filter-amplifier 802 and optional pseudo-balancing circuit 830, which is connected to the filter-amplifier 802 by interconnect 831. In this example, the pseudo-balancing circuit 830 may be located between the receivers Rx0 to Rxn and correlating filter 120 in FIG. 1A. The interconnect 831 in this example may be a differentially tracked interconnect cable comprising tracks 832 and 833 (e.g. wires), and may form part of the interconnect 108 in FIG. 1A (i.e. the connection between receivers Rx0 to Rxn and the correlating filter 120). In a preferred embodiment, the "ScreenOut+" signal from the receivers Rx0 to Rxn is input to the pseudo-balancing circuit 830, which generates the "ScreenOut−" signal from the "ScreenOut+" signal. Both the "ScreenOut+" and "ScreenOut−" signals are output from the pseudo-balancing circuit 830 to tracks 832 and 833 respectively. The "ScreenOut+" and "ScreenOut−" signals are carried by the interconnect 831 and input to the filter-amplifier 802.

The "ScreenOut+" signal received at the pseudo-balancing circuit 830 may include unwanted power fluctuations. The "ScreenOut+" and "ScreenOut−" signals may also receive unwanted external RF interference in the interconnect 831. The pseudo-balancing circuit 830 may be used to cancel power modulation related and interconnect RF pickup noise on the signal output from the optical detectors. For example, the pseudo balancing circuit 830 may present a similar impedance as the received "ScreenOut+" signal to the interconnect 831. Thus, both tracks 832 and 833 of the differential pair in the interconnect 831 may pick up RF noise at similar levels allowing the filter-amplifier 802 (which acts as a differential receiver) to largely cancel the noise away leaving just the desired signals from the receiver. If both wires 832 and 833 carrying the "ScreenOut+" signal and "ScreenOut−" signals have similar impedance to ground at both ends, any RF noise pickup may be identical or nearly identical on both wires 832 and 833. The controller's filter-amplifier 802 is differential, so only the difference between the "ScreenOut+" and "ScreenOut−" signals is passed on, with the RF noise on the pair of wires 832 and 833 being substantially or entirely cancelled. Further by having the pseudo balancing circuit 830 have similar bezel power rail couplings as the receiver circuits, the effects of bezel power rail fluctuations on the received "ScreenOut+" signal can also be largely eliminated.

The pseudo differential impedance balancing circuit 830 may be located in the bezel of a touch sensor (e.g. touch sensor 104 in FIG. 1) and the filter-amplifier 802 may be within the controller (e.g. controller 102 in FIG. 1).

Figure 14A:
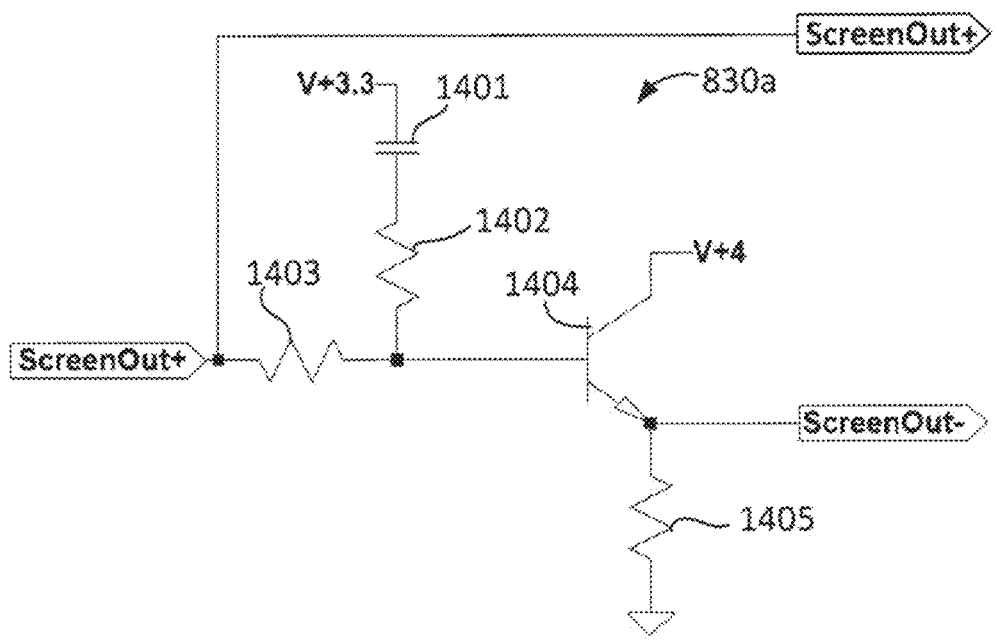
FIGS. 14A to 14C are schematic diagrams of example pseudo impedance balancing circuits according to some embodiments.
Figure 14B:
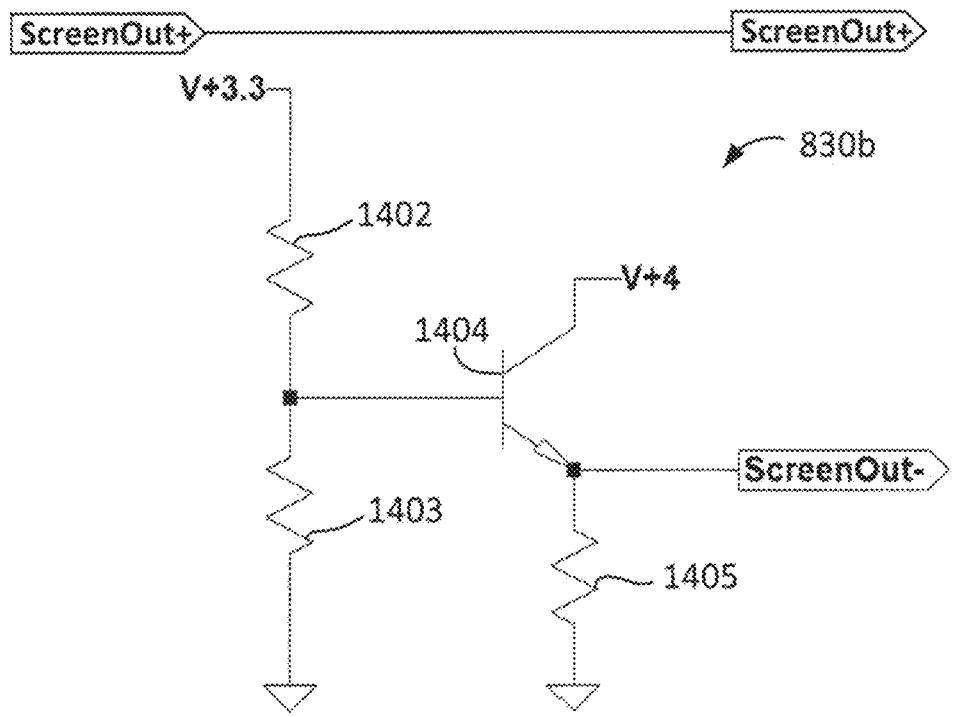
Figure 14C:
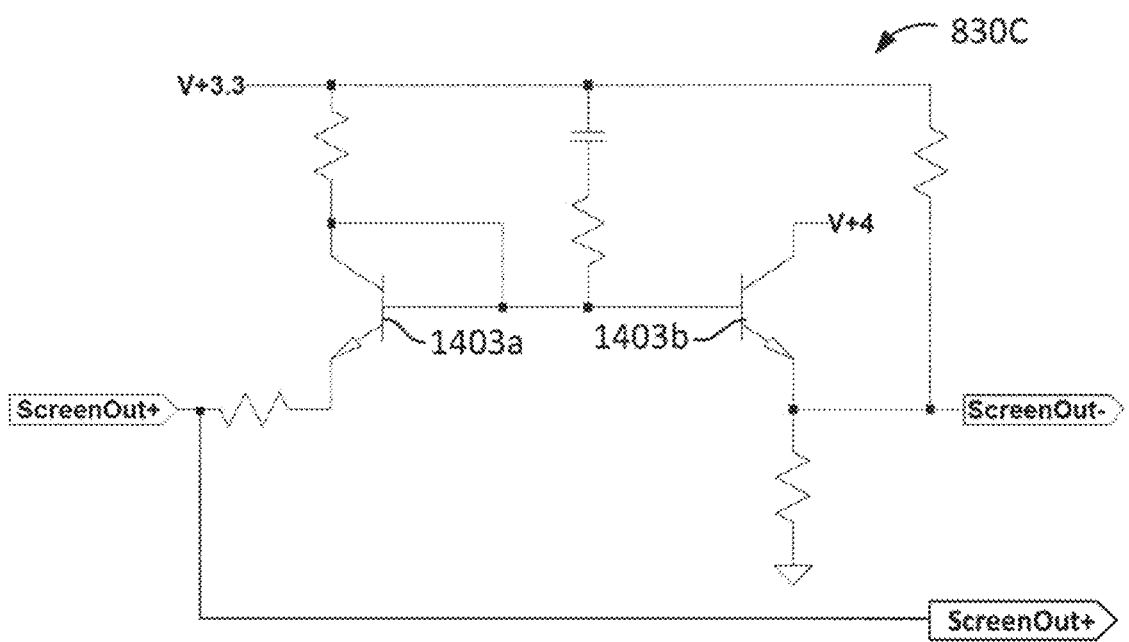

Examples of pseudo differential impedance balancing circuits that may be used for the pseudo differential impedance balancing circuit 830 in FIG. 13 are shown in FIGS. 14A to 14C. FIG. 14A is a schematic diagram of a first example pseudo differential impedance balancing circuit 830a that may be used as the differential impedance balancing circuit 830 of FIG. 13. The pseudo balancing circuit 830a in this example has a detector output that is strongly related to the 3.3V supply rail voltage. The pseudo balancing circuit 830a may be used to reduce both power supply noise generated within the bezel and interconnection cables as well as reduce RF noise picked up by interconnection cables.

The pseudo balancing circuit 830a comprises a capacitor 1401, first and second resistors 1402 and 1403, an NPN transistor 1404 and a load resistor 1405. The NPN transistor 1404 may be a SFU520Y transistor package. The second resistor 1403 may be 22 kOhm. The capacitor 1401 may be 0.1 µF. The load resistor 1405 may be 3.3 kOhm. However, embodiments are not limited to this circuitry or component values.

The transistors used in these circuits may vary and may match the transistor(s) used in the output of the optical receiver circuit as are shown in FIGS. 3 and 4A to 4D.

The example pseudo balancing circuit 830b in FIG. 14B includes similar resistors 1402 and 1403 and NPN transistor 1404 but omits the capacitor 1401. The second resistor 1403 may be 47 kOhm, and the load resistor 1405 may be 3.3 kOhm. However, embodiments are not limited to this circuitry or component values. In the example of FIG. 14B, the "ScreenOut-" signal does not track the "ScreenOut+" signal. Rather, the pseudo balancing circuit 830b has a fixed bias to the transistor 1404 as is used in the receivers.

The output impedance for this pseudo balancing circuit 830b depends somewhat on its transistor output current, which may be proportional to the circuit's output voltage. The transistor 1404 output voltages can vary considerably with ambient light conditions. This pseudo balancing circuit 830b has a fixed transistor output voltage that may be set at the optical receiver's nominal level. The accuracy of its impedance matching to the optical receivers may depend on ambient light conditions, as will how closely it injects 3.3V power supply noise relative to the optical receiver circuits.

FIG. 14C is a schematic diagram of another example alternative pseudo balancing circuit 830c. The example pseudo balancing circuit 830c in FIG. 14C includes first and second NPN transistors 1403a and 1403b. This pseudo balancing circuit 830c may vary the balancing circuit's transistor output voltage to align to the average receiver transistor bias level. It may therefore have an almost identical impedance characteristic to the optical receiver circuits over a wide range of ambient lighting conditions and will injects 3.3V power supply noise almost identically to the optical receiver circuits. The pseudo balancing circuit 830c of FIG. 14C may cancel out base/emitter junction offset error.

Typically, orthogonal optical light paths are used for locating the position of a touch event. For a rectangular screen, the orthogonal paths may typically be vertical and horizontal. See, for example, the example arrangements of LED and detector pairs in FIGS. 1D and 5D. For ease of description, the vertical position of a finger (or other object in an optical light path) will be referred to as the "Y position" and the horizontal position will be referred to as the "X position".

In some "dual touch" scenarios (i.e. two fingers concurrently touching the touch sensor area), two fingers may have the same, or very close to the same X position or Y position. In such cases, it may be difficult to determine or maintain knowledge which detected X and Y values are associated with which finger when only using the two beam angles of the orthogonal light paths. If incorrect association occurs of the detected X and Y values you can get undesirable effects such as if the pair of fingers rotate, a clockwise rotation may be sensed when, in fact, the rotation was counter-clockwise or vice versa.

A similar difficulty may arise if two fingers are placed on the touch sensor faster than the scan rate can resolve. The term "scan rate" here refers to the rate at which all of the corresponding pairs of LEDs/optical detectors are sequentially activated such that the entire touch sensor is scanned for touch events. If two X positions (X1, X2) are detected and two Y positions (Y1, Y2) are detected, for example, it may not be known whether the X1 is associated with Y1 or with Y2 and vice versa for X2.

According to another aspect of the disclosure, a relative timing shift between active LEDs and detectors may be implemented to modify the angles of the light paths. Such light paths will be referred to as "angled" light paths herein. Such angled light path angle(s) may assist to resolve ambiguities or uncertainties when two or more fingers (or other objects) are placed on the touch sensor simultaneously or are aligned either vertically or horizontally. The angled light paths may be included as part of the scanning process. For example, the controller may cause the regular orthogonal light paths to be scanned first, followed by angled light paths.

The light path between the active LED and the active detector may be angled relative to either the X direction, the Y direction or both. This angle may cause an associated change in where a finger or other object blocks the optical light path, depending on how far away the finger is from the LED. Thus, finger positions or movement that are ambiguous for the orthogonal path sensing may be more certain for the angled path sensing, or vice versa. This approach may be particularly beneficial for resolving the position of two fingers emerging out an overlap in either the X or Y direction.

Due to the spread of the light from the LED, it may not be necessary to actually change the physical alignment of the LEDs to create the angled light paths. Rather, each LED may output light that fans outward sufficiently to be received by one or more detectors that are offset from the detector positioned and aligned directly opposite to the LED. For example, in FIG. 1B, LED1 may output light that fans out wide enough to be partially receivable by Rx1 and also partially receivable by Rx0 and Rx2. Thus, in some embodiments, to create an angled optical light path, only Rx0 or Rx2 are activated when LED1 is active. Such offset LED/Rx activation may be accomplished by an adjustment of the relative timing of the sync pulses that control the timing of one sides shift register versus the other side.

Figure 15:
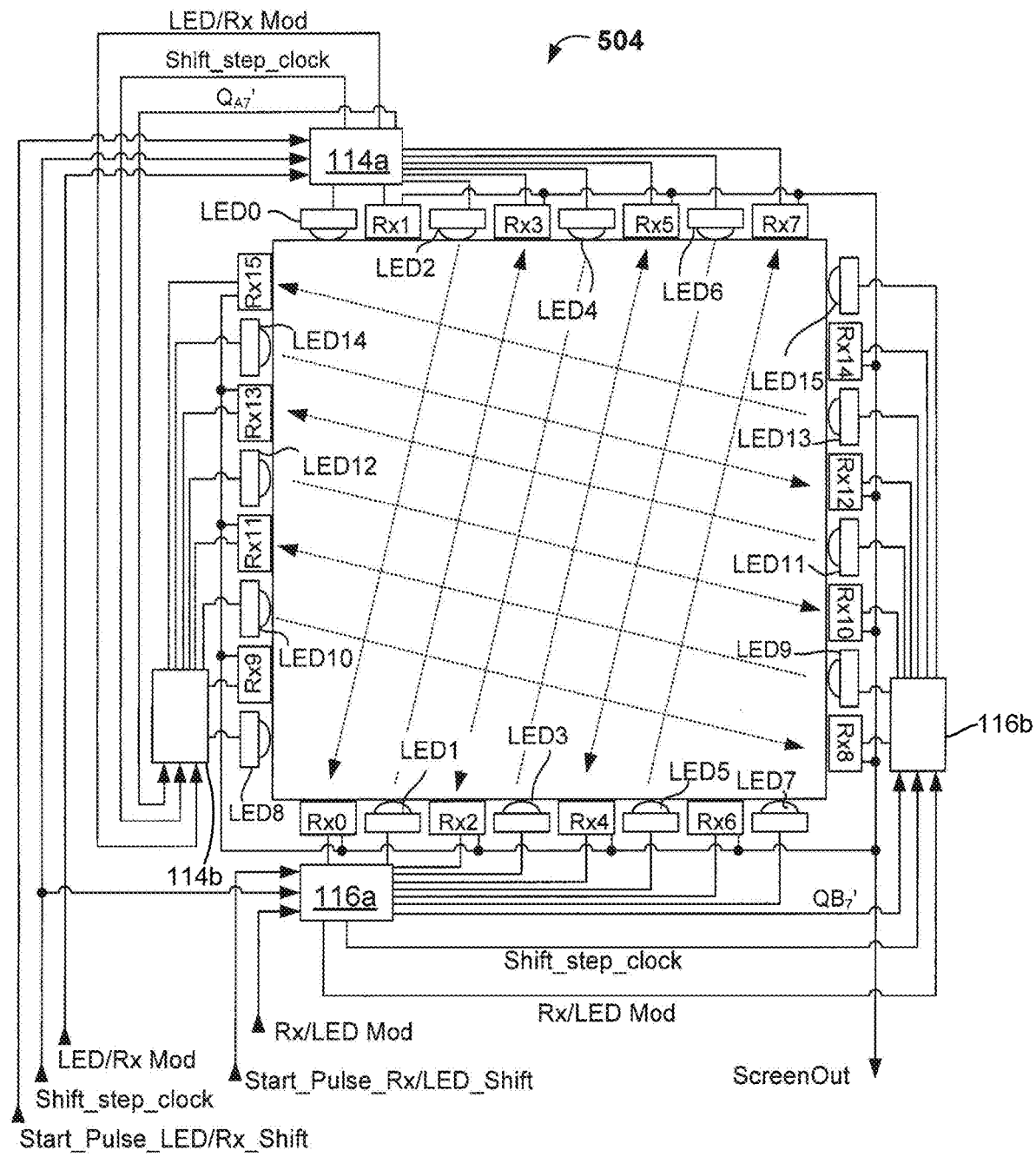
FIG. 15 is a diagram of the example touch sensor from FIG. 5D, but illustrating a possible set of angled light paths between some of the LEDs.

FIG. 15 is a diagram of the example touch sensor 504 from FIG. 5D, but illustrating one possible set of angled paths (represented by stippled-line arrows) between some of the LEDs and optical detectors offset to those LEDs. The stippled-line arrows representing the paths are not meant to illustrate the total light emitted from the corresponding LEDs, but rather the path between the offset LED/detector pairs. In this example, the LEDs do not actually rotate or move. Rather, the light emanating from each LED has a spreading angle that allows a portion of light to be incident on the corresponding opposite optical receiver as well as at least one optical receiver adjacent to the corresponding opposite optical receiver. Thus, the angled paths are created simply by activating the desired LED and optical receiver during a time period, rather than through mechanical movement of the LEDs. The addressing circuitry (shift registers 114a/114b and 116a/116b in this example) may have a first mode, where the regular straight light paths are used (as in FIGS. 1D and 5D) and a second mode for measuring angled paths. Multiple different angles may be measured.

In this example, to establish the angled paths, the data bit shifted through the shift registers 114a and 114b is offset from the corresponding data bit shifted through the shift registers 116a and 116b such that the following LED/Rx pairs are active at the same time to create an angled light path therebetween: LED2 and Rx0; LED1 and Rx3; LED4 and Rx2; LED3 and Rx5; LED0 and Rx4; LED5 and Rx7; LED10 and Rx8; LED9 and Rx11; LED12 and Rx10; LED11 and Rx13; LED14 and Rx12; LED13 and Rx15.

Figure 16:
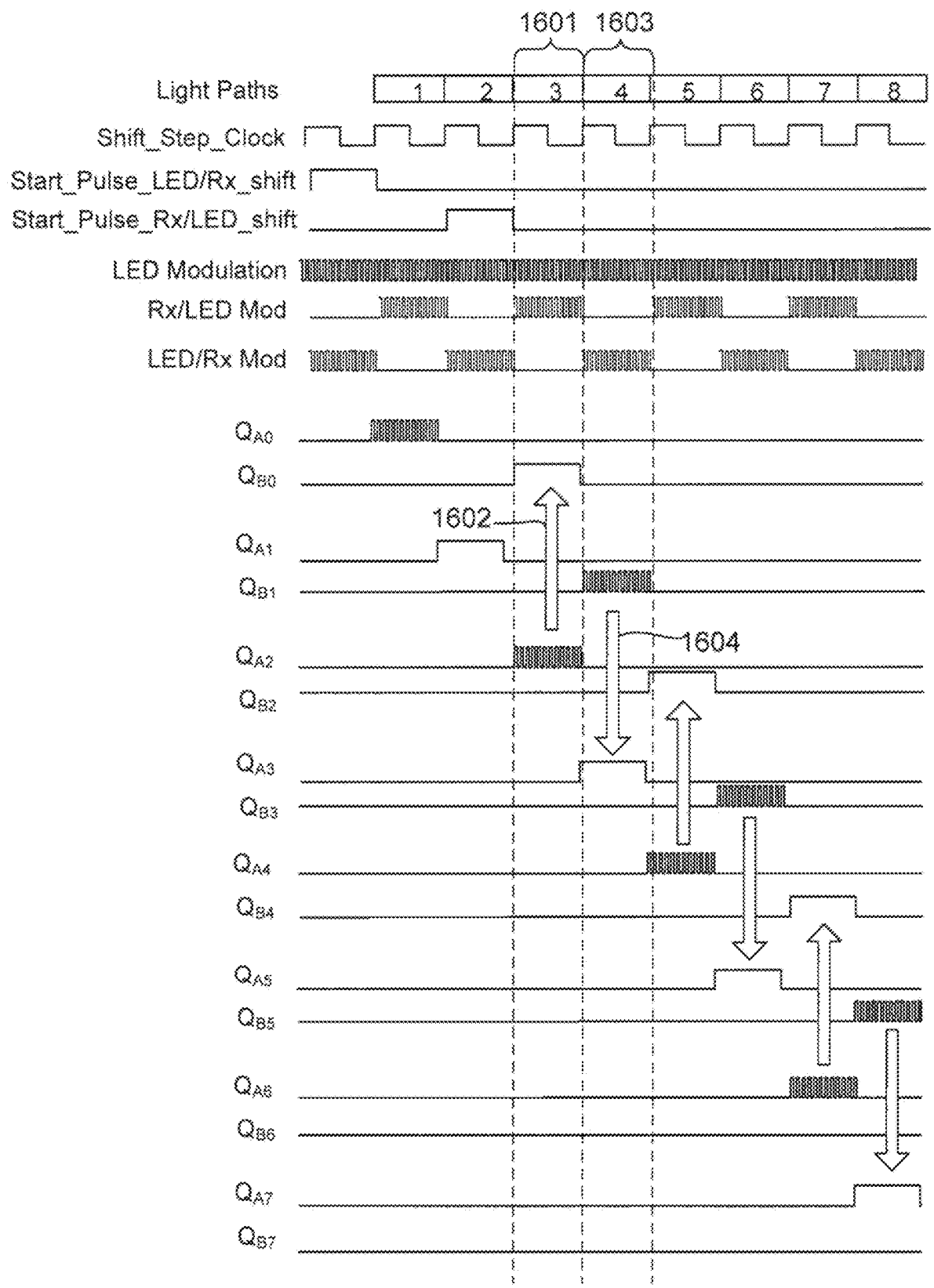
FIG. 16 is a signal diagram showing example input and output signals within the system of FIG. 5A, but for the angled light paths of FIG. 15.

FIG. 16 illustrates the states of output signals "Start_Pulse_LED/RX_Shift"; "Shift_Step_Clock"; "LED modulation"; "Start_Pulse_RX/LED_Shift"; "LED/Rx Mod"; and "Rx/LED Mod" over an 8 step cycle for the touch sensor system 500 of FIG. 5A to achieve the angled light paths shown in FIG. 15. As shown, the Shift_Step_Clock; LED modulation; "Start_Pulse_LED/RX_Shift"; "LED/Rx Mod"; and "Rx/LED Mod" signals stay the same as shown in FIG. 6. However, the "Start_Pulse_RX/LED_Shift" signal, which initiates the sequential activation of the optical detectors Rx0 to Rxn is offset by two shift clock cycles compared to the "Start_Pulse_LED/RX_Shift" signal. Thus, in the clock cycle 1601 when LED2 is active (due to shift register output QA2 being modulated), Rx0 is active (due to shift register output QB0 being high), thereby providing the light path represented by arrow 1602 shown in FIGS. 15 and 16. In the next clock cycle 1603, shift register output QA3 is high, and shift register output QB1 is modulated, thus activating detector Rx3 and LED1 and providing light path represented by arrow 1604 shown in FIGS. 15 and 16, and so on. A similar offset signaling pattern may be used to drive the second set of LEDs and detectors that are connected to the second set of shift registers 114b and 116b and aligned on sides of the touch sensor.

The example angled light paths described above deviate from the orthogonal (vertical/horizontal) paths in a first direction/angle. An additional set of angled paths that deviate in the reverse direction/angle may be implemented by reversing the offset between the "Start_Pulse_LED/RX_Shift" and "Start_Pulse_RX/LED_Shift" signals. Deviating in both directions may further improve resolution detection. Embodiments are not limited to the particular angled paths described above. For example, greater deviations (path angles) may be used. As one example, rather than offsetting the "Start_Pulse_LED/RX_Shift" and "Start_Pulse_RX/LED_Shift" signals by two clock cycles, other offsets in positive or negative multiples of 2 may be used. However, shifting angles are deliberately limited so the LED emission angle can be kept narrow minimizing wasted light power.

When implemented for a screen where LEDs and detectors are interleaved, which share a common alternating modulation pattern, drive steps may be made in ±multiples of 2. If an addressed drive structure was used similar shifts can be done with a couple of exclusive or gates on the second LSB of the address on one side.

The angled sensing methods described may facilitate sensing touch events with two, three or possibly more objects.

Figure 17:
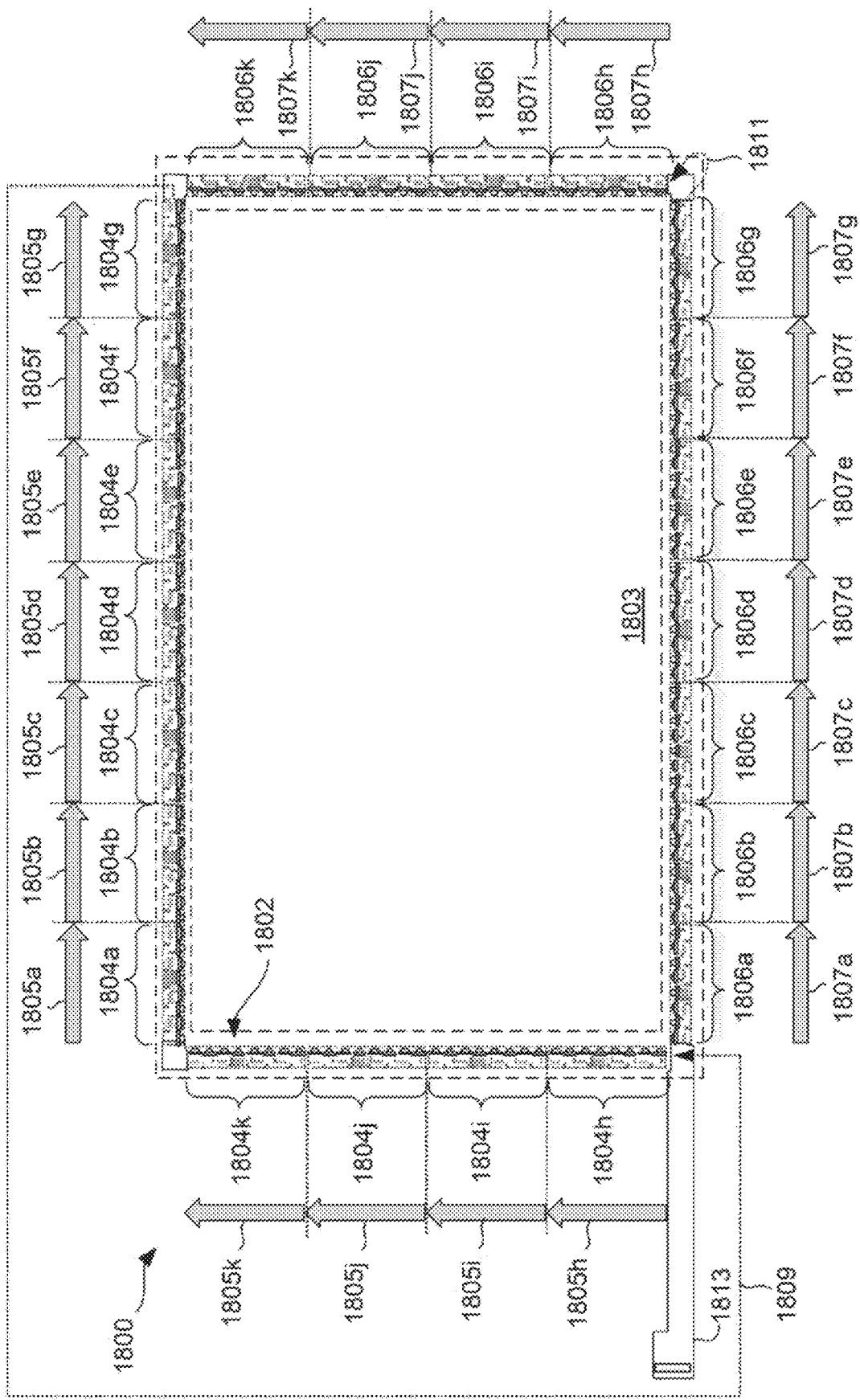
FIG. 17 is a diagram of a an example layout of an IR touch sensor according to some embodiments.

FIG. 17 is a diagram of a possible layout of IR touch sensor circuitry 1800 around the periphery 1802 of a display 1803 according to some embodiments. The circuitry includes a first plurality of circuitry sections 1804a to 1804k and a second plurality of circuitry sections 1806a to 1806k distributed around the periphery 1802.

The first plurality of circuitry sections 1804a to 1804k each include a respective 8-bit shift register with outputs connected to a total of eight interleaved LEDs and optical detectors, similar to the shift register 114a, LED0, Rx1, LED2, Rx3, LED4, Rx5, LED8 and Rx7 in FIG. 5D. The first plurality of circuitry sections 1804a to 1804k are connected in a sequential, daisy chained fashion and extend about the top and left side of the display 1803. Arrows 1805a to 1805k adjacent to the circuitry sections 1804a to 1804k are included to illustrate the direction of sequential activation of the LEDs and detectors for each section. An additional stippled line arrow 1809 is shown to illustrate that the final section 1804g along the top is daisy-chained to the first section 1804h along the left side (e.g. by a wire or other electrical connection which is not specifically shown).

The second plurality of circuitry sections 1806a to 1806k each include a respective 8-bit shift register with outputs connected to a total of eight interleaved LEDs and optical detectors, similar to the shift register 114b, Rx0, LED1, Rx2, LED3, Rx4, LED5, Rx6 and LED7 in FIG. 5D, with the placement of the LEDs and detectors reversed with respect to the first plurality of circuitry sections 1804a to 1804k. The second plurality of circuitry sections 1806a to 1806k are connected in a sequential, daisy chained fashion and extend about the bottom and right side of the display 1803. Arrows 1807a to 1807k adjacent to the circuitry sections 1806a to 1806k are included to illustrate the direction of sequential activation of the LEDs and detectors for each section. An additional arrow 1811 is shown to illustrate the daisy chain connection of the final section 1806g along the bottom to the first section 1806h along the right side (e.g. by a wire or other electrical connection which is not specifically shown).

Each of the second plurality of circuitry sections 1806a to 1806k is aligned with a corresponding one of the first plurality of circuitry sections 1804a to 1804k, such that each optical detector is aligned (vertically or horizontally) with a corresponding one of the LEDs, similar to the example shown in FIG. 5D.

FIG. 17 also shows an example flex interconnect 1813 that may be used to connect the touch sensor circuitry to a controller (such as controller 502 in FIG. 5A).

FIG. 18 is an enlarged view of the example layout of one section 1804a of the first plurality of circuitry sections 1804a to 1804k in FIG. 17. The remaining circuitry sections 1804a to 1804k of the first plurality have a similar structure (with the exception that the final circuitry section 1804k is not daisy-chained to any subsequent section). Input and output connections are not shown in FIG. 18, but may be metal connections on a printed circuit board, wires, or any other suitable electrical connection. The section 1804a includes a shift register 1808 connected to four LEDs 1810a to 1810d and four optical detectors 1812a to 1812d in an interleaved manner (similar to FIG. 5A, for example).

Each optical detector 1812a to 1812d comprises a respective photo-diode (1813a to 1813d) and a respective transistor chip (1814a to 1814d). The transistor chips 1814a to 1814d may include two NPN transistors (e.g. Q1 and Q2 in FIG. 3). Each pair of photo-diode (1813a to 1813d) and transistor chip (1814a to 1814d) may, for example, be connected to form the optical detector circuit 300 shown in FIG. 3.

The shift register 1808 is also connected to the next circuitry section 1804b (FIG. 17) in the daisy-chain sequence similar to FIG. 5A. In this specific example, the "LED/RX Mod" and "Shift_Step_Clock" signals and data output (e.g. output QA7' in FIG. 15) signals are connected to the corresponding inputs of the shift register (not visible in FIG. 18) of the next circuitry section 1804b in the sequence.

FIG. 19 is an enlarged view of the example layout of one section 1806a of the second plurality of circuitry sections 1806a to 1806k in FIG. 17. The remaining circuitry sections 1806a to 1806k of the second plurality have a similar structure (with the exception that the final circuitry section 1806k is not daisy-chained to any subsequent section). Input and output connections are not shown in FIG. 19, but may be metal connections on a printed circuit board, wires, or any other suitable electrical connection. The section 1806a includes a shift register 1815 connected to four LEDS 1816a to 1818d and four optical detectors 1818a to 1818d in an interleaved manner (similar to FIG. 18, but in reversed alternating sequence). The optical detectors 1818a to 1818d are each similar to the detectors 1812a to 1812d in FIG. 18 (with a respective photo diode and transistor chip).

The shift register 1815 is also connected to the next circuitry section 1806b (FIG. 17) in the daisy-chain sequence similar to FIG. 5A. In this specific example, the "LED/RX Mod" and "Shift_Step_Clock" signals and data output (e.g. output QA7' in FIG. 15) signals are connected to the corresponding inputs of the shift register (not visible in FIG. 19) of the next circuitry section 1806b in the sequence.

Together, FIGS. 18 and 19 together show how a section 1804a of the first plurality of circuit sections 1804a to 1804k is aligned (but reversed) with a corresponding section 1806a of the second plurality of sections 1806a to 1806k. Other pairs of corresponding sections are also so aligned.

Figure 20:
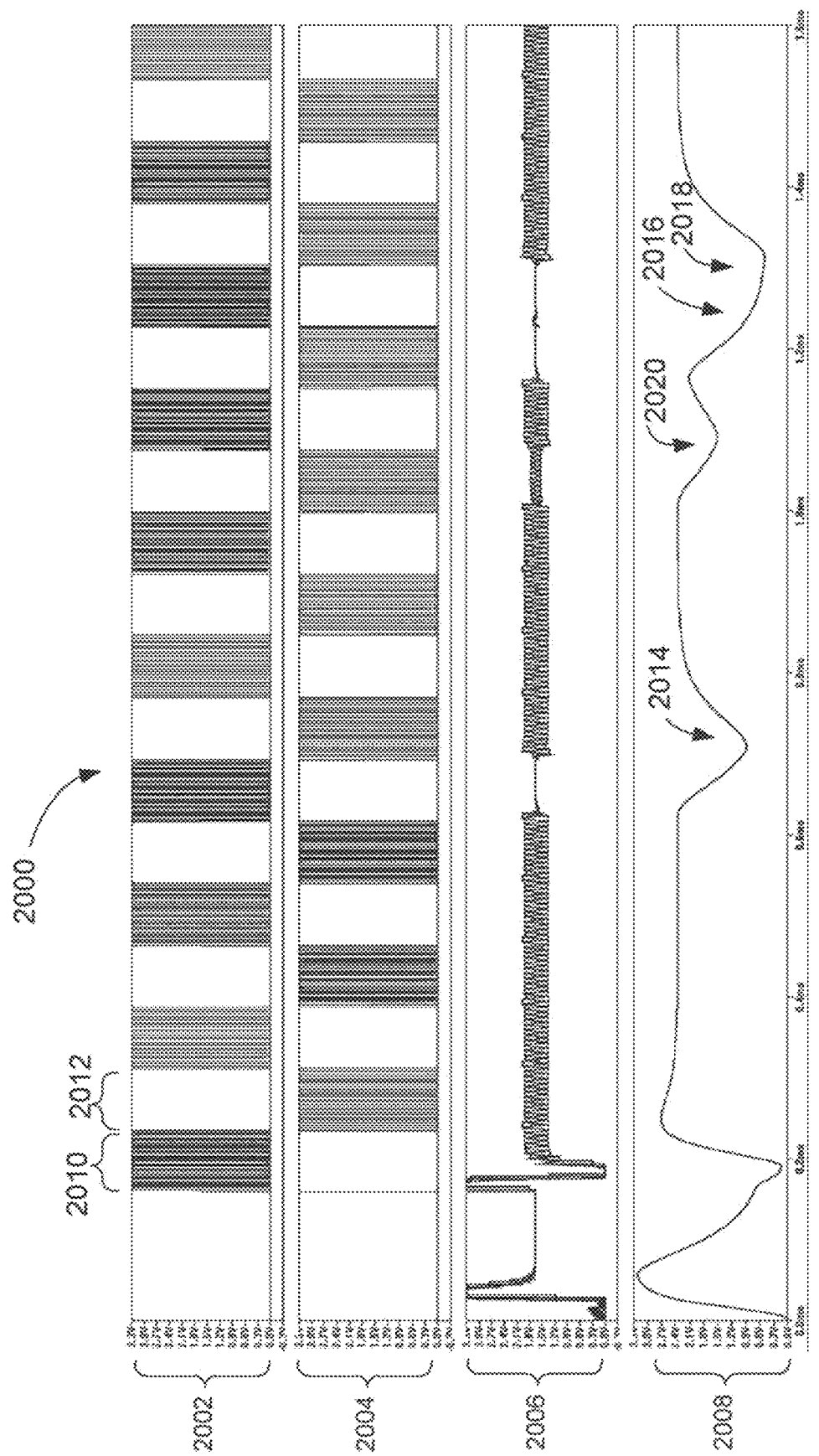
FIG. 20 shows simulation results for a touch sensor system.

FIG. 20 shows simulation results 2000 for a touch sensor system having an interleaved LED/detector design and pattern correlating filter, similar to the example system 500 shown in FIG. 5A. The simulation shows the effect of four of nineteen light paths being partially blocked to differing extents, while the touch sensor is exposed to minimal light noise. This results shows the simulated effect of a few fingers fully and half blocking some of the simulated optical light paths. For the simulation, the following parameters are used: optical drive=3.3V; 42 ohm resistor regulates the LED on current to approximately to 19 mA. In this example, 100 mV, 10 MHz noise has been added to the Rx signal in cable. No optical noise or RF cable noise has been added for the simulation results in this example.

In FIG. 20, graph 2002 shows a simulated "LED/Rx Mod" signal. Graph 2004 shows a simulated "Rx/LED Mod" signal. As shown in graph 2002, the "LED/Rx Mod" signal comprises a series of alternating LED modulation periods 2010 and receiver activation periods 2012. The "Rx/Led Mod" signal shown in graph 2004 is similar, but with a reversed sequence (i.e., when the "LED/Rx Mod" signal is modulating to drive an LED, the "Rx/LED Mod" signal is constant for activation of the corresponding detector over the same time period, and vice versa). The "LED/Rx Mod" and "Rx/LED Mod" signals include approximately 24 chips per LED active period.

Graph 2006 shows the correlated sampling of a filtered analog signal in the pattern correlating filter (e.g. correlating filter 120 in FIGS. 5A and 8) difference prior to averaging and final amplification. More specifically, graph 2008 shows simulated sampling similar to the sampling taken at Analog Sample/Hold blocks 806 and 808 of correlating filter 120 in FIG. 8.

Graph 2008 shows the simulated output from the pattern correlating filter (e.g. correlating filter 120 in FIGS. 5A and 8). Simulated full block events by object(s) such as one or more fingers results in dips 2014, 2016 and 2018. A simulated half-block event is shown by dip 2020.

As shown in FIG. 20, the simulated system has an initial circuit start-up time ($T_{start-up}$) before the "LED/Rx Mod" and "Rx/LED Mod" signals begin their respective normal operating output sequences. This start-up time may only occur on initial start-up of the circuit.

Figure 21:
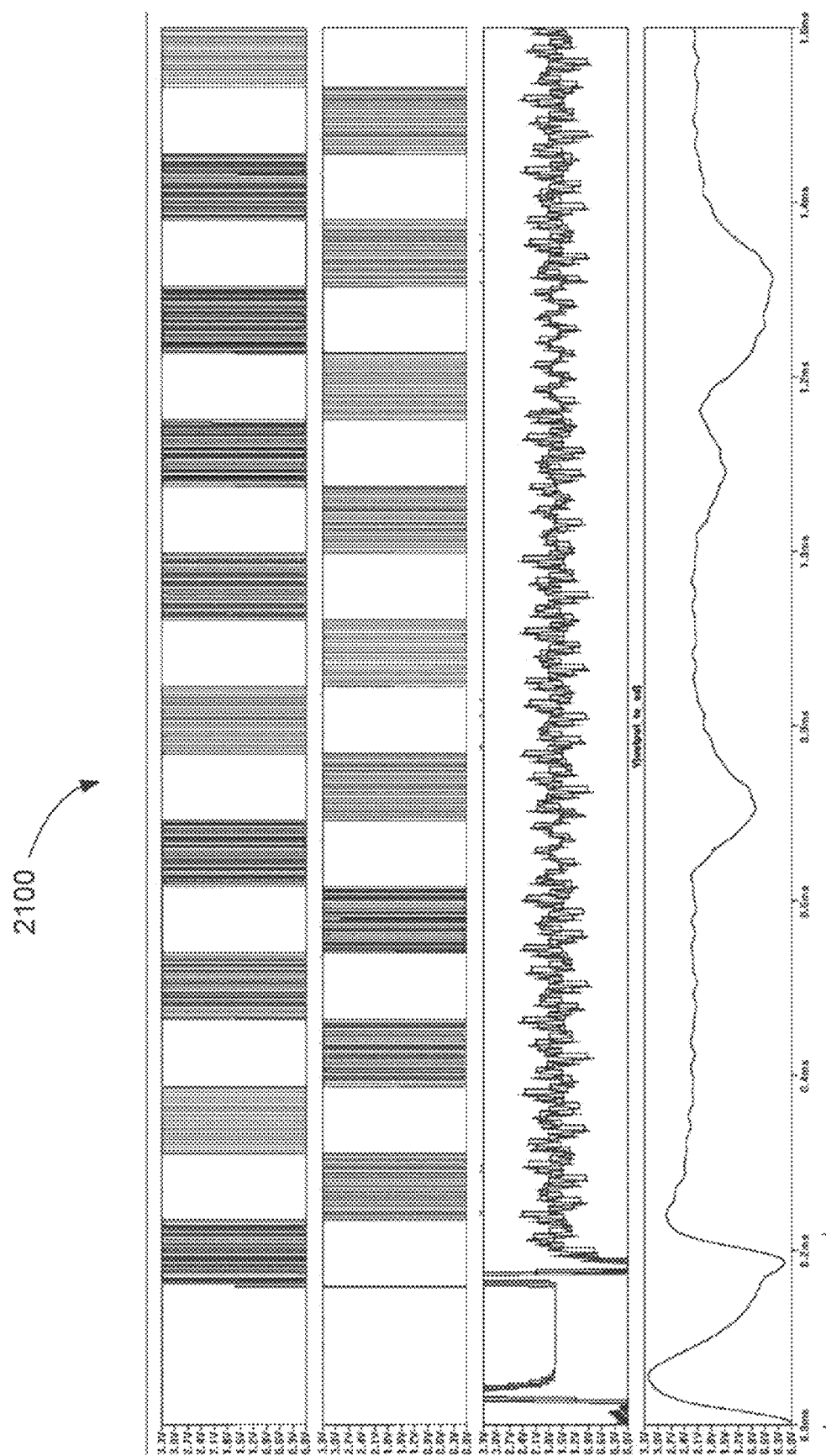
FIG. 21 shows further simulation results for the same touch sensor system as simulated in FIG. 20, but when exposed to strong and varying levels of light noise.

FIG. 21 shows simulation results 2100 for the touch sensor system simulated in FIG. 20, but with high levels of optical noise (e.g. sunlight) and RF noise (e.g. from 120 Hz incandescent lamps), as well as IR controller modulated IR light noise added. More particularly, the optical noise added is as follows: DC @ 100*LED; 120 Hz @ 30*LED; and 40 kHz pulses @ 0.3*LED intensity.

Figure 22:
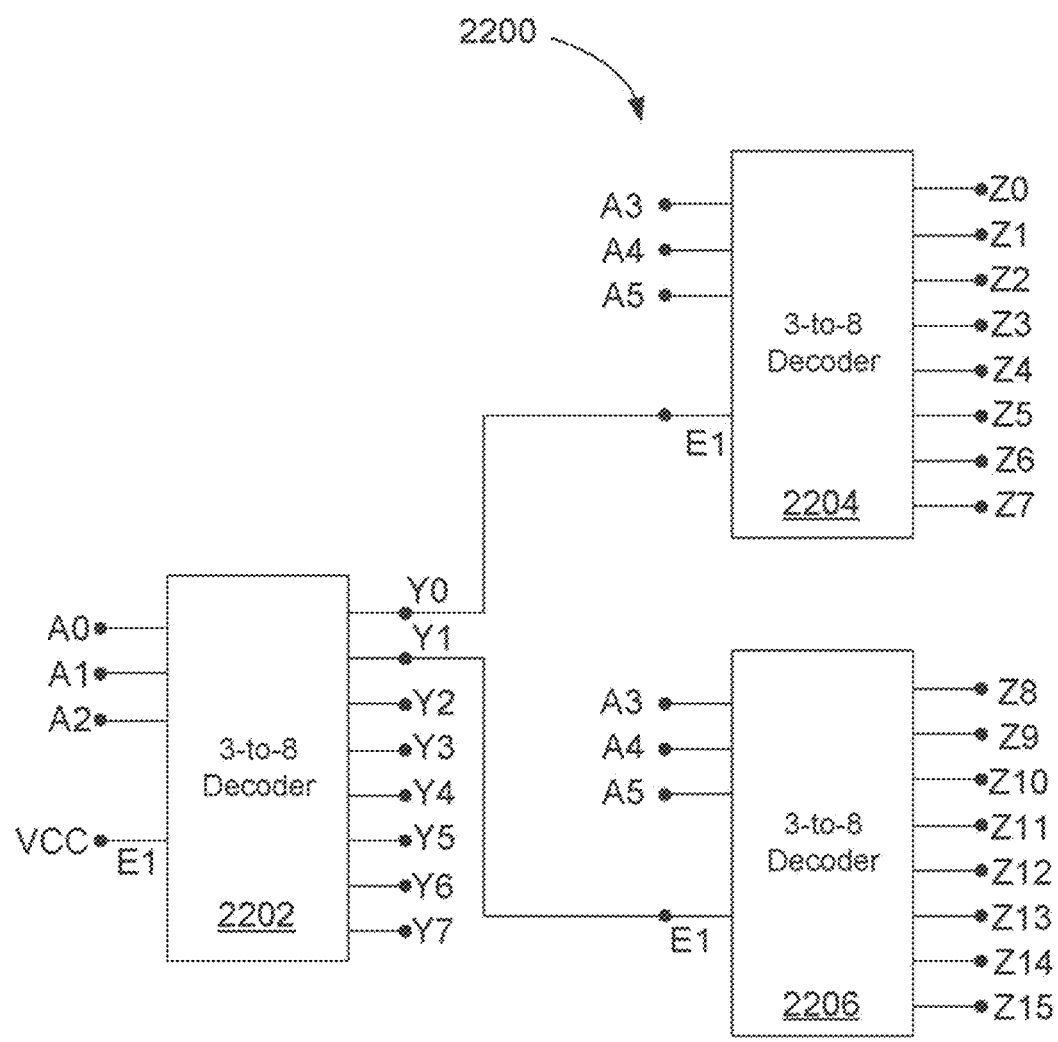
FIG. 22 is a schematic diagram of an addressing circuit that may be used as an alternate method for addressing LEDs and optical detectors according to some embodiments.

FIG. 22 is a schematic diagram of an addressing circuit 2200 that may be used as an alternate method (instead of shift-registers) for addressing LEDs and optical detectors, according to some embodiments. The addressing circuit 2200 comprises at least first, second and third 3-to-8 decoder circuits 2202, 2204 and 2206. Each of the first, second and third 3-to-8 decoder circuits 2202, 2204 and 2206 includes three addressing inputs, 8 outputs, and an enable input E1. In FIG. 22, the enable inputs E1 of the first, second and third 3-to-8 decoder circuits 2202, 2204 and 2206 are high enabled. The first, second and third 3-to-8 decoder circuits 2202, 2204 and 2206 are connected to selectively enable LEDs and optical detectors. A first three address signals A0, A1 and A2 are input to the first 3-to-8 decoder circuit 2202 to select between the eight outputs Y0 to Y7 of the first 3-to-8 decoder circuit 2202. The outputs Y0 and Y1, in turn, selectively enable the second or third 3-to-8 decoder circuit 2204 or 2206. A second three address signals A3, A4 and A5 are input to both the second and third 3-to-8 decoder circuits 2204 and 2206 to select between outputs Z0 to Z15. When Y0 is high, outputs Z0 to Z7 are selected by address signals A3, A4 and A5. When output Y1 is high, outputs Z8 to Z15 are selected by address signals A3, A4 and A5. The outputs Z0 to Z15 may each be connected to select a respective LED or receiver. Additional 3-to-8 decoder circuits may be connected to the remaining outputs Y2 to Y7 of the first 3-to-8 decoder circuit to enable addressing additional LEDs or receivers. A potential advantage of this addressing method is that LEDs and optical detectors may be selected in any order (e.g. by the microcontroller 118 in FIGS. 1A and 5A). This type of addressing system also may be scaled to include additional address lines as the screen gets bigger and more LEDs and optical detectors need to be addressed. Embodiments are not limited to 3-to-8 decoders and other decoders or other addressing circuitry may be used. In some embodiments, it may be possible to determine or calculate a touch relative to a third axis (e.g. Z axis). A Z-axis measurement may be used in determining or sensing how close to or how hard a user is touching a screen or other input device. For example, a Z-axis position may be determined or calculated measuring the level of light being blocked over how many paths, based on the assumption that a finger of a known radius as it approaches close the screen will partially block several light paths with the strongest blockage aligned with the center of the finger. The closer the finger is the more of the light paths will be partially or fully blocked. In at least one embodiment, the amount of force with which a user touches a screen, etc. may be determined or calculated based on a width of an optical obstruction caused by the touch. For example, with a light touch, the tip of a finger may cause a narrow obstruction of light between opposing sides of a sensing apparatus. However, as the finger is depressed with more pressure, the fingertip may flatten thereby increasing the width of the obstruction. The width of an obstruction caused at a sensing apparatus may be used to determine the amount of pressure with which a touch is applied. The width of an obstruction may be measured along a single axis (e.g. X or Y axis) or along two or more axes (e.g. both X and Y axes). A Z-axis measurement may be used for any suitable purpose or application. For instance, in an industrial controls application, this may be used to adjust the rate of flow on a valve icon by pushing lightly for minimum flow through the valve and pushing harder to increase the flow through the valve. Other uses are possible.

When something other than a bare finger is used to touch a touch input system, a flattening-out effect of a bare finger may not occur. Therefore, in a least one embodiment, one or more strain gauge sensors or any other type of suitable pressure detecting sensor that can detect any z axis pressure being applied to a surface of the touch input sensor may be used. For example, one or more strain gauge sensors may be mounted on the back side of the sensor's substrate at any edge so as to be sandwiched in between the sensor's back and the sensor mounting surface of the video display. Z-axis pressure may be detected and measured by the change in the sensor's reading from static to depressed.

In some embodiments, the controller controls the touch sensor to scan the horizontal and vertical paths one after the other, however the touch sensor could be designed to scan both at the same time.

In some embodiments, the "Horizontal" and "Vertical" light path groups are at approximately at 90 degrees to one another. This orientation is common in many touch sensor display systems. However, it is to be appreciated that the two or more light path groups need not necessarily be orientated at approximately 90 degrees to one another.

It may be advantageous to be able to use the same controller with the same firmware for multiple screen sizes, without requiring user input to configure the controller for each screen size. The total number of LED/Receiver steps in a screen can be determined by counting how many step clocks after the start pulse occur before a low level of correlated signal is received over many clock cycles. In some embodiments where the width of the screen is noticeably different to the height of the screen, the longer light paths may result in significantly reduced signal amplitude in the receiver which may be used to separate the two axes. If the width of the screen is similar to the height of the screen this method may not be reliable enough and a more definitive method may be used where one or more extra clock delays are inserted between the horizontal shift registers and the vertical shift registers. As there are no LEDS or receivers activated during these extra delay cycles, the correlated received signal will be low and the controller may detect this difference and determine the number of step clocks associated with the axis that occurred before the extra delay, the remaining step clocks being associated with the other axis. Referring to FIG. 1, for example, the delay could be introduced, for example, by having one or more outputs of each of the Rx and shift register blocks 114 and 118 not connected to an LED or optical detector, where those one or more unconnected outputs are positioned between the horizontal path outputs and the vertical path outputs. Alternatively, a D-Flop could be inserted between the axis shift registers.

Figure 23:
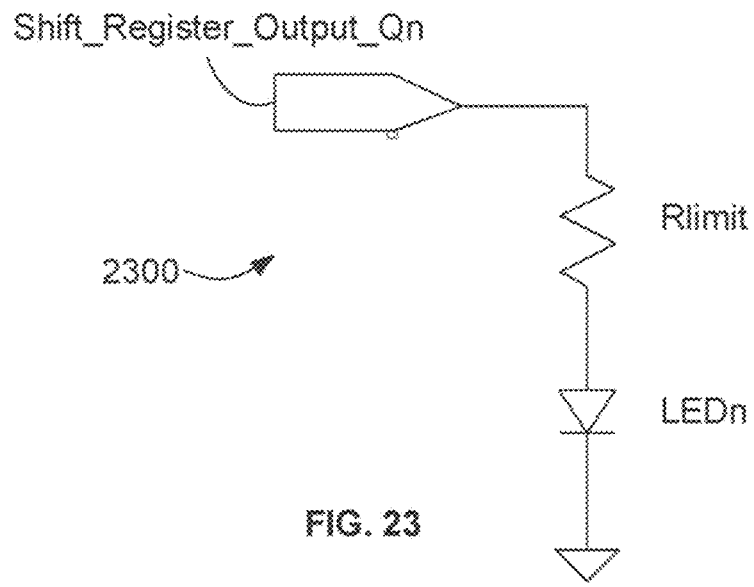
FIG. 23 is a schematic diagram of a circuit including an LED indirectly connected to a shift-register output via a resistor.

FIG. 23 is a schematic diagram showing an example of how LEDS may be connected to shift register outputs. More specifically, the example in FIG. 23 shows a circuit 2300 in which LEDn is connected to a shift register output "Shift_Register_Output_Qn". As shown, a current controlling resistor RLimit is connected in series between LEDn and "Shift_Register_OutputQn". The resistor RLimit may be used to limit the current through LEDn. For example, RLimit may be 42 Ohms, although embodiments are not limited to a particular resistance. Each LED connected to a shift register in the examples described herein may similarly have current controlling resistors connected between the LEDs and the corresponding shift register outputs.

Alternatively, the LEDs could be driven by an active current controlling driver stage.

Figure 24:
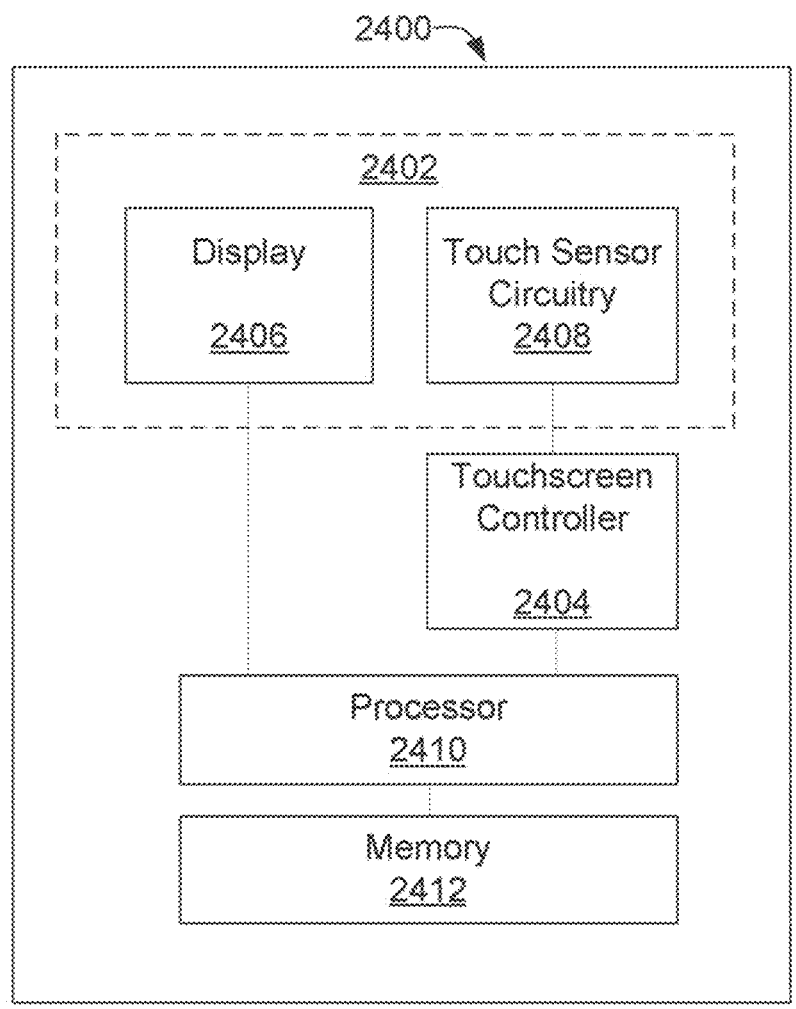
FIG. 24 is a block diagram of an example computing system comprising a touch sensor according to some embodiments.

FIG. 24 is a block diagram of an example computing system 2400 comprising a touch sensor 2402 according to some embodiments. The system includes the touch sensor 2402 (which may be similar to the example touch sensors described herein) coupled to a touch sensor controller 2404 (which may be similar to the example touch sensor controllers described herein). The touch sensor comprises a display 2406 and touch sensor circuitry 2408 that will typically be arranged about the periphery of the display. The touch sensor circuitry 2408 may comprise LEDs and optical detectors that are coupled to addressing/demultiplexing circuitry such as shift-registers (similar to the examples shown in FIGS. 1A to 1D and 5A to 5D).

In this example system 2400, a processor 2410 is coupled to and controls both the display 2406 and the touch sensor controller 2404. The processor 2410 is operatively coupled to a memory 2412, which may store processor-executable instructions that are executed by the processor 2410 to control the display 2406 and/or the touch sensor controller 2404. The processor 2410 and the memory 2412 may form part of the touch sensor controller 2404 (e.g. similar to the processor 122 and memory 124 of FIG. 1A). Alternatively, the touch sensor controller 2404 may comprise a separate processor and/or memory. The processor 2410 may, for example, control the display to display a graphical user interface, and then receive and interpret user input based on touch events sensed on the touch sensor (by which means the user interacts with the displayed interface).

The processor 2410 and memory 2412 may be part of the same device as the touch sensor 2402 and/or the touch sensor controller 2404. Alternatively, the processor 2410 and memory 2412 may be part of a separate computer device or system that is remote from the touch sensor 2402 and/or the touch sensor controller 2404. Other arrangements and variations are also possible.

In some embodiments, the systems and devices discussed herein may include circuitry to suppress or mitigate noise caused by changes in ambient light levels, such as changes in sunlight incident on the touch sensor.

Certain applications of touch sensors may be likely to encounter changes in sunlight incident on the touch sensor. For example, sunlight modulation may be caused in an airplane cockpit, where sun shining on a touch sensor may be "chopped" by a propeller or fan shadow at a high frequency. The signal current output from the optical receivers due to sun exposure may be hundreds of times the signal current due to the modulated LEDs. Thus, rapid or frequent changes in sunlight levels may cause large swings or shifts in receiver signal output. Such shifts may make finger touch variations of the modulated signal from the LEDs difficult or impossible to detect.

Similarly, for an alternating receiver/LED arrangement, such as shown in FIGS. 5A to 5D, sun may shine on one side of the touch sensor, but not the other, such that alternate receivers are in full sun, while the others are not. This may cause a large level shift in the received signal every step of receiver scanning process.

Such large level shifts in the signal output from the optical receivers may cause significant effects to the output from a pattern correlating filter that relies purely on fixed frequency filtering. In effect, a very large asymmetrical transient may be induced in the signal that may take a relatively long time to be eliminated.

Figure 25:
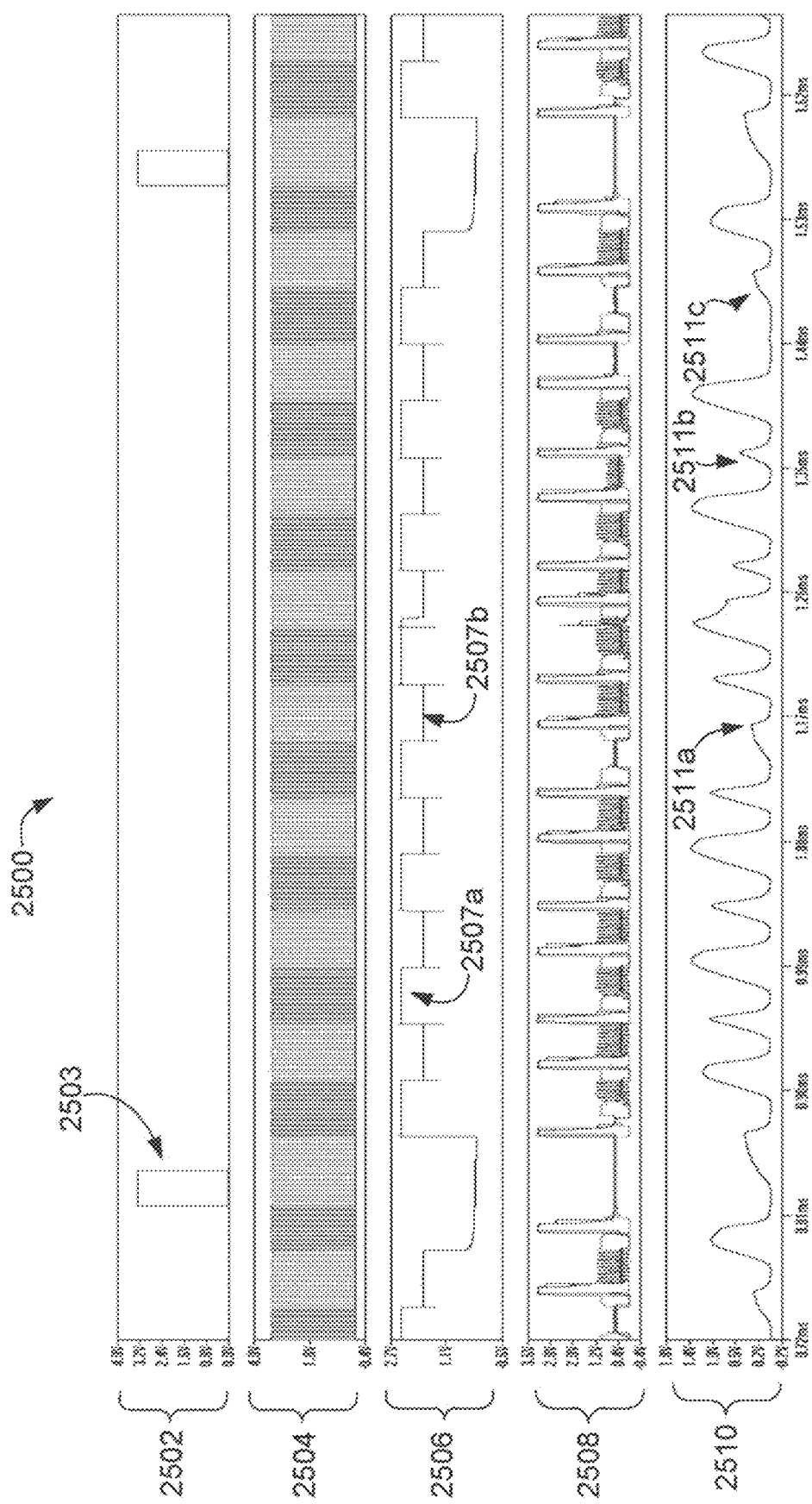
FIG. 25 shows simulation results illustrating possible effects of sudden ambient light transients for a touch sensor system.

FIG. 25 illustrates the problem that may arise from frequent changes in the level of ambient light (e.g. sunlight) incident on the touch sensor and/or from significantly different sunlight levels being incident on optical receivers. FIG. 25 shows simulation results 2500 for a touch sensor system having an interleaved LED/detector design and fixed frequency pattern correlating filter with no features designed to mitigate the effect of sudden transients. In this example, strong sunlight incident on alternating receivers (e.g. receivers along one side of the touch sensor, but not the opposing side) is simulated. Thus, receivers sequentially alternate between being exposed to direct sunlight and being in shadow. In this example, the following parameters are used in the simulation: the LED modulating alternating high low chip rate is 782 kbps (kilo chips per second); the corresponding 101010 modulation pattern has a fundamental frequency of 391 kHz; the LED modulation signal provides 32 chips per step clock period; and A/D samples are taken at the end of each step clock period. The simulation adds to the lower bezel's optical receivers the equivalent of full sun being chopped by a 5-blade helicopter rotor spinning at 500 RPM. The blade to blade transit time is 400 us individual blade sun blocking period is 20 us. The upper bezel's receivers are not exposed to the chopped sun resulting in alternate step clock full sun exposure.

Graph 2502 shows a receiver synch pulse signal 2503 (e.g. "Start_Pulse_Rx_Shift" signal) that triggers scanning or reading of the optical receivers of the touch sensor.

Graph 2504 shows the LED modulation signals.

Graph 2506 shows the raw signal output from the receivers (e.g. the "ScreenOut" signal). The received signal shows large swings where sunlight is present (e.g. in receiver periods 2507a) and where receivers are in shadow (e.g. in receiver periods 2507b). These large output swings are much larger than the modulation in the output signal due to the LED modulation. The received signal modulation due to the LED modulation (graph 2504) is so much smaller that it is not even visible in graph 2506. The actual simulated sunlight level in this example is the maximum theoretical level possible at 50,000 ft when the sun is directly overhead on a clear day.

Graph 2508 shows the filtered and correlated sampled signal generated from the raw signal output of graph 2506. The correlated sampled signal is the output from the pattern correlating filter (e.g. pattern correlating filter 120 in FIGS. 5A and 8) prior to averaging and final amplification. Large and extended duration asymmetrical transients can be seen to be generated from each step in sunlight exposure.

Graph 2510 shows the simulated output from the pattern correlating filter (e.g. correlating filter 120 in FIGS. 5A and 8). Large swings (peaks and valleys) in the simulated output are caused by the simulated chopped sun. Simulated touch events by object(s) such as one or more fingers results in smaller output peaks at points 2511a, 2511b and 2511c. Points 2511a and 2511c are simulated full touch events, while point 2511b is a simulated half touch event. However, these touch events are mired in the effects of the sun modulation transients and, thus, may be difficult to detect reliably due to the larger output variations caused by the simulated sun.

Alternate circuitry for the correlating filter 120 in FIGS. 1A and 8 is shown in FIGS. 26 to 29.

Figure 26:
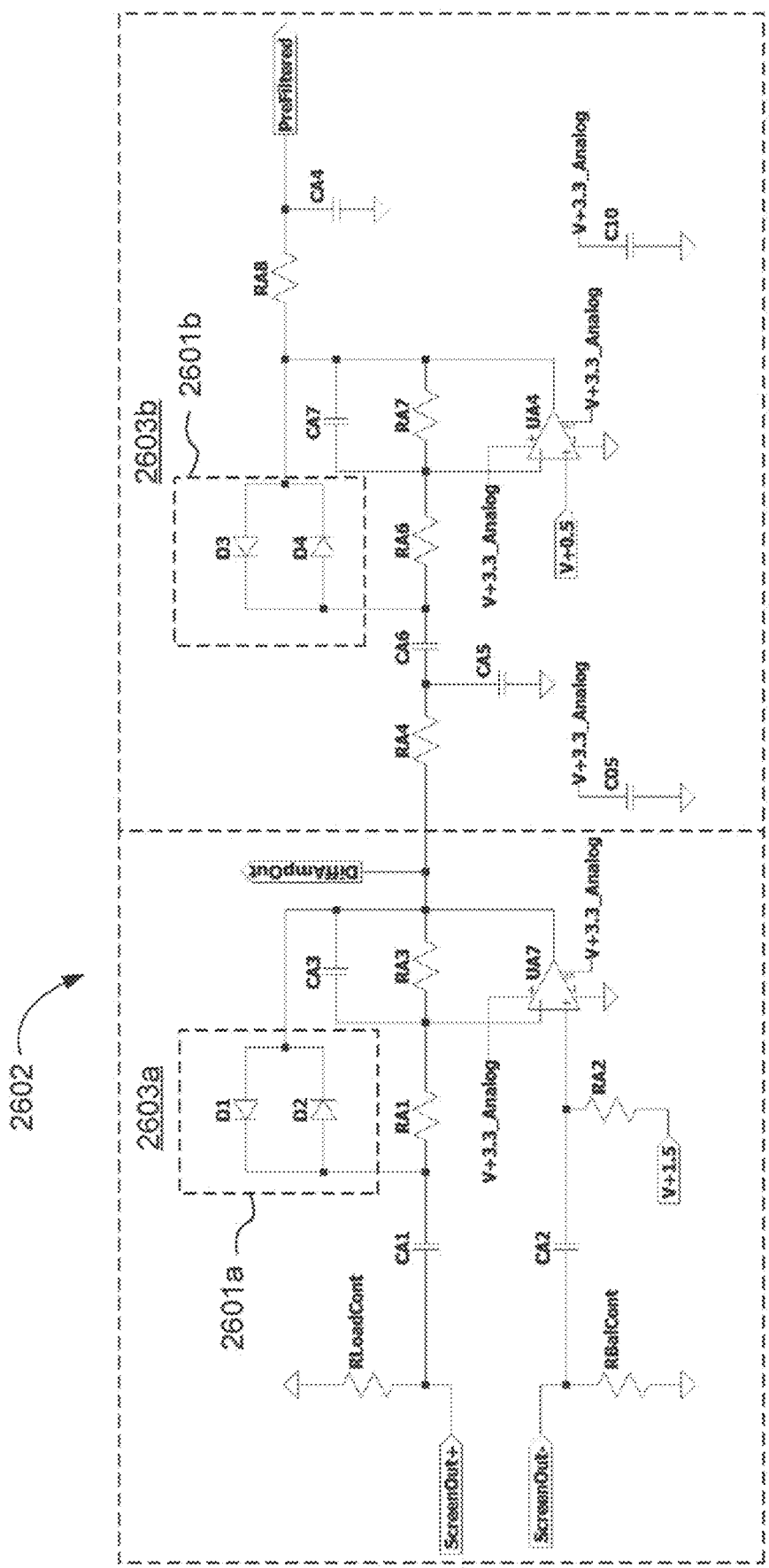
FIG. 26 is schematic diagram of an alternate filter-amplifier of a correlating filter according to an embodiment, where clipping circuitry is included in first and second stages of the amplifier.

FIG. 26 is a schematic view of a filter-amplifier 2602 (e.g. the correlating filter 120 of FIG. 8). The filter-amplifier 2602 is similar in function to the filter-amplifier 802 of FIG. 9, but includes clipping circuitry 2601a and 2601b that may absorb rapid transients that are much larger than the desired signal. Clipping circuitry 2601a in this embodiment includes first and second small signal clipping diodes D1 and D2 wired in the opposite orientation in parallel connected between the inverting amplifier UA7 output and the amplifier side of the input decoupling capacitor "CA1". Clipping circuitry 2601b in this embodiment includes third and fourth small signal clipping diodes D3 and D4 wired in the opposite orientation in parallel connected between the inverting amplifier UA4 output and the amplifier side of the input decoupling capacitor "CA6".

The filter-amplifier 2602 includes a first stage 2603a and a second stage 2603b. The first stage 2603a of the example filter-amplifier 2602 comprises: resistors RLoadCont, RBalCont, RA1, RA2 and RA3; capacitors CA1, CA2, CA3 and C05; diodes D1 and D2; and amplifier UA7 connected as shown. In this example: RLoadCont and RBalCont are each 75 kOhm; RA1 and RA2 are 3.3 kOhm; RA3 is 220 kOhm; CA1 and CA2 are each 300 pF; CA3 is 1.5 pF; Diodes D1 and D2 are BAV99LT1G diodes; and the amplifier UA7 is a LTC6252 amplifier chip. However, embodiments are not limited to this circuitry or component values.

The second stage 2603b of the example filter-amplifier 2602 comprises: resistors RA4, RA6, RA7 and RA8; capacitors CA4, C05, CA5, CA6, CA7 and C10; diodes D3 and 04; and amplifier UA4 connected as shown. In this example: RA4 is 100 Ohm; RA6 is 3.3 kOhm; RA7 is 27 KOhm; RA8 is 1.4 kOhm; CA4 is 120 pF; CA5 and CA6 are 300 pF; CA7 is 27 pF; C05 and C10 are each is 0.1 pF; Diodes D3 and D4 are BAV99LT1G diodes; and the amplifier UA4 is a LTC6252 amplifier chip. However, embodiments are not limited to this circuitry or component values.

The first stage 2603a, when handling only the desired AC modulation signal, has a gain and frequency response determined by the relative impedance of resistor RA1 and the combined negative feedback impedance of CA3 and RA3. The first stage 2603a is DC biased for maximum symmetry at around half VCC (1.5 V). The second stage 2603b, when handling only the desired AC modulation signal, has a gain and frequency response determined by the relative impedance of resistor RA6 and the combined negative feedback impedance of CA7 and RA7 (27k). The second stage 2603b is DC biased so its output stays within the 0V to 1V input range of the sample and holds circuits (e.g. 0.5 V).

When the filter-amplifier 2602 output reaches a threshold, the clipping circuitry 2601a and 2601b is activated to limit the filter-amplifier 2602 output. For example, when a very large level change comes from the touch circuitry (i.e. output from the optical receivers) and the voltage from each amplifier output to its input resistor exceeds 0.5V, the clipping diodes conduct, thereby limiting the output to +/−0.5V from the amplifier's average voltage. The activated diodes also rapidly charge/discharge the input capacitor, CA1 for stage 1 and CA6 for stage 2. In this way, the clipping diodes, when activated, cause the transient signal to be rapidly negated.

After this transient signal negation, each amplifier stage 2603a and 2603b rapidly returns to its normal gain and frequency operation.

Figure 27:
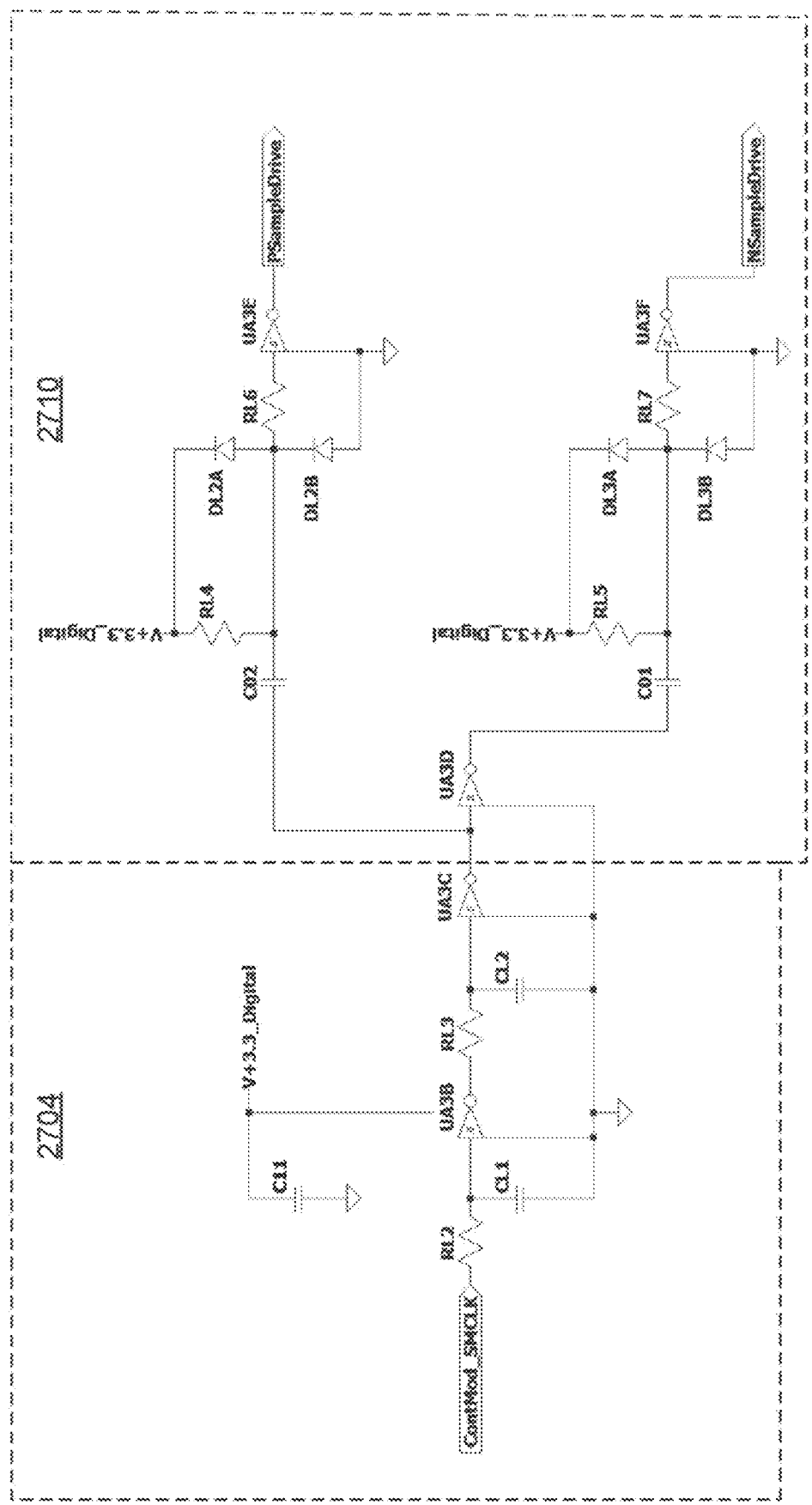
FIG. 27 is schematic diagram of an alternate phase adjust block and a sampling pulse generator block of a correlating filter according to an embodiment.

FIG. 27 is a schematic diagram of an alternate phase adjust block 2704 and sampling pulse generator block 2710 for a correlating filter (e.g. the correlating filter 120 of FIG.

Figure 28:
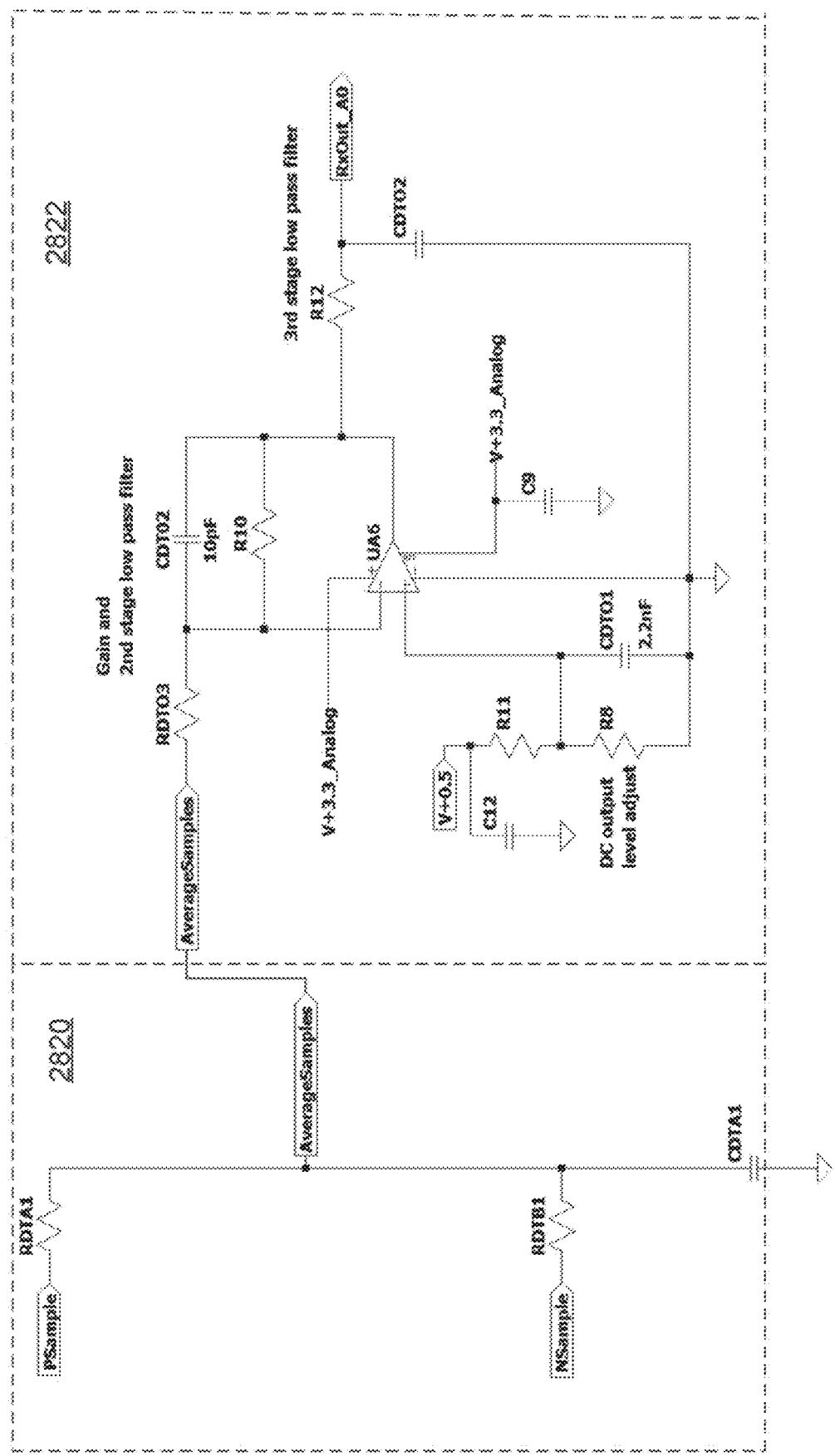
FIG. 28 is a schematic diagram of an alternate analog low pass filtering mixer and an analog low pass filter-amplifier of a correlating filter according to an embodiment.

8) according to some embodiments. The example fixed phase adjust block 2704 comprises: resistors RL2 and RL3; capacitors CL1, CL2 and C11 amplifies UA3B and UA3C. In this example, RA4 and RA6 are each 10 kOhm; CL1 and CL2 are each 27 pF; C11 is 0.1 µF. The positive edge pulse generator 2710 of this embodiment comprises: capacitors C02 and C11; resistors RL4, RL5, RL6 and RL7; diodes DL2A, DAL2B, DL3A and DL3B; amplifiers UA3D, UA3E, UA3F; and capacitors C01 and C02 connected as shown. In this example, C01 and C02 are each 56 pF; DL2A, DAL2B, DL3A and DL3B are BAV99LT1G diodes RL4 and RL5 are each 10 kOhm; and RL6 and RL7 are each 100 Ohm. However, embodiments are not limited to this circuitry or component values, FIG. 28 is a schematic diagram of an alternate analog low pass filtering mixer 2820 and analog low pass filter-amplifier 2822 of a pattern correlating filter (e.g. the correlating filter 120 in FIG. 8). The analog low pass filtering mixer 2820 comprises resistors RDTA1 and RDTB1 that are each 4.75 kOhm in this example.

The analog low pass filter-amplifier 2822 comprises: resistors RDTO3, R8, R10. R11 and R12; capacitors CDT01, CDT02, CDT02, C9 and C12; and amplifier UA6. In this example, RDTO3 is 75 kOhm; R8 is 10 kOhm; R10 is 560 kOhm; R11 is 100 Ohm; R12 is 2.7 kOhm; CDT01 is 2.2 nF; CDT02 is 10 pF; CDT02 is 2.2 nF; C9 and C12 are each 0.1 µF; and UA4 is a LTC6252 amplifier chip. However, embodiments are not limited to this circuitry or component values.

Low pass filtering mixer 2820 mixes the outputs of the two sample and holds together and low pass filters the signal. This results in uncorrelated signal variations being largely attenuated, but the correlated signal variations being unattenuated.

Filter-amplifier 2822 further low pass filters the desired signal and amplifies it and adds a DC offset to align its output signal with the microcontroller's A/Ds input levels.

Figure 29:
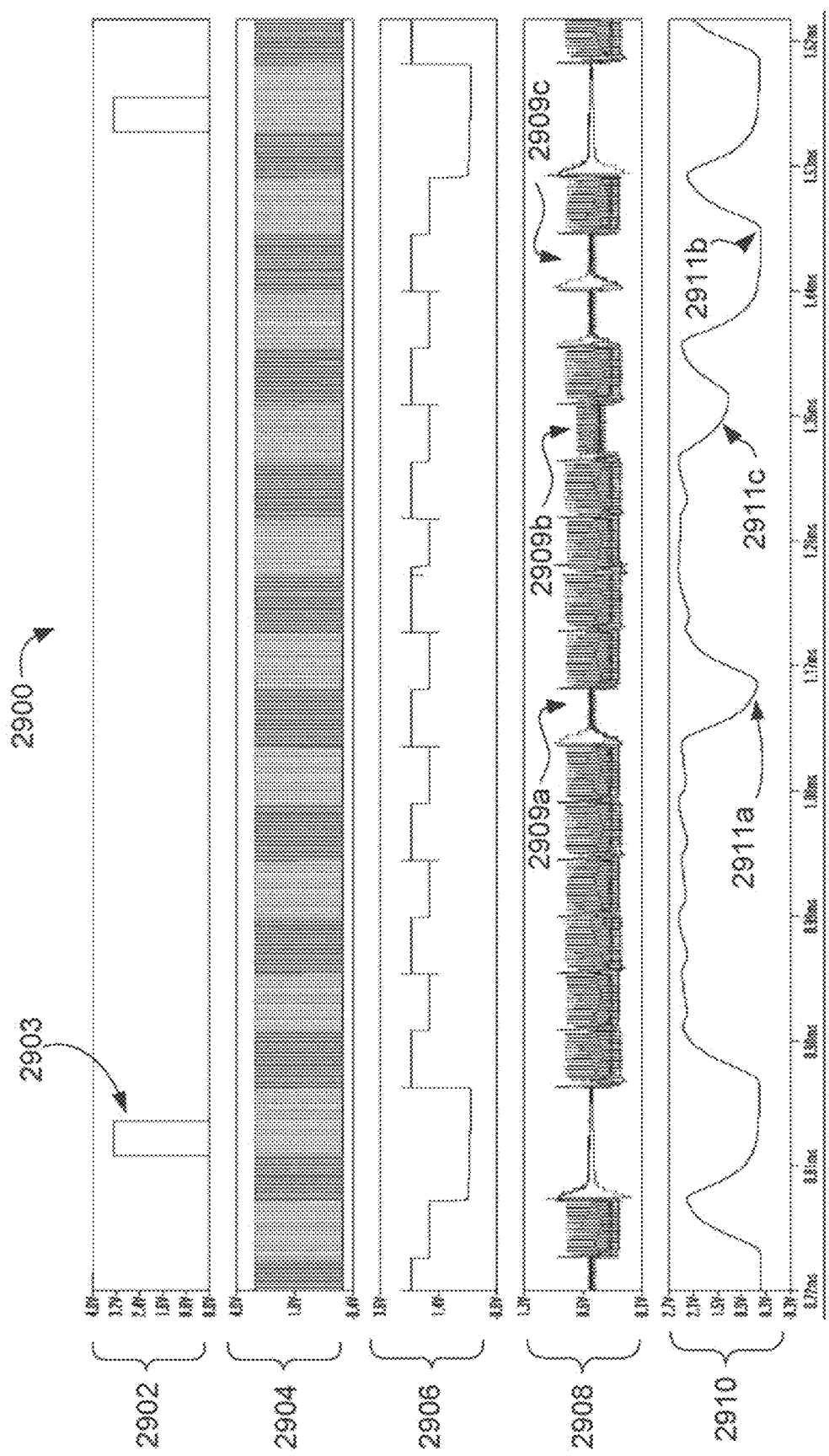
FIG. 29 shows simulation results for a touch sensor system including a correlating filter with the alternate filter-amplifier, sampling pulse generator block, phase adjust block, low pass filtering mixer and an analog low pass filter-amplifier of FIGS. 26 to 28.

FIG. 29 shows simulation results 2900 for a similar touch sensor system simulated for FIG. 25, but having clipping circuitry similar to the clipping circuitry 2601*a* and 2601*b* in FIG. 26. The simulated system includes the alternate filter-amplifier, sampling pulse generator block, phase adjust block, low pass filtering mixer and an analog low pass filter-amplifier of FIGS. 26 to 28. Sunlight exposure with helicopter blade chop and touch levels are identical to the unclipped simulation shown in FIG. 25.

Graph 2902 shows a receiver synch pulse signal 2903 that triggers scanning or reading of the optical receivers of the touch sensor (same as FIG. 25).

Graph 2904 shows the LED modulation signal (same as FIG. 25).

Graph 2906 shows the raw signal output from the receivers (e.g. ScreenOut). The received signal again shows large swings where sunlight is present and where receivers are in shadow. These large output swings are much larger than the modulation in the output signal due to the LED modulation.

Graph 2908 shows the filtered and correlated sampled signal generated from the raw signal output of graph 2906. The correlated sampled signal is the output from the pattern correlating filter prior to averaging and final amplification. Full block events due to an object are shown at points 2909*a* and 2909*b*. A half block event is shown at point 2909*c*.

Graph 2910 shows the simulated output from the pattern correlating filter. Full blocks due to an object are shown at points 2911*a* and two blocks together are shown at point 2911*b*. A half block is shown at point 2911*c*. As seen, the clipping circuitry 2601*a* and 2601*b* in FIG. 26 may minimize the impact of the ambient sun, such that the touch events (full and half blocks) are more easily and reliably detected.

Figure 30A:
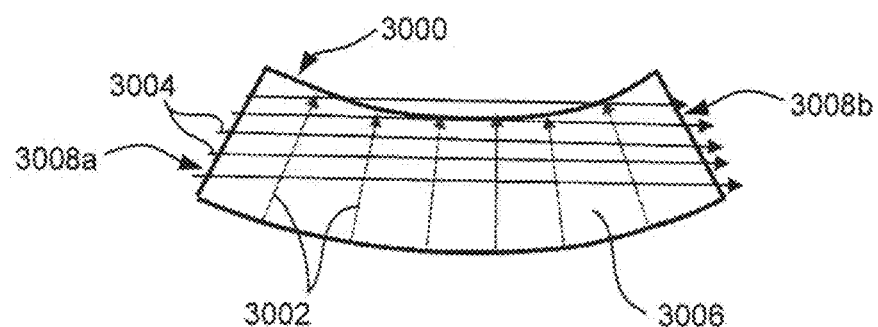
FIG. 30A is a perspective view of a concave touch sensor according to some embodiments.

The touch sensor concepts described herein may be implemented on a concave touch sensor. FIG. 30A is a perspective view of a concave touch sensor 3000. A concave touch sensor surface 3006 forms the touch sensor area in this example. The touch circuitry (e.g. LEDs, optical receiver, etc.) that would typically be positioned within a bezel around touch sensor surface 3006 is not shown.

In this example, the concavity is along the x-direction only (referred to as "horizontal"). A set of example y-direction (i.e. "vertical") light paths 3002 are shown spaced apart in the x-direction, and a set of example horizontal light paths 3004 are shown spaced apart in the y-direction. Arrows indicating the light paths 3002 and 3004 are not meant to be indicative of the total number of paths, but rather to be representative of their general arrangement. The actual number of light paths may be much higher than shown in FIG. 30A. The vertical light paths 3002 used to detect the horizontal position of a touch are each positioned a short distance over the touch sensor surface 3006 (e.g. concave screen), such that the positions of the vertical light paths 3002 follow the concavity of the touch sensor 3000. The distance of each vertical light path 3002 from the touch sensor surface 3006 may be constant along the length of the path.

However, the horizontal light paths 3004 used to detect the vertical position of a touch extend from at least a first side 3008*a* to a second side 3008*b* of the touch sensor, and the distance of the horizontal light paths 3004 from the touch sensor surface 3006 varies along the length of the paths, with the distance being the greatest at a midpoint between the first side 3008*a* and the second side 3008*b*.

Figure 30B:
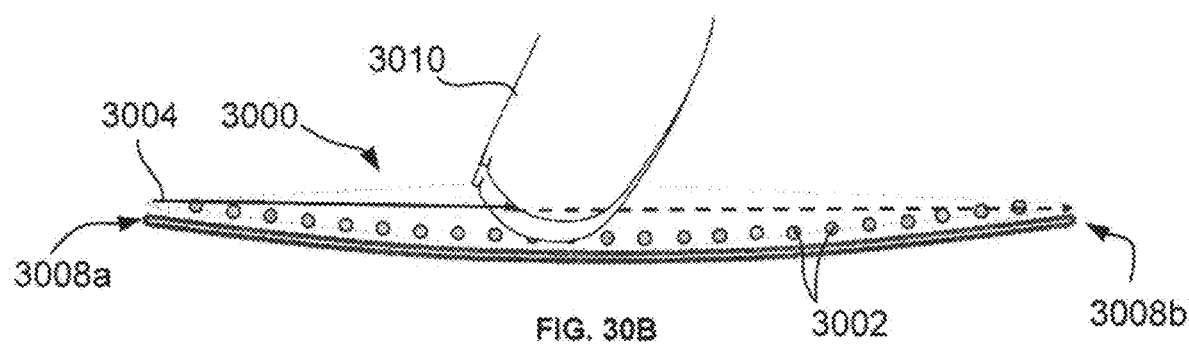
FIG. 30B is bottom cross-sectional view of the touch sensor of FIG. 30A.

FIG. 30B is a cross-sectional view of the touch sensor 3000 of FIG. 30A. As shown, due to the curvature of the touch sensor, a distance between the vertical light paths 3002 and horizontal light paths 3004 varies in the horizontal direction, such that the distance is the greatest at a midpoint between the first side 3008*a* and the second side 3008*b* of the touch sensor. Thus, a finger moving to touch the touch sensor may interrupt one or more horizontal light paths 3004 before interrupting one or more vertical light paths 3002.

To account for this, the touch sensor may be configured to not register detection of a touch until both: at least one vertical light path; and at least one horizontal light path are broken by a finger 3010 (or other object). This may prevent ambiguous touch location determinations when one or more light paths in one direction are broken, but no paths in the orthogonal direction have yet been broken. As long as the maximum difference in distance of the horizontal and vertical light paths from the screen is under around 0.5 inches, potential offsets in the detected touch location versus the fingers tips touch location on the screen that may result from a touching finger not being perpendicular will be acceptably small. For example, the touch sensor controller may be configured (e.g. by software, hardware such as a memory and/or a processor or a combination of both) to perform this detection functionality based on the received sensor output.

As explained above, the touch sensor circuitry may be partially or wholly contained within a bezel around the periphery of the touch sensor surface area (i.e. around the edge of the touch sensor surface). In some embodiments, the bezel is located outward from the edge of the touch sensor surface. The light paths created by the optical sensor circuitry in the bezel may span one or more non-touch sensor areas in addition to the touch sensor area. Such non-touch sensor areas may, for example, contain one or more displays without touch capability and/or non-display surfaces. This positioning of the bezel and optical touch circuitry may also be suitable for curved screen surfaces as long as curved screen does not block the light paths. One possible advantage of this setup is that the optical components (within the bezel) can be placed in a location where their additional height has minimal impact on the user and gives more flexibility to the aesthetic design.

Figure 31:
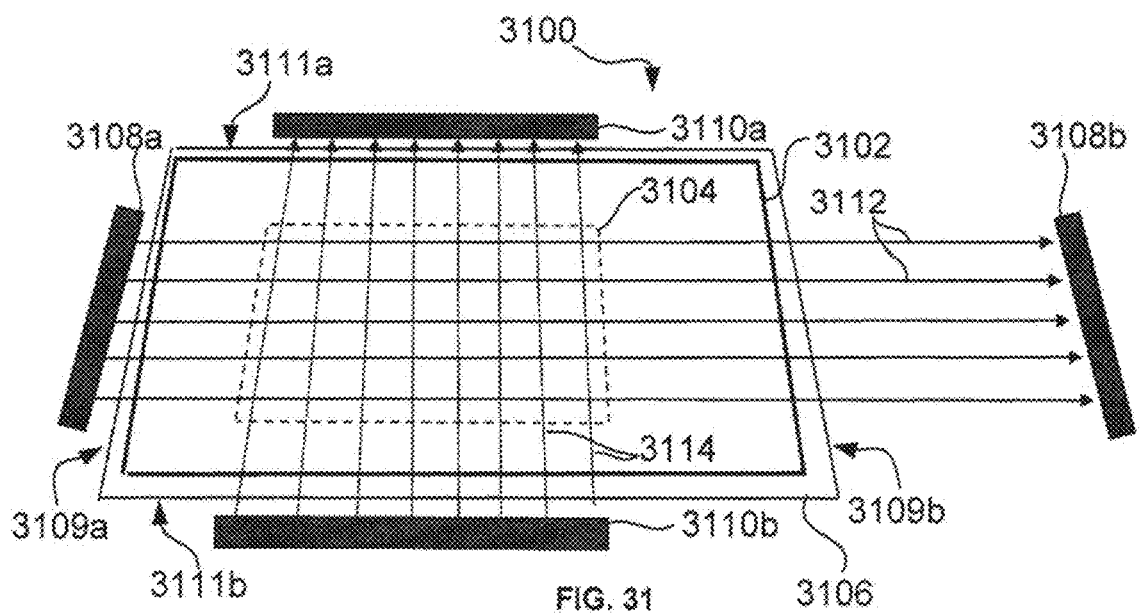
FIG. 31 is a perspective view of an example touch sensor device according to yet another embodiment.

FIG. 31 shows an example touch sensor device 3100 including a display area 3102 and a touch sensor area 3104 that forms a portion of the total display area 3102. A transparent cover 3106 that covers the entire display area 3102 is also shown. Vertical position detecting optical bezels 3108a and 3108b are shown arranged at first and second side edges 3109a and 3109b, respectively, of the transparent cover 3106. Horizontal position detecting optical bezels 3110a and 3110b are shown arranged at top and bottom side edges 3111a and 3111b, respectively, of the transparent cover 3106. The bezels 3108a and 3108b plus 3110a and 3110b contain optical/IR touch sensor circuitry to create horizontal light paths 3112 and vertical light paths 3114 respectively. The light paths 3112 and 3114 crisscross only over the touch sensing area 3104.

The touch sensing area may cover an area outside the display or there may be even no display at all, the touch sensor being used to detect touches on or over any surface. An example of this would be if a full QWERTY keyboard was printed onto a surface, the touch sensor could detect when specific keys were touched.

In some embodiments, the optical/IR touch circuitry may be located rearward of the screen (where a front of the screen is considered to be the surface facing the user in normal operation). Mirrors can be used to direct the light paths from the LEDS across the screen and back to the receivers.

Figure 32:
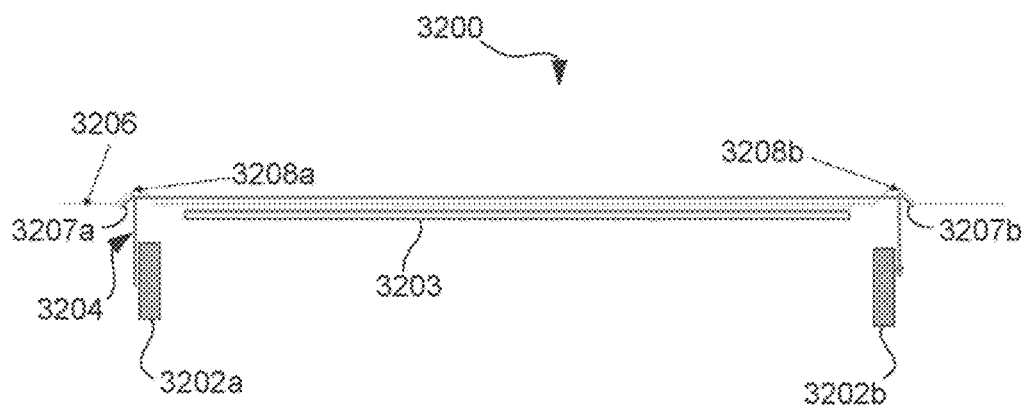
FIG. 32 is a side cross-sectional view of an example touch sensor according to yet another embodiment.

FIG. 32 is a side cross-sectional view of the touch sensor 3200 showing first and second optical circuitry sections 3202a and 3202b positioned at opposite sides of a sensing area 3203 (e.g. screen). A substantially transparent cover 3206 covers the sensing area 3203. Example light path 3204 is shown. The cover 3206 includes first and second mirrored surfaces 3207a and 3207b at points 3208a and 3208b (respectively) over the optical circuitry sections 3202a and 3202b. The mirrored surfaces 3207a and 3207b are angled and positioned to reflect light and guide the light along the path 3204. Specifically, the first mirrored surface 3207a reflects light emitted from the first optical circuitry section 3202a to travel horizontally over the sensing area 3203. The transparent cover 3206 is raised at points 3208a and 3208b. After being reflected by the first mirrored surface 3207a, the light passes through the transparent cover 3206 (in the raised area at point 3208a) and travels across the sensing area 3203 above the transparent cover 3206 and then again passes through the transparent cover 3206 (in the raised area at point 3208b). The second mirrored surface 3207b reflects the horizontally travelling light to the second circuitry section 3202b for detection. This mirror-directed embodiment may also be implemented in combination with other embodiments described herein (such as the arrangement of FIG. 31).

In some embodiments, a cover may be provided over the touch sensor circuitry (e.g. within a bezel). The cover may comprise a material that is transparent to the Bezel's LED emitted light (e.g. IR light) emitted from the LEDs, thereby providing environmental and physical protection, while providing a low loss optical window for the LEDs and receivers.

Figure 33:
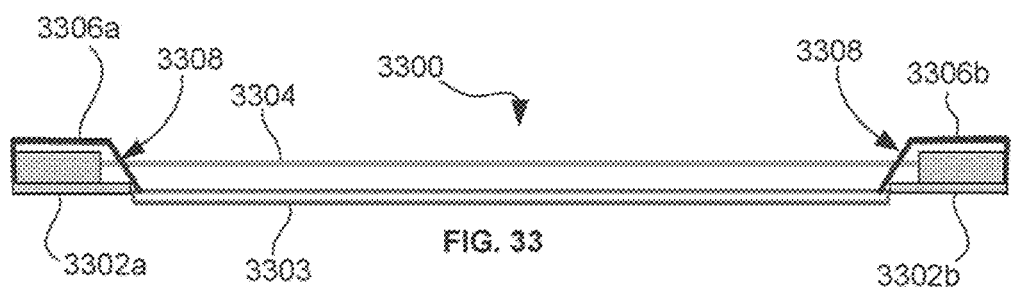
FIG. 33 is a side cross-sectional view of a touch sensor device having a bezel cover according to an embodiment.

FIG. 33 is a side cross-sectional view of a touch sensor device 3300 showing first and second optical circuitry sections 3302a and 3302b positioned at opposite sides of a sensing area 3303. Example light path 3304 is shown. A first cover section 3306a is provided over the first optical circuitry 3302a, and a second cover section 3306b is provided over the second optical circuitry section 3302b. Each cover section 3306a and 3306b comprises a respective optical window section 3308 that comprises a material that is substantially transparent to the light (e.g. IR light) that travels between LEDs in the first optical circuitry section 3302a to optical receivers in the second optical circuitry section 3302b (or vice versa). The entire cover may optionally comprise the substantially transparent material. For example, the cover sections 3306a and 3306b may comprise clear plastic, glass, or any other suitable material. In addition to allowing the desired optical signals to pass therethrough, the cover sections 3306a and 3306b may comprise a material that blocks or filters light in certain wavelength ranges. For example, the covers 3306a and 3306b might be made for example out of a deep red Acrylic type "2423", which is over 99% transparent to IR light while being largely opaque to visible light, reducing the levels of optical interference falling on the optical detectors from visible light sources.

If the bezel only transmits IR light the lenses of the individual optical detectors could be made from a material that is transparent to a wide range of light rather than an IR filtering material.

If the cover 3306a and 3306b are made from a broadly transparent material, to obscure the bezel circuitry all but the optical windows of the bezel 3308 may be locally coated on the inside with an opaque material.

If the bezel allows a wide range of light frequencies through the optical window, it is preferred that the individual optical receiver lenses are made from an IR filtering material.

IR filtering lenses on the individual IR LEDs has little benefit, as the frequency of the LED's emitted light inherently has a very narrow bandwidth.

The window section 3308 may be at a 90-degree angle with respect to the sensing area 3303, or as shown in FIG. 33, the window section 3308 may be at a sloping angle. Embodiments are not limited to any particular cover shape.

The cover sections 3306a and 3306b may be part of a single, unitary cover that extends around the periphery of the sensing area 3303. Alternatively, the cover sections 3306a and 3306b may be discrete portions of the cover. The cover may also extend over touch circuitry that extends around the remaining edges of the periphery of the sensing area 3303 that are not visible in FIG. 33. The cover (including sections 3306a and 3306b) may comprise extrusions or be formed by a molding process, for example.

Figure 34:
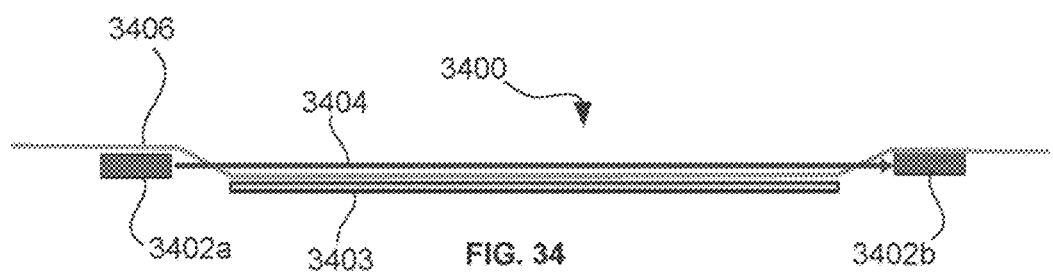
FIG. 34 is a side cross-sectional view of a touch sensor device having an alternate cover according to another embodiment.

FIG. 34 is a side cross-sectional view of a touch sensor device 3400 showing an alternate cover configuration. First and second optical circuitry sections 3402a and 3402b are positioned at opposite sides of a sensing area 3403. Example light path 3404 is shown. In this embodiment, a cover 3406 is formed over the first and second optical circuitry sections 3402a and 3402b and the screen 3403. The cover 3406 overlays the screen 3403 and then rises over the optical circuitry 3402a and 3402b, which includes the LEDs and optical receivers. The cover 3406 may form a sloped surface at the transition between the optical circuitry 3402a and 3402b and the screen 3403, similar to the optical window sections 3308 of the cover 3306a and 3306b in FIG. 33.

The cover 3406 in FIG. 34 may comprise a material that is transparent to the light emitted from the LEDs of the optical circuitry 3402a and 3402b, such as clear plastic, glass, etc. The shaping of the cover 3406 may be accomplished by a slumping process such as vacuum and/or heat processes, or any other suitable method. Such methods may be similar to existing plastic packaging technologies, which may be relatively inexpensive.

In environments where the touch sensor device is exposed or used in outdoor environments, rain or water spray may fall on the touch sensor device. If light paths between LEDs and receivers are positioned as close as possible to the screen of the touch sensor device, water droplets on the screen may block or interfere with light in one or more light paths between LEDs and optical receivers.

In some embodiments, the touch sensor device may be configured with its light paths raised slightly above the screen so that droplets of water or other fluid that may be on the screen do not interfere with the optical paths.

Figure 35:
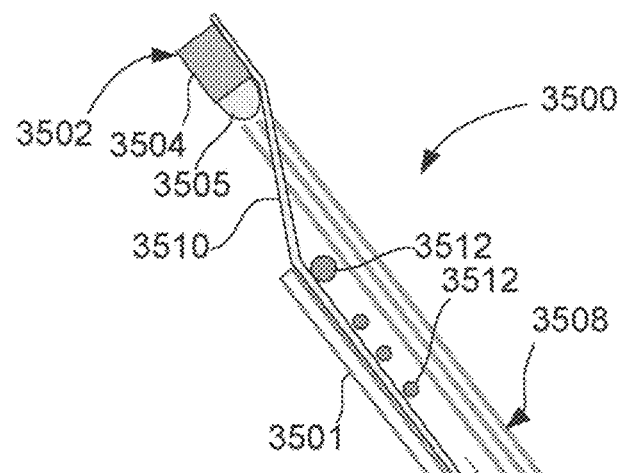
FIG. 35 is a side cross-sectional view of a touch sensor device having an alternate cover arranged to reduce droplet interference according to an embodiment.

FIG. 35 is a side cross-sectional view of a touch sensor device 3500 according to some embodiments. Like other embodiments described herein, the device 3500 comprises a screen 3501 and touch circuitry 3502 including at least one LED 3504 aligned with at least one optical receiver 3506 (or vice versa) aligned to form one or more light path 3508 therebetween and over the screen 3501.

In this example, the device also includes an optional hydrophobic layer 3510 over the screen 3501 and touch circuitry 3504. The hydrophobic layer 3510 in this example is in the form of the cover 3406 of FIG. 34, but with a hydrophobic coating that may cause water to form into droplets. Droplet size may be limited by a maximum size for a given angle of the screen 3501. The maximum droplet size may, for example, be determined or estimated by the minimum droplet weight that overcomes surface tension on the hydrophobic layer 3510.

In some applications, the device 3500 may be in a fixed position (e.g. mounted in a vehicle), and the angle of the screen 3501 and hydrophobic layer 3510 (including in the transition zone 3514) may be chosen to allow droplets over a particular size to roll off the device 3500, as shown in FIG. 35.

To prevent droplets on the screen 3501 from interfering with the light paths 3508, the light paths 3508 may be positioned a pre-determined distance away from the screen 3501 and hydrophobic layer 3510. The distance may be chosen based on the estimated or expected maximum droplet size. For example, the distance may be chosen to be greater than maximum expected droplet height. As illustrated in FIG. 35, droplets 3512 may, thus, roll under the light paths 3508 (for the most part) and off the touch sensor device 3500.

In this example, the droplets may potentially be positioned or move over a transition region 3514 of the hydrophobic layer 3510 between the optical circuitry 3502 and the screen 3501. Droplets in this region 3514 may still potentially block one or more light paths 3508 in region 3514. However, overall interference caused by the droplets 3512 on the device 3500 may be reduced if the diameters of optical focusing lenses 3505 and 3507 of the LEDs and optical receivers are significantly greater than the diameter of maximum droplet size. If the worst-case loss of light percentage due to such droplets is low enough, continued touch sensor function can be ensured. Repeat sampling verification in the detector may also be utilized to prevent a large water droplet from generating a false touch as it travels through the beam.

In an alternate embodiment, at least one drain channel may be formed between the screen of the touch sensor device and the optical circuitry located around its periphery.

Figure 36:
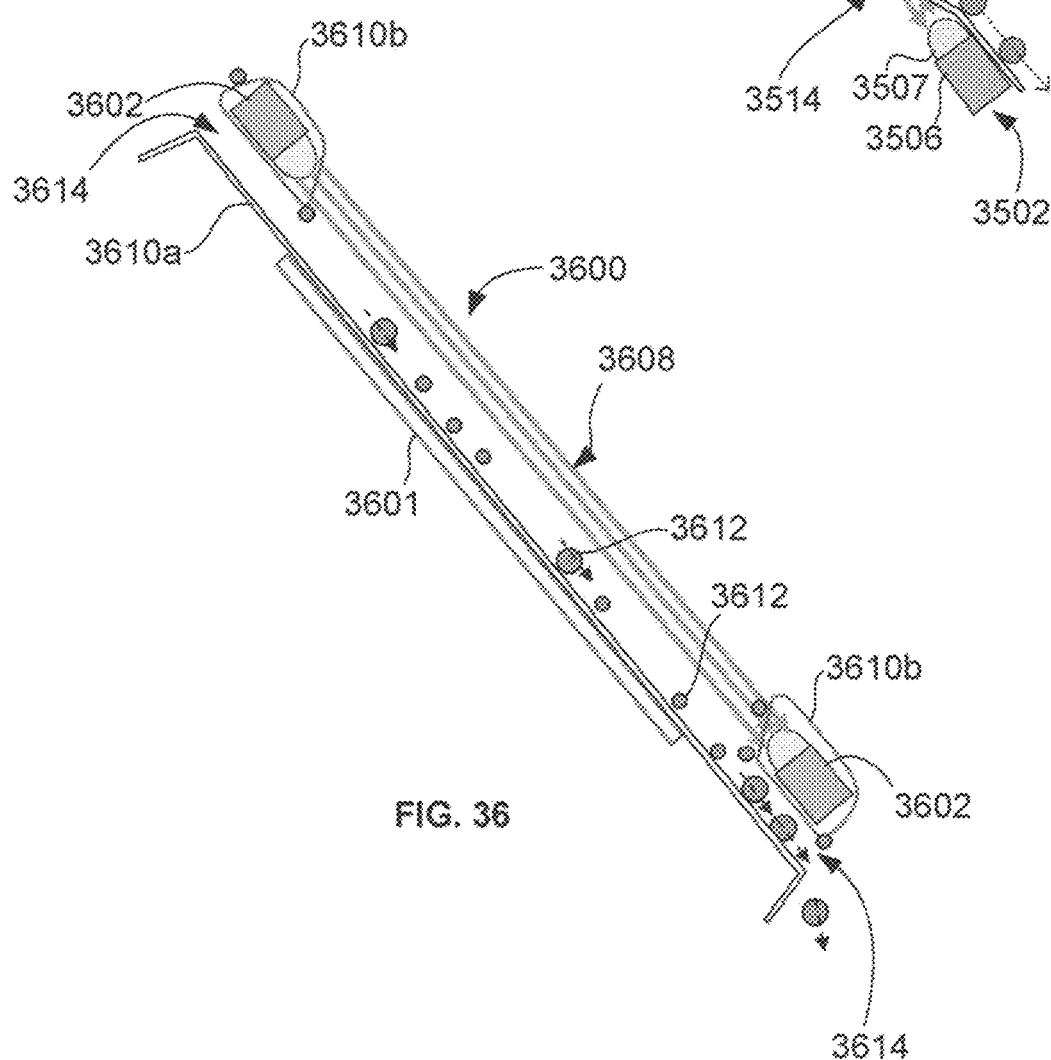
FIG. 36 is a side cross-sectional view of a touch sensor device including drain channels according to yet another embodiment.

FIG. 36 is a side cross-sectional view of a touch sensor device 3600 in which, rather than a single hydrophobic layer (as in FIG. 35) a first hydrophobic layer 3610a covers the screen 3601, and at least a second hydrophobic layer 3610b covers the touch circuitry 3602. Drain channels 3614 are formed between the hydrophobic layers 3610a and 3610b allowing droplets 3612 to pass though. Thus, the droplets 3612 may be prevented from interfering with light paths 3608. In this case, each second hydrophobic layer 3610b is in the form of a housing around the corresponding touch circuitry 3602 (e.g. LEDs, optical receivers, focusing lenses, etc.).

If the expected position and angle of the touch sensor device in use is known (e.g. a device is to be mounted in a particular position), the optical window sections of the cover may be designed to be at a non-horizontal angle. This may help prevent droplets from accumulating thereon.

To minimize the effects of droplets interfering with the optical paths 3608, each LED and optical receiver 3602 may also have a widened focusing lens.

In some embodiments, one or more pressure switches and/or strain gages may be mounted behind the screen of a touch sensor device. The pressure switches and/or strain gages may, for example, be used to provide alternative control and/or interface functions. Such functions may, for example, include menu functions or control of a linear variable (e.g. volume control etc.). Pressure switches and/or strain gages may be particularly beneficial in optical/IR touch sensor applications. For example, input from the pressure switches and/or strain gages may be helpful in distinguishing between intentional touch events and non-intentional touch events (such as the presence of a fly or dust on the screen).

Figure 37:
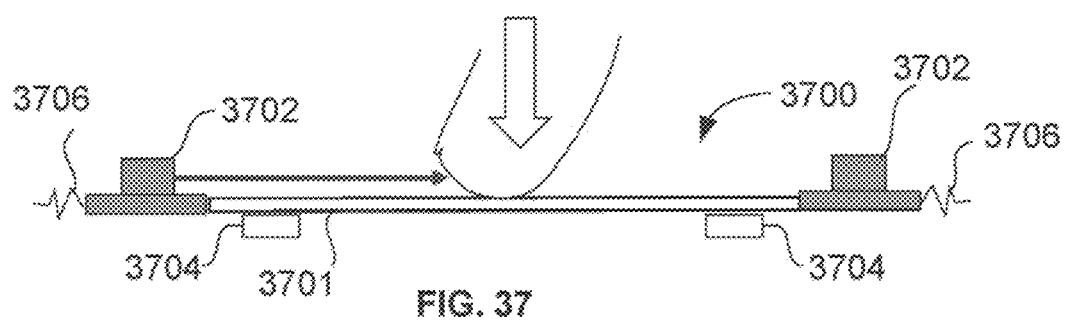
FIG. 37 is a side cross-sectional view of an optical touch sensor device comprising strain gages according to some embodiments.

FIG. 37 is a side cross-sectional view of a touch sensor device 3700 with a screen 3701 and optical/IR touch circuitry 3702 similar to other embodiments described herein, but also having strain gages 3704 mounted behind the screen 3701. The device 3700 in this example further comprises slightly flexible screen mounts 3706 that allow slight movement of the screen 3701 to engage the strain gages 3704.

In some embodiments, the optical/IR touch circuitry may be arranged to provide multiple, stacked levels of light paths. This may allow detection of a proximity or distance from the screen of an object (e.g. finger). For example, the number of layers broken by the object may indicate how close the object is to the screen. Optionally, movement toward and away from the screen may also be detected. This depth sensing information may control additional input functionality, similar to the pressure/strain gage embodiment above. The depth sensing information and may also be used to distinguish between intended touch events and non-intended touch events (e.g. insects, debris, or other objects that may interfere with one or more light paths).

Figure 38:
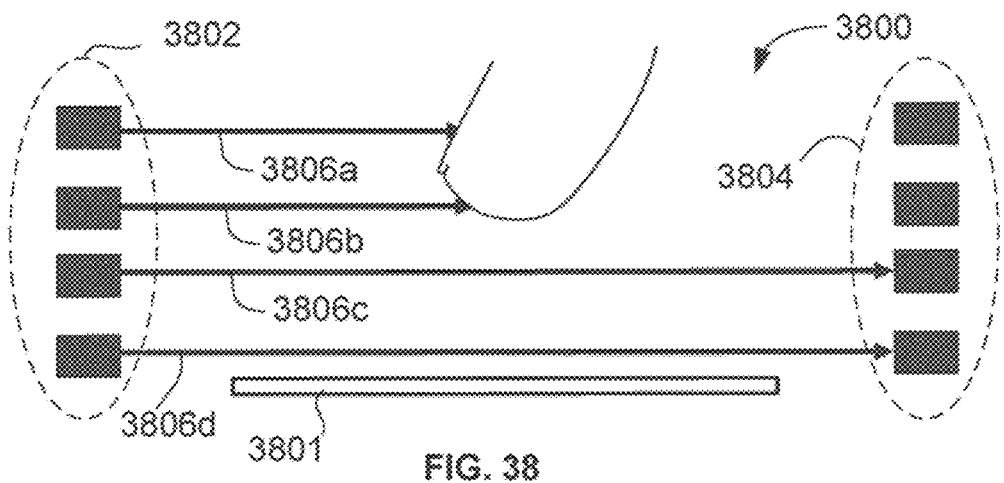
FIG. 38 is a side cross-section view of a touch sensor arrangement comprising stacked light paths according to some embodiments.

FIG. 38 shows a side cross-section view of an example touch sensor arrangement 3800 comprising a screen 3801, a stack of LEDs 3802 and a stack of optical receivers 3804. Each LED 3802 is aligned with a corresponding optical receiver 3804, such that multiple stacked light paths 3806a to 3806d are provided therebetween. Although not shown, additional stacked paths may be arranged across the surface of the screen to create multiple layers of paths. The paths may be staggered such that paths in one layer are not necessarily aligned with layers in one or more adjacent layers.

The sensor density and nominal focus direction of each layer may be different. As an example the outer layer may have sufficient beams to detect the fingers entry location but the lower layers may have fewer beams as they may only be used to detect how close the finger is to the screen. The touch sensor controller may be configured (e.g. by software, hardware such as a memory and/or a processor or a combination of both) to process the output from the pressure switches and/or strain gages to perform the control functionality described herein.

In this example, there are four stacked light paths 3806a to 3806d, although embodiments are not limited to any particular number of stacked paths or layers of paths. In addition, although LEDs 3802 are all shown on one side of the screen 3801, the LEDs and optical receivers may be arranged in an interleaved/alternating configuration.

Figure 39:
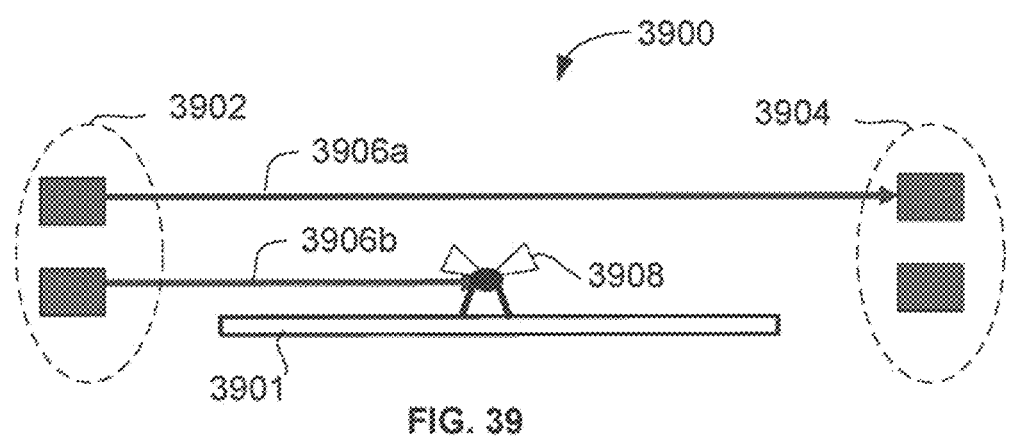
FIGS. 39 and 40 are cross-section views of an example touch sensor arrangement showing two stacked light paths according to some embodiments.
Figure 40:
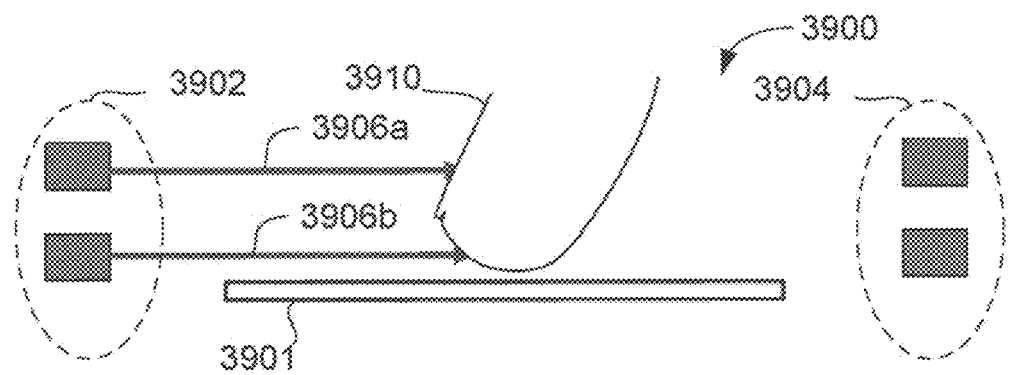

FIGS. 39 and 40 are cross-section views of an example touch sensor arrangement 3900 similar to the example of FIG. 38, but with LEDs 3902 and optical receivers 3904 arranged to provide two stacked light paths 3906a and 3906b (or layers) over a screen 3901. FIGS. 39 and 40 illustrate how a finger 3910 may be distinguished from a fly 3908, for example. In FIG. 39, the fly 3908 lands on the screen 3901, only blocks light in one light path (or layer) 3906b. By contrast, in FIG. 40, finger 3910 will block light in both light paths 3906a and 3906b (or layers). Thus, by monitoring which paths 3906a and 3906b are simultaneously broken, touch of the finger 3910 and the fly 3908 may be distinguished.

Figure 41:
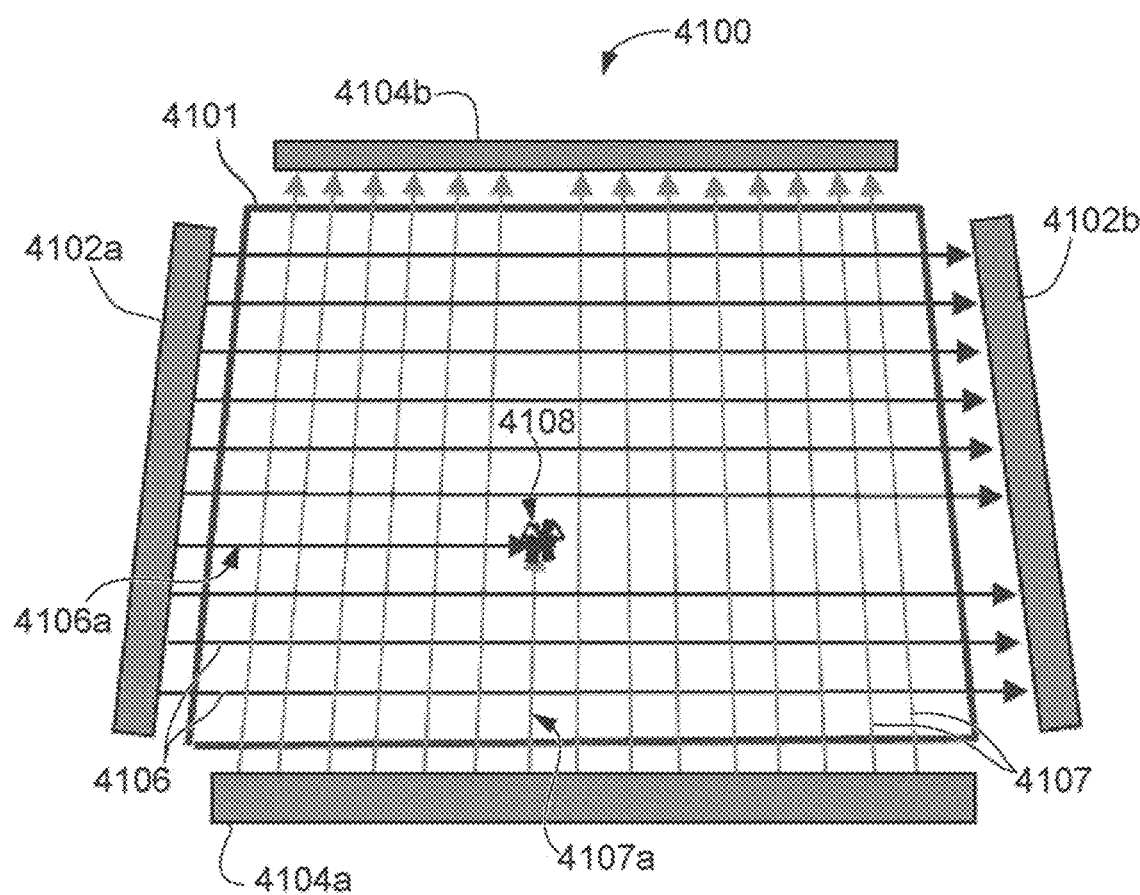
FIGS. 41 and 42 are front views of example touch sensor arrangement according to yet another embodiment.
Figure 42:
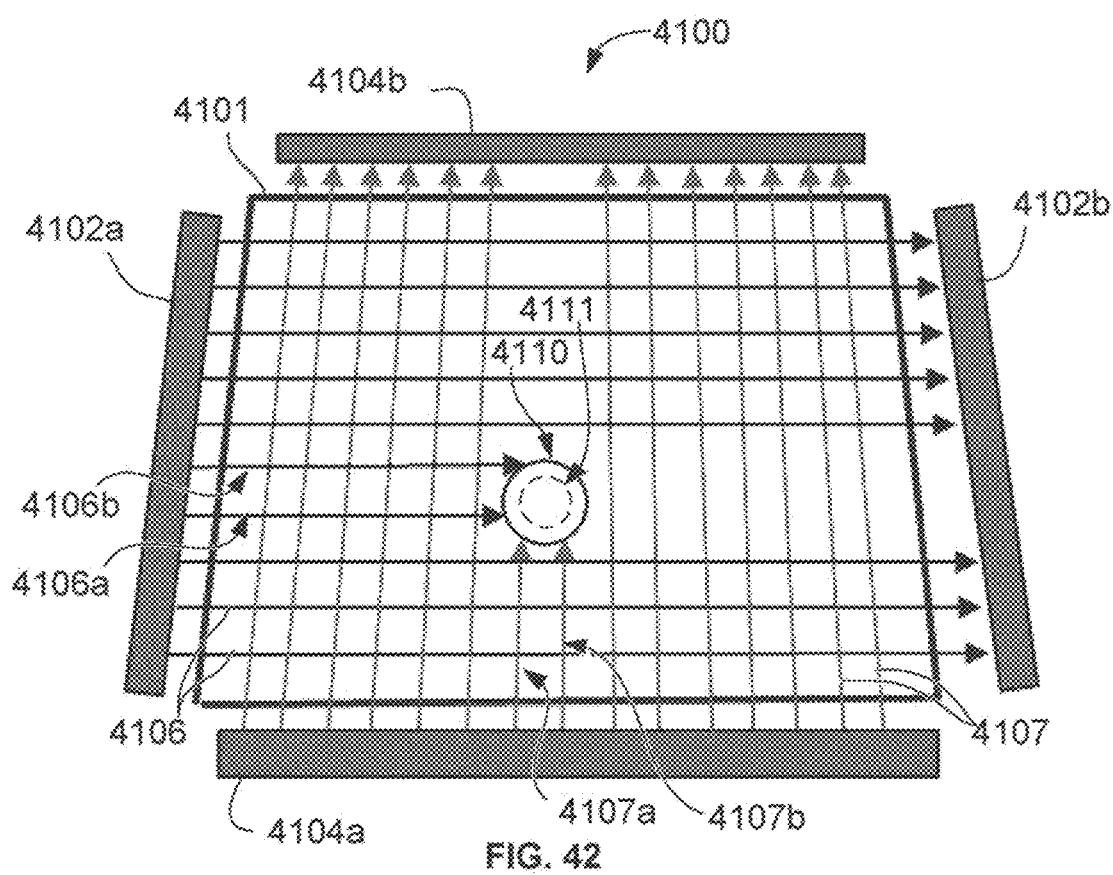

In addition to the height or depth of an object, the width of an object may also be used to characterize or distinguish touch events. FIGS. 41 and 42 are front views of example touch sensor arrangement 4100. The arrangement includes a screen 4101 with vertically aligned bezels 4102a and 4102b and horizontally aligned bezels 4104a and 4104b arranged along the periphery of the screen 4101. The first vertically aligned bezel 4102a comprises LEDs aligned with optical receivers of the second vertically aligned bezel 4102b to provide spaced apart horizontal light paths 4106. The first horizontally aligned bezel 4104a comprises LEDs aligned with optical receivers of the second horizontally aligned bezel 4104b to provide spaced apart vertical light paths 4107.

As shown in FIG. 41, a fly 4108 may only be large (wide) enough to block light in one of the horizontal paths 4106 and/or one of the vertical light paths 4107. In the example of FIG. 41, the fly specifically blocks paths 4106a and 4107a.

As shown in FIG. 42, a finger 4110 may be wide enough to block light in two or more horizontal light paths 4106 and two or more vertical light paths 4107 simultaneously. In the example of FIG. 42, the finger specifically blocks paths 4106a, 4106b, 4107a and 4107b.

The width of the finger 4110 at the screen 4101 may depend on the distance from the screen 4101 and/or pressure applied by the finger 4110 on the screen. For example, as the finger is pressed more firmly against the screen, the width of the portion of the finger interfering with light paths may increase. For example, in FIG. 42, dashed circle 4111 represents a possible smaller finger width/profile when the finger 4110 is only lightly pressed against the screen, while the solid line circle indicates the finger 4110 when pressed more firmly.

In some embodiments, a threshold is established for determining whether one or more blocked light paths indicate a touch event. For example, a threshold strain, sensed depth, or sensed width may be used to distinguish between an intentional touch (e.g. finger) or a non-intentional touch (e.g. fly, debris, etc.). A continued touch event (e.g. touch over an extended period and/or a moving touch) may be determined on a more relaxed standard (i.e. lowered threshold) than the initial touch detection. For example, once the initial touch threshold is reached and touch accepted, a lower threshold used to determine continued or moving touch. This may allow lighter pressure and or a greater distance of the finger from the screen to register as a continuing touch. The touch sensor controller may be configured (e.g. by software, hardware such as a memory and/or a processor, or a combination of both) to perform the functionality described above.

In normal use of a touch sensor device, one or more optical light paths may be blocked or become inoperable over time. In some embodiments, the device may be configured to ignore paths that are inoperable or blocked due to persistent objects on the screen (e.g. debris). The detection circuitry (e.g. processor 122 in FIG. 1) may be configured to determine the time that each optical light path is blocked.

Figure 43:
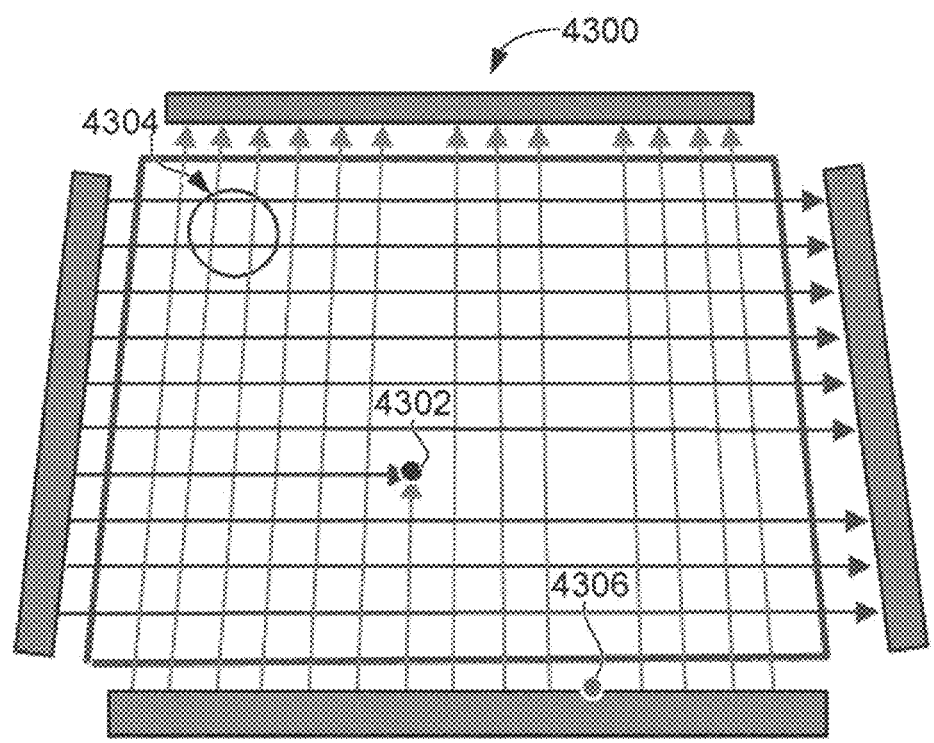
FIG. 43 is a front view of a touch sensor device illustrating persistent blockage of one or more light paths.

FIG. 43 shows a front view of a touch sensor device 4300. A persistent object 4302 (e.g. debris, insect, water, etc.) is shown blocking two orthogonal light paths. This would normally register as a touch. However, the touch sensor device 4300 may ignore the blocked paths and no longer register a touch event if the paths remain blocked for longer than a threshold time (e.g. five seconds). The ignored path location(s) may be accounted for by interpolation from the adjacent beams, thereby possibly limiting or minimizing the effective resolution loss.

If only a single path is blocked with no correspond blockage in the other axis, the touch sensor device 4300 may more rapidly to ignore that signal. In other words, because an intended touch event will typically block paths in both axis (e.g. horizontal and vertical), a single blocked path may have a lower threshold time to be ignored than a dual axis blockage. An example area of blockage expected for touch by a finger is show by circle 4304 in FIG. 43. An example single blocked path due to dirt 4306 is also shown in FIG. 43.

The touch sensor controller may be configured (e.g. by software, hardware such as a memory and/or a processor, or a combination of both) to process the input from the sensor circuitry to perform the functionality described above to distinguish between intentional and non-intentional touch events and/or ignore persistently blocked light paths.

It is to be understood that a combination of more than one of the approaches described above may be implemented. Embodiments are not limited to any particular one or more of the approaches, methods or apparatuses disclosed herein. One skilled in the art will appreciate that variations, alterations of the embodiments described herein may be made in various implementations without departing from the scope of the claims.

As described above, in some embodiments, an intended or authentic touch event may be distinguished from non-intended touch events (or otherwise unintentionally blocked light paths) based on one or more sensed characteristics of: the object touching the screen; and/or the detected blocking of one or more light paths. For example, the detected characteristics of the object, as described above, may include one or more of: pressure exerted; width of the object within the light paths; and/or depth of the object within the light paths. The characteristics of the blocking of the one or more light paths may include one or more of: the number of blocked light paths; and the duration of the blocking, etc.

Other distinguishing characteristics may also be detected and used to distinguish touch events.

One or more of the apparatuses described herein may comprise one or more processors for performing various functions and calculations described herein. For example, a processor may be used for one or more of: controlling the output of the light source (e.g. amplitude and/or frequency), for receiving measurements or other signals from a photo detector; and determining or calculating an axial position of an obstruction of light between an emitting waveguide and a receiving waveguide. As will be appreciated, the one or more processors may be used for other functions.

Methods consistent with the teachings of the present disclosure are also contemplated. The structure, features, accessories, and alternatives of specific embodiments described herein and shown in the Figures are intended to apply generally to all of the teachings of the present disclosure, including to all of the embodiments described and illustrated herein, insofar as they are compatible. In other words, the structure, features, accessories, and alternatives of a specific embodiment are not intended to be limited to only that specific embodiment. Furthermore, additional features and advantages of the present disclosure will be appreciated by those skilled in the art.

The invention claimed is:

1. A touch sensor system comprising:
    a sensing area having a periphery;
    a plurality of light sources and a plurality of analog optical detectors arranged about the periphery of the sensing area,
    wherein each of the plurality of analog optical detectors comprises:
        a respective photodiode;
        a respective first bipolar transistor having a first base, a first collector, and a first emitter, wherein the first bipolar transistor is coupled to the photodiode in a current amplifier configuration that generates an amplified current output as a function of a photodiode current, the photodiode being coupled to the first base and reversed biased, the first bipolar transistor arranged to amplify the photodiode current by a current gain factor to generate the amplified current output in the first collector, wherein a modulated enable input signal drives the first collector of the first bipolar transistor through a first resistance; and
        a respective second bipolar transistor having a second base, a second collector, and a second emitter, and the second base of the second bipolar transistor is connected to the first collector of the first bipolar transistor and the first resistance,
    wherein the second collector of the second bipolar transistor is coupled to a voltage source, and the second emitter of the second bipolar transistor is connected to an output of the optical detector, and
    wherein the first resistance is connected in series between the second base of the second bipolar transistor and a detector input that receives the enable input signal;
    wherein the first emitter of the first bipolar transistor is coupled to ground; and
    wherein, the modulated enable input signal is modulated between: a first signal voltage level that forward biases the first collector and enables generation of the amplified current output by the first bipolar transistor, the second emitter of the second bipolar transistor following a voltage across the first resistance generated by the amplified current output; and a second signal voltage level at which a collector-to-emitter junction and a base-to-emitter junction of the second bipolar transistor are both reverse biased and generation of the amplified current output by the first bipolar transistor is disabled,
    wherein the outputs of the plurality of analog optical detectors are collectively connected to an analog databus.

2. The touch sensor system of claim 1, wherein each of the plurality of light sources is aligned with a respective one of the plurality of analog optical detectors, and the touch sensor system further comprises:
    addressing circuitry that selectively drives each of the plurality of light sources with a modulated signal and selectively activates each of the plurality of analog optical detectors; and
    a controller that receives a collective detector output from the plurality of analog optical detectors.

3. The touch sensor system of claim 1, wherein the second emitters of the second bipolar transistors of the plurality of analog optical detectors are connected to the analog databus such that the analog databus receives a collective detector output from the plurality of analog optical detectors.

4. The touch sensor system of claim 1, wherein each of the plurality of light sources is aligned with a respective one of the plurality of analog optical detectors, and the touch sensor system further comprises:
    addressing circuitry that selectively drives each of the plurality of light sources and selectively activates each of the plurality of analog optical detectors.

5. The touch sensor system of claim 4, wherein the addressing circuitry selectively and sequentially activates the analog optical detectors such that output signals from the analog optical detectors are time multiplexed on the analog databus, thereby creating a time multiplexed collective detector output.

6. The touch sensor system of claim 4, wherein the addressing circuitry is operable to selectively drive each of the light sources for a respective time period, and for each light source, activate a corresponding one of the analog optical detectors during the time period.

7. The touch sensor system of claim 5, further comprising an impedance balancing circuit that creates a differential output signal from the time multiplexed collective detector output.

8. The touch sensor system of claim 4, further comprising de-multiplexing circuitry operatively coupled to the plurality of light sources and the plurality of analog optical detectors for selectively activating each of the plurality of light sources and, for each said light source, the respective analog optical detector.

9. The touch sensor system of claim 8, wherein the de-multiplexing circuitry comprises:
    a plurality of shift registers collectively comprising:
        a first plurality of register outputs, each of the first plurality of register outputs operatively coupled to a respective one of the light sources; and
        a second plurality of register outputs, each of the second plurality of register outputs coupled to a respective one of the plurality of analog optical detectors.

10. The touch sensor system of claim 2, further comprising: a modulated signal generator that generates the modulated signal for driving the plurality of light sources, wherein the controller comprises a correlating filter that receives the collective detector output from the plurality of analog optical detectors and generates a filtered analog output from the collective detector output.

11. The touch sensor system of claim 10, wherein the correlating filter receives the modulated signal and generates the filtered analog output as a function of the collective detector output and the modulated signal.

12. The touch sensor system of claim 11, wherein the correlating filter comprises a front-end that filters and amplifies the collective detector output to generate a pre-conditioned detector output, the front-end comprising a filter-amplifier and phase adjust circuitry.

13. The touch sensor system of claim 12, wherein the correlating filter comprises clipping circuitry that limits the filter-amplifier output when the filter-amplifier output reaches a threshold.

14. The touch sensor system of claim 12, wherein the correlating filter further comprises sampling and correlation circuitry that performs modulation edge-based sampling and correlation of the pre-conditioned detector output.

15. The touch sensor system of claim 14, wherein the sampling and correlation circuitry comprises:
  first analog sample circuitry that samples the pre-conditioned detector output at signal peaks as a function of the modulation signal plus an inverter to generate an inverted correlated maximum signal;
  second analog sample circuitry that samples the pre-conditioned and phase-adjusted detector output signal at signal valleys as a function of the modulation signal to generate a correlated minimum signal; and
  an analog mixer that adds the correlated minimum signal with the inverted correlated maximum signal to generate an analog correlated difference signal.

16. The touch sensor system of claim 15, wherein the wherein the sampling and correlation circuitry further comprises:
  a positive edge pulse generator that generates a series of pulses corresponding to positive edges of the modulated signal;
  a negative edge pulse generator that generates a series of pulses corresponding to negative edges of the modulated signal, wherein
  the first analog sample circuitry samples the pre-conditioned detector output as a function of the pulses from the positive edge pulse generator to generate the correlated maximum signal;
  and the second analog sample circuitry samples the pre-conditioned detector output as a function of the pulses from the negative edge pulse generator to generate the correlated minimum signal.

17. The touch sensor system of claim 15, wherein the correlating filter further comprises an analog low pass filter-amplifier that low pass filters and amplifies the analog correlated difference signal.

18. The touch sensor system of claim 15, wherein a modulation pattern of the modulated signal is balanced over a time period.

19. A touch sensor system comprising:
  a sensing area having a periphery;
  a plurality of light sources and a plurality of analog optical detectors arranged about the periphery of the sensing area, each of the plurality of light sources being aligned with a respective one of the plurality of analog optical detectors;
  addressing circuitry that selectively drives each of the plurality of light sources and selectively activates each of the plurality of analog optical detectors;
  an analog databus, wherein each of the plurality of analog optical detectors have a respective output, the outputs of the plurality of analog optical detectors being collectively coupled to the analog databus, and wherein the addressing circuitry selectively and sequentially activates the analog optical detectors such that output signals from the analog optical detectors are time multiplexed on the analog databus, thereby creating a time multiplexed collective detector output; and
  an impedance balancing circuit that creates a differential output signal from the time multiplexed collective detector output.

20. The touch sensor system of claim 19, further comprising de-multiplexing circuitry operatively coupled to the plurality of light sources and the plurality of analog optical detectors for selectively activating each of the plurality of light sources and, for each said light source, the respective analog optical detector.

21. The touch sensor system of claim 20, wherein the de-multiplexing circuitry comprises:
  a plurality of shift registers collectively comprising:
  a first plurality of register outputs, each of the first plurality of register outputs operatively coupled to a respective one of the light sources; and
  a second plurality of register outputs, each of the second plurality of register outputs coupled to a respective one of the plurality of analog optical detectors.

* * * * *

UNITED STATES PATENT AND TRADEMARK OFFICE
CERTIFICATE OF CORRECTION

PATENT NO. : 11,893,188 B2
APPLICATION NO. : 17/056500
DATED : February 6, 2024
INVENTOR(S) : Guy Michael Amyon Farquharson Duxbury et al.

Page 1 of 1

It is certified that error appears in the above-identified patent and that said Letters Patent is hereby corrected as shown below:

In the Claims

Column 49, Lines 31-32, in Claim 16, delete "wherein the wherein the" and insert --wherein the--.

Signed and Sealed this
Twenty-third Day of July, 2024

Katherine Kelly Vidal
*Director of the United States Patent and Trademark Office*